United States Patent
Adachi et al.

(10) Patent No.: US 6,396,147 B1
(45) Date of Patent: May 28, 2002

(54) SEMICONDUCTOR DEVICE WITH METAL-OXIDE CONDUCTORS

(75) Inventors: Hiroki Adachi, Kanagawa; Shunpei Yamazaki, Tokyo, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/311,994

(22) Filed: May 14, 1999

(30) Foreign Application Priority Data

May 25, 1998 (JP) .......................... 10-161364
May 16, 1998 (JP) .......................... 10-152304

(51) Int. Cl.[7] .......................... H01L 23/48
(52) U.S. Cl. .................. 257/758; 257/72; 257/347; 257/771
(58) Field of Search ............... 257/59, 72, 347–355, 257/700–758

(56) References Cited

U.S. PATENT DOCUMENTS

| | | | |
|---|---|---|---|
| 5,177,577 A | 1/1993 | Taniguchi et al. | 257/59 |
| 5,272,100 A | 12/1993 | Satoh et al. | 437/29 |
| 5,308,998 A | 5/1994 | Yamazaki et al. | 257/57 |
| 5,422,505 A | 6/1995 | Shirai | 257/327 |
| 5,430,320 A | 7/1995 | Lee | 257/412 |
| 5,481,121 A | 1/1996 | Zhang et al. | 257/64 |
| 5,518,805 A | 5/1996 | Ho et al. | 428/213 |
| 5,518,936 A | 5/1996 | Yamamoto et al. | 437/24 |
| 5,580,800 A | 12/1996 | Zhang et al. | 437/40 |
| 5,619,045 A | 4/1997 | Konuma et al. | 257/72 |
| 5,643,826 A | 7/1997 | Ohtani et al. | 437/88 |
| 5,648,277 A | 7/1997 | Zhang et al. | 437/21 |
| 5,668,032 A | 9/1997 | Holmberg et al. | 438/144 |
| 5,670,795 A | 9/1997 | Ikeda | 257/72 |
| 5,741,736 A | 4/1998 | Orlowski et al. | 438/286 |
| 5,742,363 A | 4/1998 | Bae | 349/38 |
| 5,843,225 A | 12/1998 | Takayama et al. | 117/8 |
| 5,913,111 A * | 6/1999 | Katoaka et al. | 438/164 |
| 5,955,781 A * | 9/1999 | Joshi et al. | 257/382 |
| 6,037,625 A * | 3/2000 | Matsubara et al. | 257/382 |
| 6,091,115 A * | 8/2000 | Ohtani et al. | 257/766 |

FOREIGN PATENT DOCUMENTS

| | | |
|---|---|---|
| JP | 6-232059 | 8/1994 |
| JP | 6-275641 | 9/1994 |
| JP | 7-030125 | 1/1995 |
| JP | 7-130652 | 5/1995 |
| JP | 7-135318 | 5/1995 |
| JP | 7-321339 | 12/1995 |
| JP | 8-015686 | 1/1996 |
| JP | 8-330602 | 12/1996 |
| JP | 2759415 | 3/1998 |

OTHER PUBLICATIONS

*Electrochemistry Hanbook*, 4th ed., Society of Electrochemistry, p. 370, Maruzen (1985). (in Japanese).

(List continued on next page.)

*Primary Examiner*—Fetsum Abraham
(74) *Attorney, Agent, or Firm*—Cook, Alex, McFarron, Manzo, Cummings & Mehler, Ltd.

(57) ABSTRACT

Anodic oxidation is conducted without forming a voltage supplying line for anodic oxidation.

A second wiring layer comprising aluminum is formed as separated for each wiring, and electrically forms a short circuit by a metallic film comprising tantalum. The second wiring layer is subjected to anodic oxidation by applying a voltage to the first metallic film, and an anodic oxide film (alumina film) is formed on the surface thereof. A first wiring layer is formed by etching an anodic oxide with the anodic oxide as a mask, to complete wiring comprising wiring layers and laminated to each other.

40 Claims, 29 Drawing Sheets

OTHER PUBLICATIONS

Full English Translation re Japanese Patent Application No. JP 6–232059, published Aug. 19, 1994.

English Abstract re Japanese Patent Application No. JP 6–275641, published Sep. 30, 1994.

English Abstract re Japanese Patent Application No. JP 7–030125, published Jan. 31, 1995.

English Abstract re Japanese Patent Application No. JP 7–130652, published May 19, 1995.

English Abstract re Japanese Patent Application No. JP 7–135318, published May 23, 1995.

English Abstract re Japanese Patent Application No. JP 7–321339, published Dec. 8, 1995.

English Abstract re Japanese Patent Application No. JP 8–015686, published Jan. 19, 1996.

English Abstract re Japanese Patent Application No. JP 8–330602, published Dec. 13, 1996.

U.S. patent application No. 09/210,781 (pending), entitled "Semiconductor Device and Method of Manufacturing the Semiconductor Device," including specification, claims and drawings, filed Dec. 15, 1998.

* cited by examiner

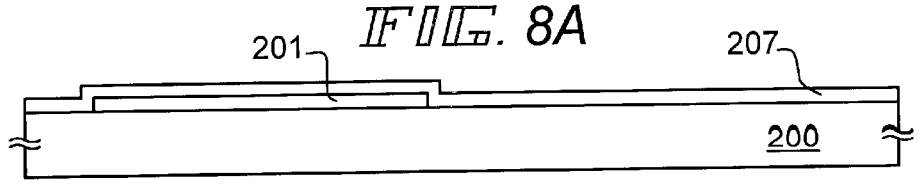
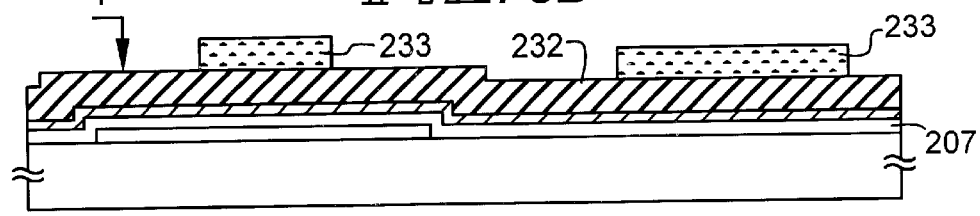
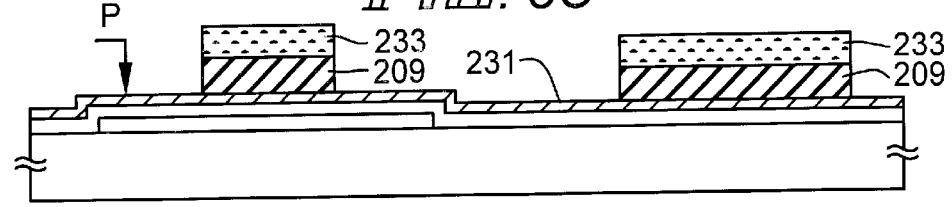
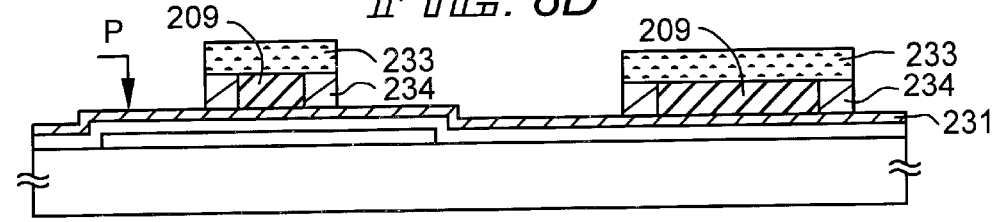
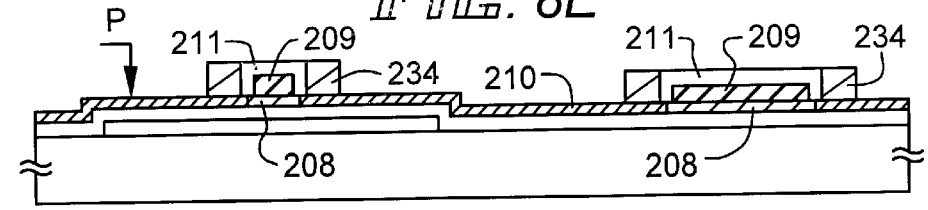
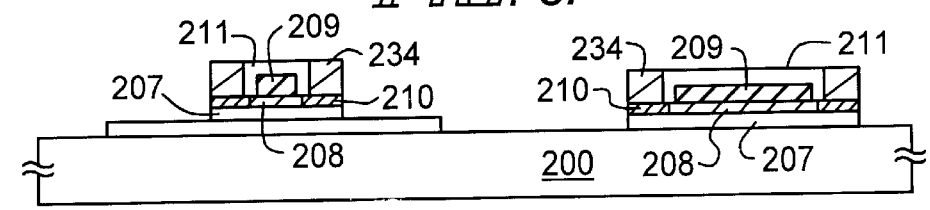

TFT  GATE CONTACT PORTION

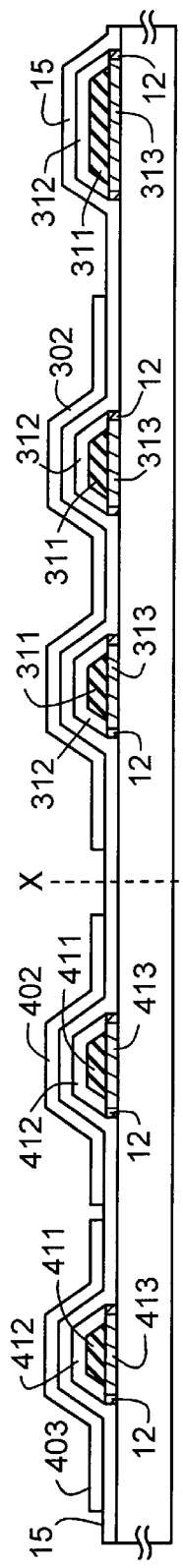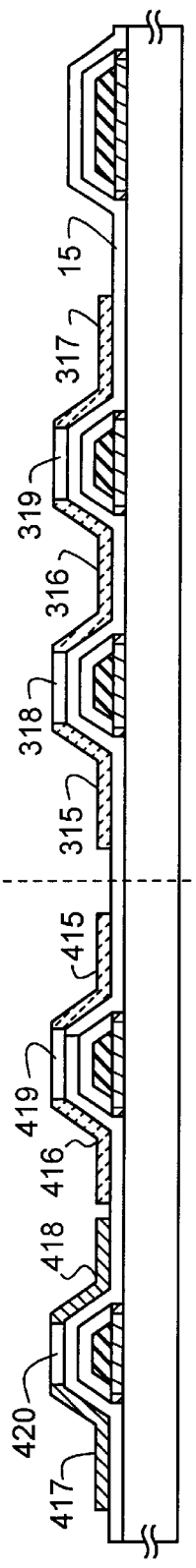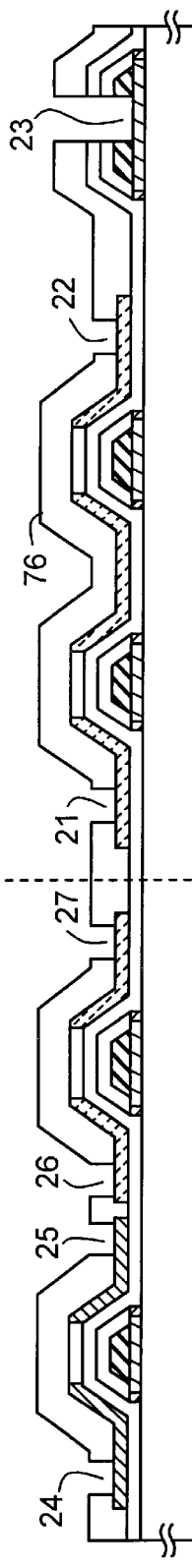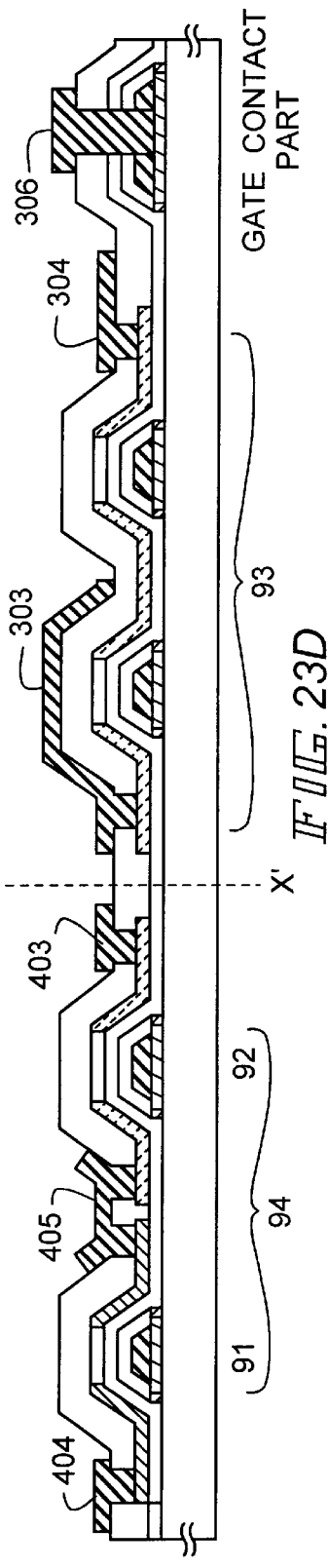

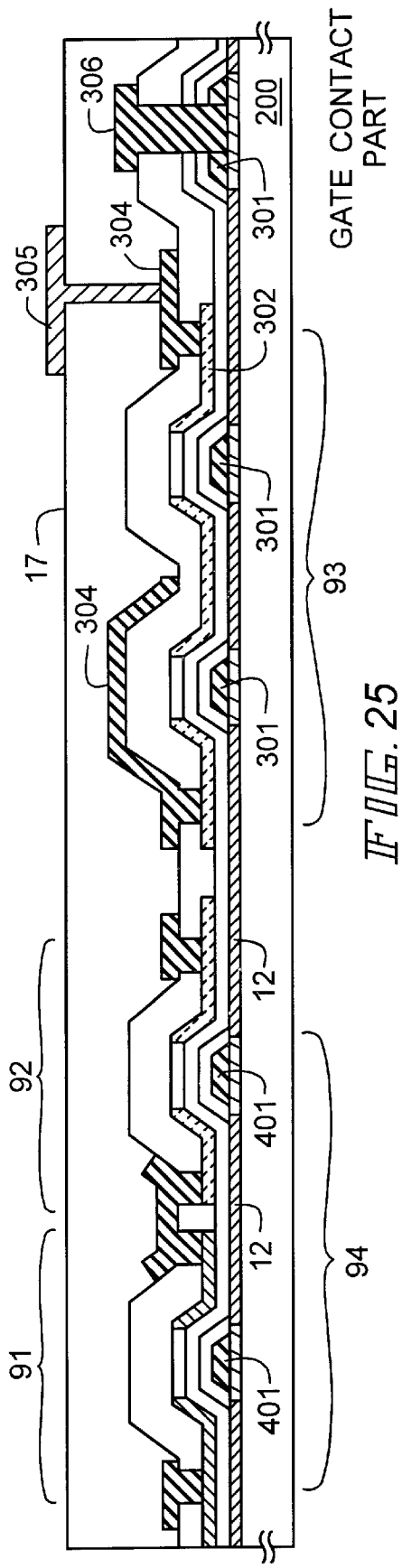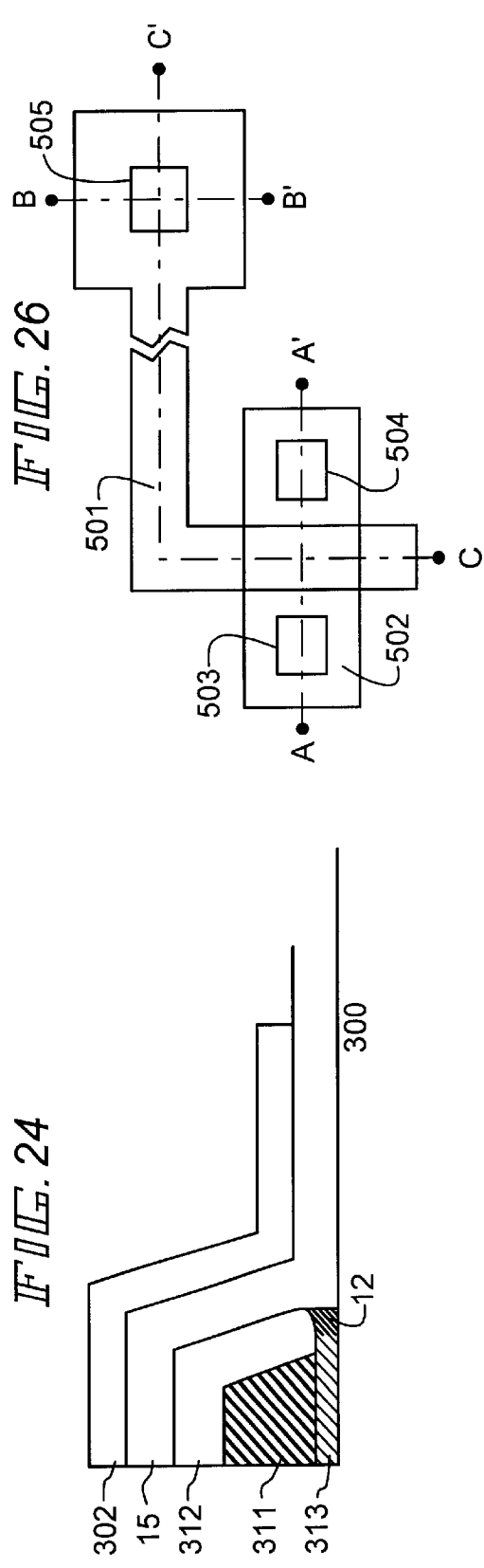

←750 nm→

SEMICONDUCTOR DEVICE WITH METAL-OXIDE CONDUCTORS

FIELD OF THE INVENTION

The present invention relates to a structure production process of a semiconductor device such as a insulated gate type transistor having wiring formed with an aluminum material. The semiconductor device of the invention includes not only a device such as a thin film transistor and a MOS transistor but also an electronic apparatus, such as a display apparatus and an image sensor, having a semiconductor circuit constituted with such an insulated gate type transistor.

BACKGROUND OF THE INVENTION

In recent years, an active matrix type liquid crystal display having a pixel area and a driving circuit constituted with a thin film transistor (hereinafter abbreviated as TFT) formed on a substrate having an insulating property receives attention. A liquid crystal display includes one having a size of from 0.5 to 2 inches for a projection display and one having a size of from 10 to 20 inches for a portable computer, and is used as a display device of a small size to a middle size.

In recent years, a liquid crystal display having a large area is being demanded. In a liquid crystal display of a large area, the area of a pixel matrix area as an image display part becomes large, and thus source wiring and gate wiring arranged in a matrix form become long, which results in increase in wiring resistance. The wiring should be thin due to a demand of minuteness, and the increase in wiring resistance is tangible. Furthermore, since the source wiring and the gate wiring are connected to a TFT for each pixel, and there arises a problem of increase in parasitic capacity. In a liquid crystal display, since gate wiring and a gate electrode are unitedly formed, delay of a gate signal becomes tangible along with increase in area of the panel.

Accordingly, a material mainly comprising aluminum having a relatively low resistance is used as the gate wiring. By forming the gate wiring and the gate electrode with a material mainly comprising aluminum, the gate delay time can be lowered, and the device can be operated at a high speed.

An attempt of decreasing an off current has been conventionally made by making a thin film transistor having an offset structure or an LDD (light doped drain) structure. In Japanese Patent No. 2,759,415, the inventors propose a thin film transistor of an LDD structure. The Japanese Patent No. 2,759,415 corresponds to a U.S. Pat. No. 5,648,277. The Japanese Patent No. 2,759,415 and the U.S. Pat. No. 5,648,277 disclose a process for forming an LDD structure in a semiconductor layer in a self alignment manner by using aluminum as a gate electrode material and subjecting the gate electrode to anodic oxidation. The process will be described with reference to FIGS. 38A to 38E. An entire disclosure of the Japanese Patent No. 2,759,415 and the U.S. Pat. No. 5,648,277 is incorporated herein by reference.

An underlayer film 1011, such as a silicon oxide film, is formed on a glass substrate 1010. An active layer 1013 comprising a polycrystalline silicon film is formed on the underlayer film 1011, and a gate insulating film 1014 is formed on the active layer 1013. An aluminum film is formed and patterned by using a photoresist mask 1016 to form a gate electrode 1015 comprising aluminum. (FIG. 38A)

The pattern is subjected to anodic oxidation in an electrolytic solution by using the gate electrode 1015 as an anode to form a porous alumina film 1017. In this stage, since the surface of the gate electrode 1015 is covered with the mask 1016, the alumina film 1017 is formed only on the side surface of the gate electrode 1015. (FIG. 38C)

After removing the photoresist mask 1016, the gate electrode 1015 is again subjected to anodic oxidation to form a non-porous alumina film 1018. (FIG. 38B)

The gate insulating film 1014 is patterned by using the alumina films 1017 and 1018 as a mask. (FIG. 38D) The porous alumina film 1017 is then removed.

After obtaining this state, the active layer 1013 is doped with an impurity endowing an n-type or p-type conductivity by a plasma doping method. The doping is conducted as divided into two stages. The first stage is conducted at such low acceleration that the gate insulting film 1014 functions as a mask with a large dose amount. The second stage is conducted at such high acceleration that the impurity passes through the gate insulating film 1014 with a small dose amount. As a result, a channel forming region 80, a source region 81, a drain region 82 and low concentration impurity regions 93 and 84 are formed in the active layer 1013 in a self alignment manner. The low concentration impurity region 84 in the side of the drain region 82 is the LDD region.

However, in order to conduct the anodic oxidation treatment, all the electrodes and wiring to be subjected to anodic oxidation should be connected to voltage supplying wiring for anodic oxidation. For example, in the case where the technique disclosed in the literature described above is applied to an active matrix type liquid crystal panel, the gate electrodes and wiring of the thin film transistor constituting the active matrix area and the driver circuit should be connected to voltage supplying wiring. In order to make such a connection, voltage supplying wiring is formed on the substrate, which results in increase of the area of the substrate.

Each gate electrode and gate wiring forms a short circuit with the voltage supplying wiring, and after the anodic oxidation treatment, unnecessary connected parts to the supplying wiring are removed by etching to separate the respective gate wiring and gate electrodes. Therefore, the circuit should be designed with consideration of a process margin of the etching process.

Accordingly, in order to produce a transistor by using the anodic oxidation treatment, additional area for forming the voltage applying wiring and the etching margin are required, which become a bar to the production of a highly integrated circuit and the decrease in area of the substrate.

Furthermore, since aluminum is used as the material of the gate electrode 1015 in the literature described above, the alumina film 1018 is made of alumina. Therefore, the alumina film should be etched in order to connect the gate wiring and the leading wiring. The inventors have used buffered hydrofluoric acid (a mixed solution of ammonium fluoride and hydrofluoric acid) is used as an etchant on the etching.

However, the buffered hydrofluoric acid is low in selectivity between alumina (representative example thereof is $Al_2O_3$) and aluminum, and thus there is a problem in that it etches not only the alumina film but also the gate wiring thereunder. The problem will be described with reference to FIG. 39.

In FIG. 39, numeral 1031 denotes a substrate having an insulating surface, 1032 denotes an insulating film comprising silicon oxide (which functions as a gate insulating film on the active layer), 1033 denotes gate wiring comprising aluminum, 1034 denotes an alumina (anodic oxidized) film obtained by subjecting the gate wiring 1033 to anodic oxidation.

When a part of an upper surface of the alumina film 1034 is etched with the buffered hydrofluoric acid, the gate wiring 1033 is firstly exposed. In general, since the etching is conducted with a certain distribution within the surface of the substrate, it is necessary to completely remove the alumina film 1034 by over-etching.

At this time, when the over-etching is excessively conducted, the gate wiring 1033 is etched by the buffered hydrofluoric acid. There is a possibility that an etching hole 1035 reaches the insulating film 1032 through the gate wiring 1033.

When such a situation is developed, the gate wiring 1033 is connected to the leading line (not shown in the figure) only on a cross section 1036 (expressed by thick lines) of the gate wiring 1033. Because the diameter of the general contact hole is several micrometers, whereas the film thickness of the gate wiring is several hundreds nm, the area on which the gate wiring and the leading line are in contact with each other becomes smaller by about 1/100 than the ordinary case at the state as shown in FIG. 39.

That is, when the situation of FIG. 39 is developed, the contact area of the wiring is extremely decreased to make conditions in that electric contact is impossible. Therefore, the TFT is difficult to be operated, which brings about malfunctioning of the circuit.

When the situation is developed in a structure, in which an active layer of a TFT is present under the insulating film 1032 (for example, contact between the gate electrode and the leading line is made on the TFT), there may be the case in that the leading line and the active layer form a short circuit.

The inventors have then developed a process in that a special etchant is used instead of the buffered hydrofluoric acid. The etchant used by the inventors is an etchant obtained by mixing 10 liter of a solution obtained by mixing phosphoric acid, nitric acid, acetic acid and water in a ratio of 85/5/5/5 with 550 gram of a chromic acid solution (300 gram of chromic acid and 250 gram of water). The inventors call the solution as a chromic mixed acid.

The chromic mixed acid has selectivity in that it etches an alumina film as an anodic oxide film but does not etch an aluminum film. The selective etching of the alumina film can be conducted by using the property of the chromic mixed acid. At present, a contact hole for connecting the gate electrode and the leading line is formed by using such a special etchant. This method realizes a high yield and a good ohmic contact.

However, the method using the chromic mixed acid is not industrially preferred because a large amount of chromium is used, which is a heavy metal that may cause damage to a human body. While development of a substitute etchant is earnestly conducted because of such reasons, a satisfactory etchant has not yet developed at present.

In a TFT using an aluminum material as wiring, when the process temperature after the formation of aluminum wiring is from 300 to 450° C., malfunction of the TFT is confirmed. Various factors can be considered as reasons of the malfunction. In particular, many reasons of the malfunction of a TFT are caused by a short circuit between the gate electrode and the channel formed by a protruded matter, such as hillock and whisker, reaching the channel forming region through the gate insulating film, and an aluminum atom being diffused into the gate insulating film.

When aluminum is heated to a temperature of about 400° C. hillock is formed on the surface, and an aluminum atom is diffused. Therefore, the heat resistance of aluminum is increased by adding Si and Sc or by subjecting the gate wiring to anodic oxidation to cover an anodic oxide product. In a bottom gate type TFT, the gate wiring must be covered with an anodic oxide film to resist against the film formation temperature of the gate insulating film of from 300 to 450° C.

However, in order to conduct the anodic oxidation treatment, all the electrodes and wiring to be subjected to anodic oxidation must be connected to voltage supplying wiring for anodic oxidation. For example, in the case where the technique disclosed in the literature described above is applied to an active matrix type liquid crystal panel, the gate electrodes and wiring of the thin film transistors constituting the active matrix area and the driver circuit must be connected to the voltage supplying wiring. In order to make such a connection, the voltage supplying wiring is formed on the substrate, which results in increase of the area of the substrate.

Each gate electrode and gate wiring forms a short circuit with the voltage supplying wiring, and after the anodic oxidation treatment, unnecessary connected parts to the supplying wiring are removed by etching to separate the respective gate wiring and gate electrodes. Therefore, the circuit should be designed with consideration of a process margin of the etching process.

Accordingly, in order to produce a transistor by using the anodic oxidation treatment, additional area for forming the voltage applying wiring and the etching margin are required, which become a bar to the production of a highly integrated circuit and the decrease in area of the substrate.

Furthermore, a high mobility is demanded in a TFT at present, and a highly crystalline silicon film receives attention as an active layer since it has a higher mobility than an amorphous silicon film. Conventionally, a quartz substrate having a high strain point must be used to obtain a crystalline silicon film by a heat treatment. Since the quartz substrate is expensive, a crystallization technique using an inexpensive glass substrate is being developed.

A technique of lowering the crystallization temperature has been disclosed by the inventors in JP-A-6-232059 and JP-A-7-321339. The JP-A-6-232059 corresponds to a U.S. Pat. No. 5,843,225. An entire disclosure of the JP-A-6-232059, the JP-A-7-321339 and the U.S. Pat. No. 5,843,225 is incorporated herein by reference. In the technique, a slight amount of a metallic element is introduced into an amorphous silicon film, which is then subjected to a heat treatment, to obtain a crystalline silicon film. As the metallic element accelerating the crystallization, at least one selected from Fe, Co, Ni, Ru, Rh, Pd, Os, Ir, Pt, Cu and Au is employed. By using this technique, a crystalline silicon film can be produced at a process temperature, to which the glass substrate can resist.

However, the technique involves a problem in that the metallic element used for crystallization remains in the crystalline silicon film, which may be a cause of deterioration of the reliability and uniformity in characteristics of the TFT. The inventors have then developed a technique in that after forming wiring by using an aluminum material, the metallic element contained in the crystalline silicon film is gettered (JP-A-8-330602). An entire disclosure of the JP-A-8-330602 is incorporated herein by reference. In this technique, a heat treatment is conducted by using the source/drain region as a gettering sink, and thus the metallic element contained in the channel forming region is gettered to the source/drain region.

However, since the gettering technique described above employs an aluminum material having a low heat resistance as wiring, only the heat treatment at a temperature range of about from 300 to 450° C. is conducted. The heating temperature of from 300 to 450° C. is too low to sufficiently conduct gettering of the metallic element contained in the crystalline silicon film, and a treatment for a long period of time is necessary. Therefore, the short circuit between the gate electrode and the channel described above is liable to occur.

As a method for forming the crystalline silicon film, a method for forming a polycrystalline silicon film by as-depo, and a method for crystallizing an amorphous silicon film by a heat treatment or irradiation with laser light have been known.

In the case of a bottom gate type TFT, the gate wiring is formed before the formation of the active layer. Therefore, a crystallization process using an excimer laser is preferred for making small the influence of heat to the gate wiring. In the case where an aluminum material is used as the gate wiring, even when the laser crystallization process is employed, and the heat resistance is increased by the anodic oxidized film, there may be the case where the gate wiring is deformed due to the formation of a protruded matter, such as hillock and whisker, on aluminum.

As described in the foregoing, the uses of an aluminum material for wiring from the standpoint of wiring resistance, but various problems arise by using the aluminum material. The problems are summarized below.

First, a thin film transistor having an LDD structure can be produced in a self alignment manner by using the anodic oxidation technique. However, because voltage supplying wiring for anodic oxidation must be formed, high integration of the circuit and decrease in area of the substrate are inhibited.

Second, in a process for forming a contact hole for a leading electrode of a gate electrode, the use of the chromic mixed acid is unavoidable for removing alumina covering the gate electrode.

Third, because of the low heat resistance of aluminum, a short circuit is formed between gate wiring and a channel, to cause malfunction of the TFT.

Furthermore, in a bottom gate type TFT, the gate wiring is formed before the crystallization process of the silicon film. In the total process, the crystallization process is one applying the largest heat influence to the gate wiring. Even when a laser crystallization process applying a relatively small heat influence is employed, and the aluminum layer is covered with the anodic oxide film, it is difficult to completely prevent deformation (blister) of the gate wiring due to the formation of hillock.

SUMMARY OF THE INVENTION

The invention relates to a semiconductor device having a novel wiring structure that solves the problems described above at a stroke.

In the invention, the anodic oxidation of an aluminum material is conducted without forming voltage supplying wiring for anodic oxidation. Furthermore, a first wiring comprising a laminated structure of alumina and aluminum, and good ohmic contact between the first wiring and a second wiring electrically contacting with the first wiring are realized without using the chromic mixed acid, and a short circuit between the gate electrode and the channel is prevented.

In order to solve the problems described above, the invention relates to a semiconductor device having wiring comprising a laminated structure comprising a first wiring layer comprising a first conductive film having laminated thereon a second wiring layer comprising a second conductive film, wherein the wiring comprises a first oxide film formed by oxidizing the first wiring layer, and a second oxide film formed by oxidizing the second wiring layer; a lower part of the second wiring layer is in contact only with the first wiring layer; and a lower part of the second oxide film is in contact with the first wiring layer and the first oxide film.

One of the characteristic features of the invention resides in the wiring having the multi-layer structure, in which diffusion of the material constituting the second wiring layer is prevented by the first wiring layer. Therefore, the upper limit of the process temperature after the formation of the gate wiring can be increased. Another characteristic feature of the invention is to conduct anodic oxidation of the first and second wiring layers without forming voltage supplying wiring for anodic oxidation. Accordingly, by using the first conductive film constituting the first wiring layer as the wiring for anodic oxidation, anodic oxidation of the second wiring layer is realized.

The path to the invention will be described with reference to FIGS. 35A to 35E, 36A to 36C, 37A to 37C and 38A to 38E.

The inventors have confirmed as to whether or not plural aluminum patterns formed on a tantalum film by patterning to an island form can be subjected to anodic oxidation by using the tantalum film as an electrode. FIGS. 35A to 35E are cross sectional views showing the aluminum pattern in each steps of the experiment. FIGS. 36A to 36C are partial enlarged cross sectional view of FIGS. 35C to 35E. FIGS. 37A to 37C are SEM (Scanning Electron Microscope) photographs obtained by observing the cross sectional structures in FIGS. 36A to 36C.

The experiment was conducted in the following manner.

A tantalum (Ta) film 41 having a thickness of 20 nm and an aluminum (Al) film 42 having a thickness of 400 nm were formed on a glass substrate 40 (5-inch square, Glass Substrate 1737 produced by Corning, Inc.) by a sputtering method. The surface of the aluminum film 42 was subjected to anodic oxidation by connecting a probe of an anodic oxidation apparatus to the aluminum film, to form an anodic oxide film 49 of a barrier type. The barrier type anodic oxide film (hereinafter expressed as barrier A.O. film) was alumina. (FIG. 35A)

The anodic oxidation was conducted by using an ethylene glycol solution containing 3% of tartaric acid as an electrolytic solution under the conditions of a solution temperature of 30° C., an ultimate voltage of 10 V, a voltage application time of 15 minutes and a supplied electric current of 10 mA per one substrate. The anodic oxidation step was conducted to increase adhesion of a resist mask 59. The anodic oxidation step is called a mask anodic oxidation step since the barrier A.O. film 49 is formed on the surface of the Al film 42.

A resist mask 59 is then formed, and the A.O. film 49 and the Al film were etched to form plural patterns 43 of gate wiring comprising the Al film (hereinafter expressed as gate Al 43). The gate Al 43 were formed in the form separated for each wiring. In FIG. 34B, only 2 of the gate Al 43 are shown.

An acid obtained by mixing 10 liter of a solution obtained by mixing phosphoric acid, nitric acid, acetic acid and water in a ration of 85/5/5/5 with 550 gram of a chromic acid solution (300 gram of chromic acid and 250 gram of water) was used as an etchant for the barrier A.O. film 49. The etchant is called as a chromic mixed acid. An acid obtained by mixing phosphoric acid, nitric acid, acetic acid and water in a ration of 85/5/5/5 was used as an etchant for the Al film 42. The etchant is called as an aluminum mixed acid. (FIG. 35B)

While the resist mask 59 remained, anodic oxidation was conducted by applying a voltage to the Ta film 41 in the anodic oxidation apparatus. The anodic oxidation was conducted by using a 3% oxalic acid aqueous solution as an electrolytic solution under the conditions of an ultimate voltage of 8 V, a voltage application time of 40 minutes and a supplied electric current of 20 mA per one substrate. In the case where the conventional anodic oxidation method using these anodic oxidation conditions, a porous type anodic oxide (porous A.O.) 44 is formed on a side surface of the aluminum pattern 43. The anodic oxidation step is then called as a side anodic oxidation step. (FIG. 35C)

After removing the resist mask 59, anodic oxidation was again conducted by applying a voltage to the Ta film 41 in the anodic oxidation apparatus. The anodic oxidation was conducted by using an ethylene glycol solution containing 3% of tartaric acid as an electrolytic solution under the conditions of an electrolytic solution temperature of 10°C., an ultimate voltage of 80 V, a voltage application time of 30 minutes and a supplied electric current of 30 mA per one substrate. In the case where the conventional anodic oxidation method using these anodic oxidation conditions, tartaric acid penetrates into the porous A.O. film 44, and the surface of the gate Al film 43 is subjected to anodic oxidation to form a barrier type anodic oxide (barrier A.O.) film 46. Thus, the anodic oxidation step is called as a barrier anodic oxidation step. The barrier A.O. film 46 comprised non-porous alumina. (FIG. 35D)

The porous A.O. film 44 was removed by wet etching using the aluminum mixed acid. (FIG. 35E)

The results and discussions of the experiment will be described below. In order to confirm as to whether the Ta film 41 functioned as voltage supplying wiring for anodic oxidation, the sheet resistance of the Ta film 41 was measured in each steps. Further, after each steps of FIGS. 35C to 35E, the cross sectional structure was observed by the SEM. FIGS. 37A to 37C show the SEM photographs. FIGS. 36A to 36C schematically show the SEM photographs, and the cross sectional views of FIGS. 37A to 37C correspond to FIGS. 36A to 36C, respectively. In FIGS. 36A to 36C and 37A to 37C, the same names and the same symbols correspond to the constitutional elements in FIGS. 35A to 35E.

The sheet resistance of the Ta film 41 in the initial stage (before the mask anodic oxidation step) was 100.1 Ω per square. The sheet resistance after the side anodic oxidation step was 205.1 Ω per square, and that after the completion of the barrier anodic oxidation step was a value exceeding the measurable range of the measuring device used. The maximum value of the measurable value of the device was 5,000 kΩ per square, and it could be considered that the sheet resistance after the completion of the barrier anodic oxidation step was at least 5,000 kΩ per square.

The glass substrate 40 was observed with the naked eyes after the completion of the side anodic oxidation step, and it was found that the transparency of the Ta film 41 was increased in comparison to the initial stage. It could be expected from this and the sheet resistance that the Ta film 41 was slightly oxidized by oxalic acid. The film thickness of the Ta film 41 suffered substantially no change in the SEM photograph of FIG. 35A, and thus it was understood that the Ta film 41 suffered substantially no oxidation. Furthermore, it was observed that the gate Al 43 divided into an island form was subjected to anodic oxidation by applying a voltage to the Ta film 41, to form the porous A.O. (porous alumina). (FIG. 36A)

Similarly, the glass substrate 40 was observed with naked eyes after the completion of the barrier anodic oxidation step, and it was found that the exposed Ta film 41 was substantially transparent. This was because tartaric acid used for the mask anodic oxidation step also anodically oxidized tantalum, and it was expected that the Ta film 41 at that part was modified to a tantalum oxide film 45 (hereinafter expressed as a $TaO_x$ film) by the anodic oxidation.

According to the SEM observation photograph of FIG. 35B, in which the film thickness of the Ta film 41 under and outside the porous A.O. film 44 became three times, it was understood that the Ta film 41 had been subjected to anodic oxidation to become a $TaO_x$ film 45 in these parts. It is understood from the fact that the sheet resistance value became extremely large.

However, since tantalum oxide is an insulating material, there arises a problem in that whether the $TaO_x$ film 45 functions as wiring. Because the electric current value monitored during the barrier anodic oxidation step did not exhibit large fluctuation, it was considered that a voltage was applied to the gate Al 43 even though the Ta film 41 was modified to the $TaO_x$ film 45. It is expected that this is because although the $TaO_x$ film 45 has an extremely large sheet resistance, the oxygen content thereof is smaller than $Ta_2O_5$ (tantalum pentaoxide), the stoichiometric ratio, and thus it exhibits a slight conductivity (semi-insulating property). It is considered that the deviation from the stoichiometric ratio is largely ascribed to the fact that the $TaO_x$ film 45 is formed by anodic oxidation.

Then, the cross sectional structure was observed to confirm as to whether or not the barrier A.O. film 46 was formed to cover the gate Al 43. (FIG. 36C and FIG. 37C)

The aluminum mixed acid was used in the etching process of FIG. 35E. The aluminum mixed acid etches both the porous alumina (porous A.O. film 44) and the aluminum, but substantially does not etch non-porous alumina (barrier A.O. film 46). Therefore, when the barrier A.O. film 46 is not sufficiently formed in the barrier anodic oxidation step, the gate Al 43 is also removed.

In the SEM observation photograph of FIG. 37C, it is confirmed that the gate Al 43 remains after the etching treatment with the aluminum mixed acid. Therefore, it is concluded that the barrier A.O. film 46 that can withstand the aluminum mixed acid in the mask anodic oxidation step. Under the conditions of this experiment, the film thickness of the barrier A.O. film 46 is about 100 nm. In this process, the barrier A.O. films 46 and 49 are substantially united.

Through the experiment described above, it has been found that the gate Al 43 can be subjected to anodic oxidation by applying a voltage to the Ta film 41 under the conditions in that the Ta film 41 formed on the whole surface of the glass substrate 40 and the gate Al 43 selectively formed thereon form a short circuit. In particular, it has been found that when the Ta film 41 is used as the voltage supplying wiring for anodic oxidation using tartaric acid, the gate Al 43 formed thereon can be subjected to anodic oxidation.

It is understood from the comparison between the photographs of FIGS. 37B and 37C that the film thickness distribution of the $TaO_x$ film 45 is different between the region on which the A.O. films 44 and 46 are present and the region on which the A.O. films 44 and 46 are not present.

In the barrier anodic oxidation step, an exposed part of the Ta film 41 is in direct contact with tartaric acid and is subjected to anodic oxidation. Since the porous A.O. film 44 is of porous nature, tartaric acid penetrates therein. The anodic oxidation of the Ta film 41 proceeds under the porous A.O. film 44, and simultaneously the anodic oxidation of the gate Al 43 proceeds on the side surface of the porous A.O. film 44.

However, due to the difference in anodic oxidation rate, the interface between the gate Al 43 and the A.O. film 46 is present inside the interface between the Ta film 41 and the TaO$_x$ film 45 as shown in FIG. 36B. Therefore, the lower part of the barrier A.O. film 46 is in contact with both the Ta film 41 and the TaO$_x$ film 45, and the lower part of the gate Al 43 is in contact with only the Ta film 41.

Because the TaO$_x$ film 45 and the barrier A.O. film 46 are formed by the same anodic oxidation step, it is considered that the interface between the TaO$_x$ film 45 and the barrier A.O. film 46 and the vicinity thereof become an oxide of alloy comprising Ta and Al. Since the TaO$_x$ film 45 is formed to push up the barrier A.O. film 46, it exhibits excellent adhesion to the barrier A.O. film 46. Since the edge of the interface between the barrier A.O. film 46 and the Ta film 41 is sealed with the TaO$_x$ film 45, an effect of preventing the diffusion of Al from the gate Al 43 is highly exhibited.

With respect to the film thickness of the TaO$_x$ film 45 under the A.O. film 46 denoted by a region 61, the thickness $t_1$ is gradually decreased toward the Ta film 41. While the thickness is gradually increased from the region 61 toward the outside of the A.O. film 46, the film thickness $t_2$ becomes the maximum under the porous A.O. film 44 at a part 62. The thickness is gradually decreased from the part 62 toward the outside, and the film thickness $t_3$ becomes substantially constant in a region 63.

The TaO$_x$ film 45 at a part extending from the side surface of the barrier A.O. film 46 is formed by anodic oxidation under the conditions in that the porous A.O. film 44 is present. Therefore, it is considered that the surface layer of the TaO$_x$ film 45 at this part becomes an oxide compound of an alloy comprising Ta and Al due to the reaction with the porous A.O. film 44.

The film thickness of the TaO$_x$ film 45 is summarized below. The film thickness is different between the part under the barrier A.O. film 46 and the part under the porous A.O. film 44. The film thickness under the barrier A.O. film 46 is gradually increased from the interface to the Ta film 41 toward the outside. In the part under the porous A.O. film 44, the part 62 exhibiting the maximum film thickness $t_2$ and the region 63 exhibiting the constant thickness $t_3$ are present. In the region on which the A.O. films 44 and 46 are not present, only the region 63 exhibiting the constant thickness $t_3$ is present. Since when Ta is oxidized, the thickness thereof is increased by 2 times to 4 times, the film thickness $t_2$ and $t_3$ are from 2 times to 4 times the thickness of the Ta film 41.

The constitution of the invention is based on the knowledge obtained from the experimental results described above. In the invention, the second wiring layer is formed on the first conductive film in such a manner that the second wiring layer is electrically separated by the respective wiring, and the second wiring layer is subjected to anodic oxidation by applying a voltage to the first conductive film under the conditions in that the plural second wiring layers form a short circuit by the first conductive film.

In the constitution described above, the second wiring layer as an upper layer is mainly used as a path of electric charge, and the film thickness thereof is about from 200 to 500 nm. It is preferred that the conductive film constituting the second wiring layer comprises aluminum or a material mainly comprising aluminum, to lower the resistance of the wiring.

A valve metal can be used as the first conductive film. The valve metal is a metal exhibiting a function like a valve, i.e., a barrier type anodic oxide film formed anodically passes a cathode electric current but does not pass an anode electric current. We quoted the description of the valve metal from "Electrochemistry Handbook, 4th Ed., Society of Electrochemistry, page 370, Maruzen (1985)".

Examples of the valve metallic film having a melting point higher than aluminum include tantalum (Ta), niobium (Nb), hafnium (Hf), zirconium (Zr), titanium (Ti) and chromium (Cr). Furthermore, as the first conductive film, an alloy containing the valve metallic element, such as molybdenum tantalum (MoTa) can be employed.

Particularly, it has been confirmed that tantalum can be subjected to anodic oxidation in the same electrolytic solution as a thin film mainly comprising aluminum, and tantalum is preferably used in the invention. A tantalum alloy, such as molybdenum tantalum (MoTa), and tantalum nitride (Ta$_y$N (y>1)), as tantalum containing nitrogen, can be employed. Furthermore, these conductive materials have a melting point higher than aluminum, and exhibit a blocking function of preventing diffusion of aluminum element.

While it is preferred that the thickness of the first conductive film is as thin as possible, such a thickness is required that can function as a blocking layer of preventing diffusion of the constitutional element of the second wiring layer. The thickness of the first conductive film is 1 nm or more, and preferably 5 nm or more.

It is considered that the upper limit of the film thickness of the first conductive film is 50 nm, and preferably about 30 nm. The first oxide is formed by oxidizing the first conductive film, and the thickness thereof becomes 2 times to 4 times the thickness of the first conductive film. Therefore, the upper limit of the film thickness of the first conductive film is 50 nm, and preferably 30 nm taking the throughput of the film formation of the first conductive film and the etching of the first oxide into consideration. In the case where an aluminum film is used as the second conductive film, and a tantalum film is used as the first conductive film as an underlayer, when the thickness of the tantalum film is 20 nm or 50 nm, it has been confirmed that aluminum is not diffused into the lower layer of the tantalum film even though the wiring is subjected to a heat treatment at 550° C.

It is considered from the above that the film thickness of the first conductive film is selected from the range of from 1 to 50 nm (preferably from 5 to 30 nm, and more preferably from 5 to 20 nm).

BRIEF DESCRIPTION OF THE DRAWINGS

FIGS. 8A to 8F are cross sectional views showing the production process of the TFT in Example 1.

FIGS. 23A to 23D are cross sectional views showing the production process of the TFT in Example 7.

FIG. 24 is a cross sectional view of the gate wiring in Example 7.

FIG. 25 is a cross sectional view of the active matrix substrate in Example 8.

FIG. 26 is a plan view of the TFT in Example 9.

PREFERRED EMBODIMENTS OF THE INVENTION

An embodiment of the invention will be described with reference to FIGS. 1A to 1E, 2A to 2D, 3A to 3E and 4.

Embodiment 1

Figure 1A:
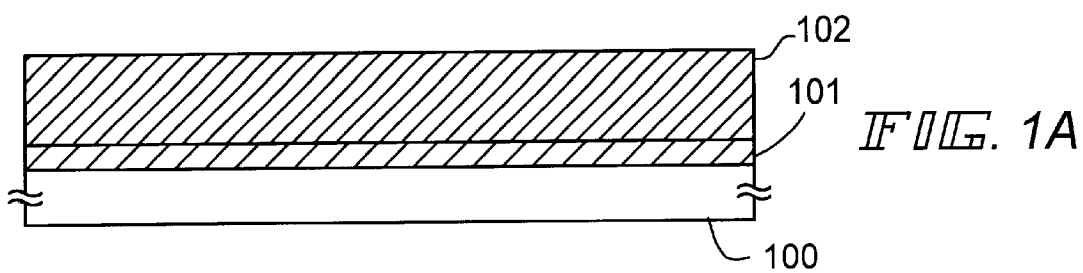
FIGS. 1A to 1E are cross sectional views showing the production process of the wiring of Embodiment 1.

FIGS. 1A to 1E are cross sectional views showing the production process of the wiring of this embodiment according to the invention. A first conductive film 101 comprising a valve metal is formed on a surface of an insulating material 100. A second conductive film 102 mainly comprising aluminum is formed in contact with the first conductive film 101. (FIG. 1A)

Examples of the insulating material 100 include an insulating substrate, such as a glass substrate and a quartz substrate, an underlying film formed on the substrate, and a gate insulating film and an interlayer insulating film of a semiconductor device. The second conductive film 102 includes not only pure aluminum but also an aluminum to which several percent by weight of Si or Sc is added or an alloy of aluminum and the other element.

Figure 1B:
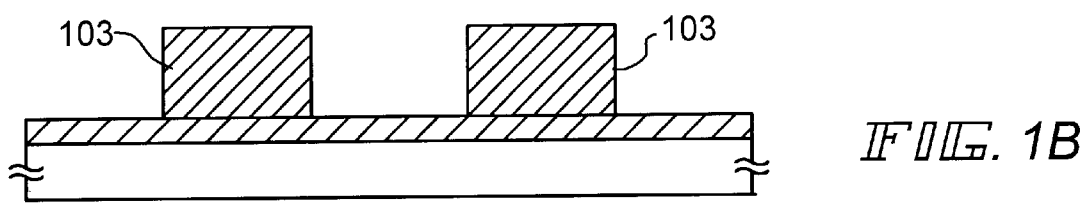

A second wiring layer 103 is formed on the first conductive film 101 by patterning the second conductive film 102. The second wiring layer is separated by the respective wiring (only two are shown in the figure), and all pieces of the second wiring layer 103 are connected to form a short circuit by the first conductive film 101. (FIG. 1B)

The second wiring layer 103 is subjected to anodic oxidation by applying a voltage to the first conductive film 101 in an ethylene glycol solution containing 3% of tartaric acid, to form an anodic oxide film (barrier type alumina films) 105 of the wiring layer 103 on the surface thereof. In the case where the first conductive film 101 is formed with a material that can be subjected to anodic oxidation by tartaric acid, such as a tantalum film, the exposed part of the conductive film 101 is modified to an anodic oxide 104. While the anodic oxide 104 becomes thicker than the conductive film, they are shown by the same thickness for simplification. (FIG. 1C)

A first wiring layer 106 is formed by etching the anodic oxide 104 by using the anodic oxide film 105, to complete wiring 110. (FIG. 1D)

Figure 1C:
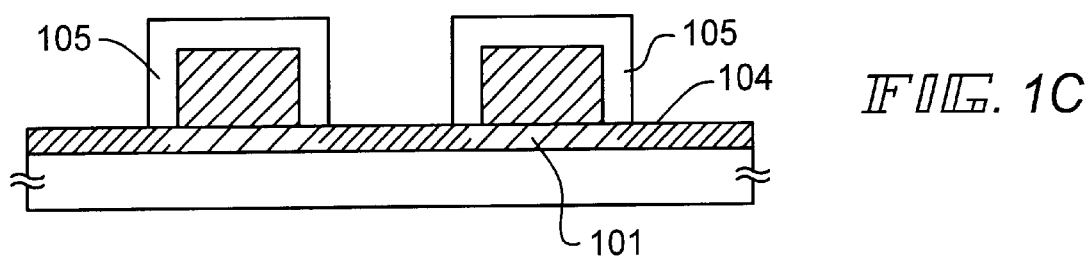
Figure 1D:
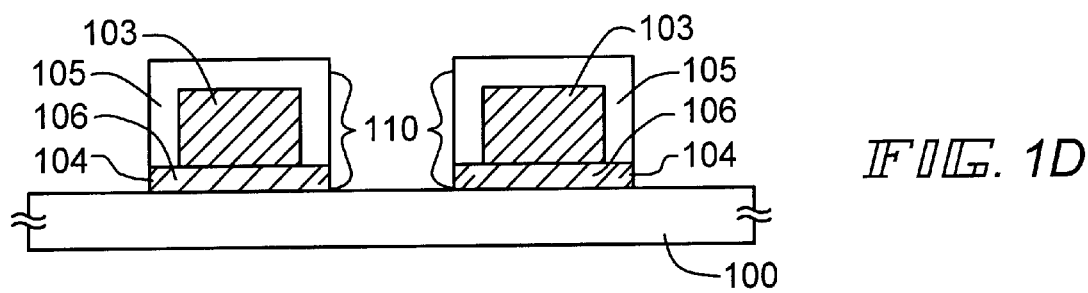

The first wiring layer 106 substantially corresponds to the first conductive film 101 remaining not anodically oxidized, and thus it may be considered that the first wiring layer 106 has been fixed in the anodic oxidation step in FIG. 1C.

Figure 1E:
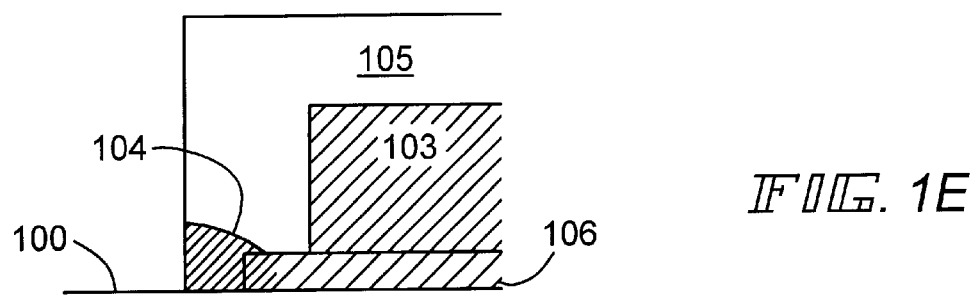

As shown in FIG. 1E, because the anodic oxidation rate of the second conductive film 102 is higher than that of the first conductive film 101, the interface between the second wiring layer 103 and the anodic oxide film 105 is inside the interface between the first wiring layer 106 and the anodic oxide 104. Therefore, a lower part of the anodic oxide 105 is in contact with both the first wiring layer 106 and the anodic oxide 104, and a lower part of the second wiring layer 103 is in contact with only the first wiring layer. The film thickness of the oxide 104 is gradually increased toward the outside.

In this embodiment, because all the pieces of the second wiring layer 102 are connected to form a short circuit by the first conductive film 101, a voltage supplying line for anodic oxidation is not necessary. Therefore, a step of separating the second wiring layer 103 from the voltage supplying line for the respective wiring by etching after the anodic oxidation treatment can be omitted. Thus, because at an edge part 111 of a wiring 110 shown in FIG. 2A, the anodic oxide films 105 and 104 are present as shown in FIG. 2C, the heat resistance of the wiring 110 is not deteriorated. Side surfaces of the wiring 110 other than the edge part 111 have the same constitution as the edge part 111.

Figure 2A:
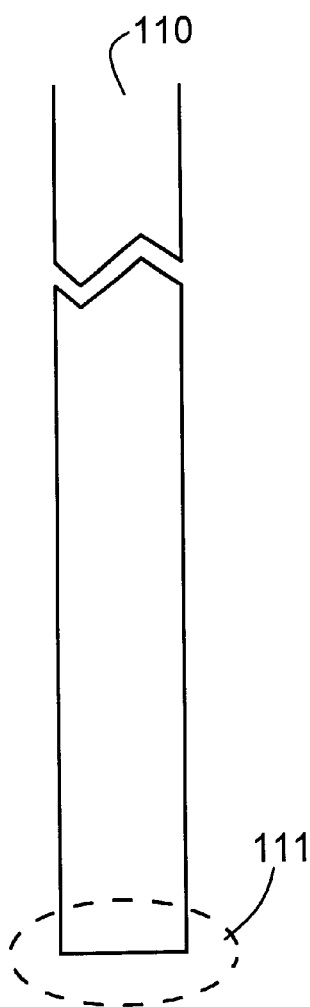
FIGS. 2A to 2D are plan views and side views of the wiring of Embodiment 1 and a conventional embodiment.
Figure 2B:
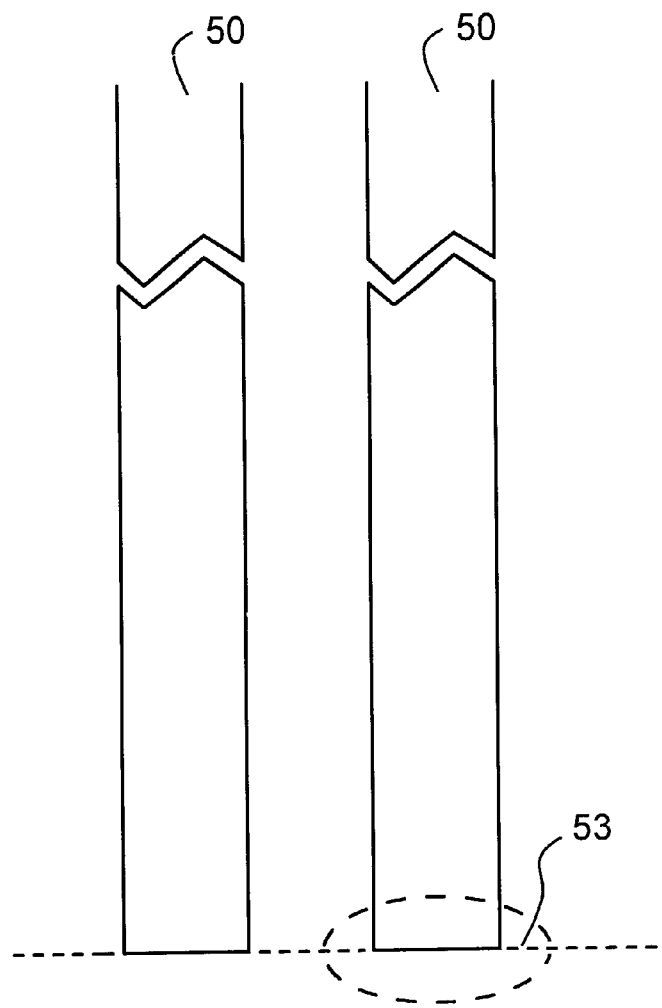
Figure 2C:
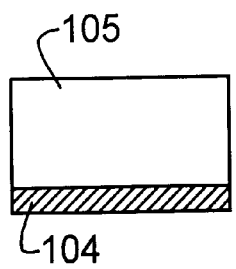
Figure 2D:
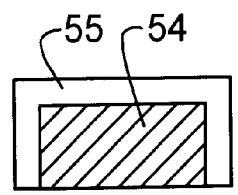

On the other hand, the conventional aluminum wiring 50 covered with an alumina (anodic oxide) layer 55 as shown in FIG. 2B must be connected to a voltage supplying line 51. Therefore, the wiring 50 must be separated from the wiring 51. In the side surface structure of a separated part 53 as shown in FIG. 2D, an aluminum layer 54 is exposed. The invention can be distinguished from the conventional embodiment by this point. When the aluminum layer 54 is exposed, the heat resistance of the wiring 50 is deteriorated.

Embodiment 2

FIGS. 3A to 3E are cross sectional views showing the production process of the wiring of this embodiment according to the invention. In this embodiment, a first oxide is extended outside a side surface of a second oxide, and a wiring is formed on an insulating film divided into an island form. Other constitution is the same as in Embodiment 1.

Figure 3A:
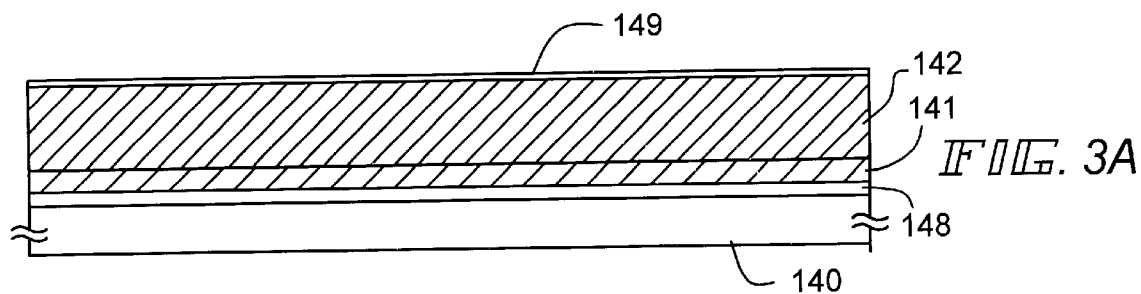
FIGS. 3A to 3E are cross sectional views showing the production process of the wiring of Embodiment 2.
Figure 3B:
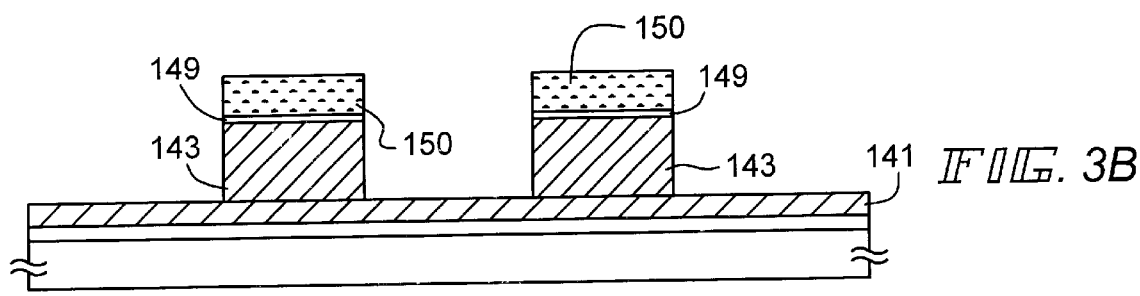

An insulating film 148 comprising silicon oxide or silicon nitride is formed on a glass substrate 140. A Ta film 141 as a first conductive film is formed on the insulating film 148. An Al film 142 as a second conductive film is formed in contact with the first conductive film 141. The Al film 142 is subjected to anodic oxidation by applying a voltage to the first conductive film 141 in an ethylene glycol solution containing 3% of tartaric acid, to form a barrier type anodic oxide (barrier A.O.) film 149 on the surface thereof. (FIG. 3A)

The anodic oxidation was conducted by using an ethylene glycol solution containing 3% of tartaric acid as an electrolytic solution under the conditions of a solution temperature of 30° C., an ultimate voltage of 10 V, a voltage application time of 15 minutes and a supplied electric current of 10 mA per one substrate. The anodic oxidation step is conducted for increasing the adhesion of a resist mask 150.

A resist mask 150 is formed, and the A.O. film 149 and the Al film 142 are etched to form plural pieces of a second wiring layer comprising an Al film separated by the respective wiring. In FIGS. 3B to 3E, only two pieces of the wiring layer 143 are shown. (FIG. 33)

Figure 3C:
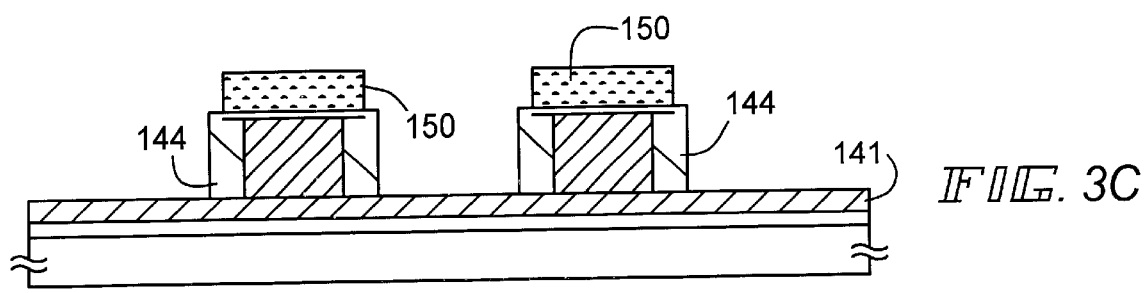

Anodic oxidation is conducted by applying a voltage to the Ta film 141 in the anodic oxidation apparatus with the resist mask 150 remaining. The anodic oxidation was conducted by using a 3% oxalic acid aqueous solution as an electrolytic solution under the conditions of an ultimate voltage of 8 V, a voltage application time of 40 minutes and a supplied electric current of 20 mA per one substrate. In the case where the conventional anodic oxidation method using these anodic oxidation conditions, a porous type anodic oxide film 144 (porous A.O.) is formed on a side surface of the aluminum pattern 143. (FIG. 3C)

Figure 3D:
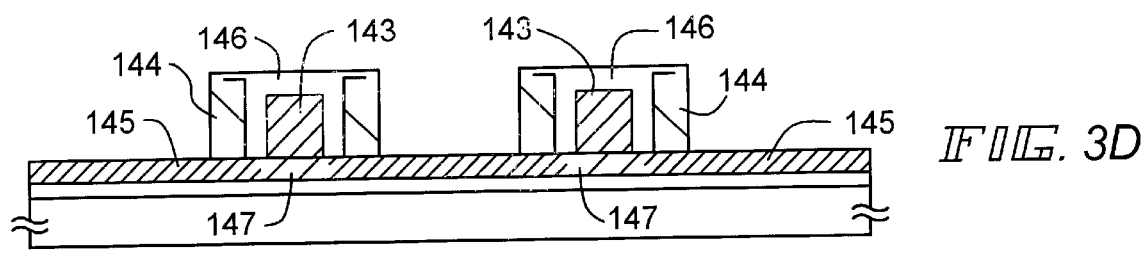

After removing the resist mask 150, anodic oxidation is again conducted by applying a voltage to the Ta film 141 in the anodic oxidation apparatus. Tartaric acid penetrates into the porous A.O. film 144 to form a barrier type anodic oxide (barrier A.O.) film 146 by anodic oxidation of the surface of the second wiring layer 143, and the Ta film 141 is also subjected to selective anodic oxidation to form a tantalum oxide ($TaO_x$) film 145. The barrier A.O. is non-porous alumina, and the barrier A.O. films 149 and 146 are united. The Ta film 141 remaining as not anodically oxidized is fixed as a first wiring layer 147. (FIG. 3D)

Figure 3E:
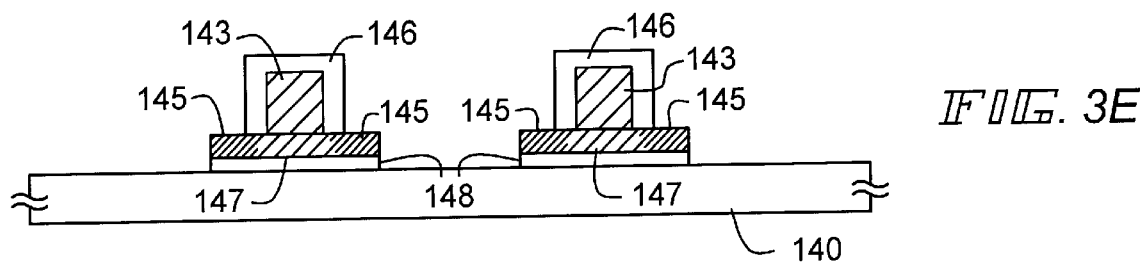

Etching is conducted by using the A.O. films 144 and 146 as a mask to pattern the insulating film 14B and the $TaO_x$ film 145 to an island form in a self alignment manner. Finally, the porous A.O. film 144 is removed by etching to complete the wiring. Therefore, the wiring is formed on the insulating film 148 separated by the respective wiring to an island form. (FIG. 3E)

Figure 4:
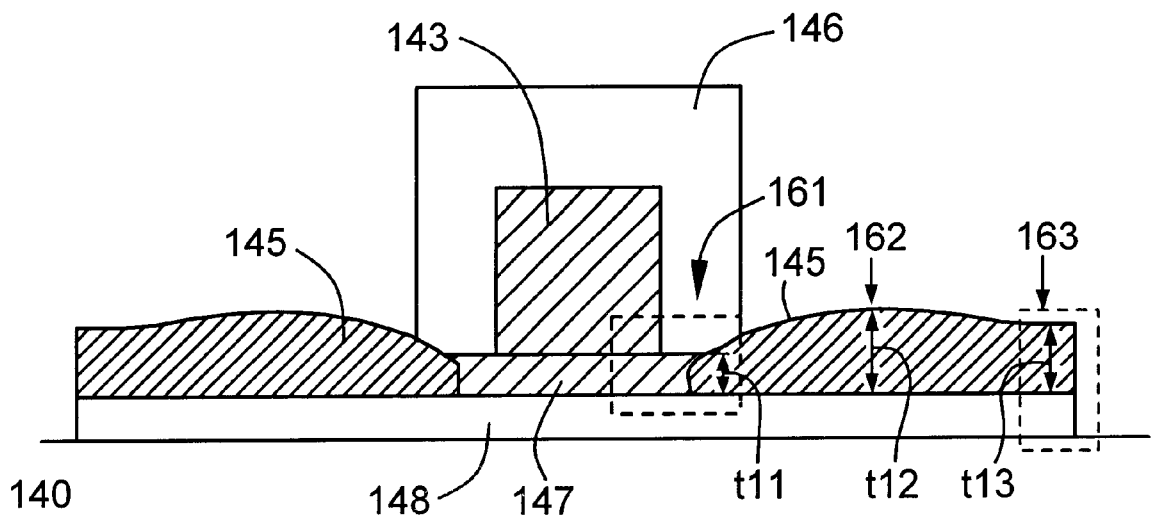
FIG. 4 is an enlarged cross sectional view of the wiring of Embodiment 2.

A cross sectional view of the wiring of this embodiment is shown in FIG. 4. The same symbols are applied to the same constitutional elements in both FIGS. 3A to 3E and FIG. 4. The thickness of the Ta film 141 and that of the $TaO_x$ film 145 are expressed by the same thickness in FIGS. 3A to 3E for simplification.

In this embodiment, the $TaO_x$ film 145 is extended outside the side surface of the barrier A.O. film 146. As described with reference to FIGS. 37A to 37C, the thickness of the $TaO_x$ film 145 is different between the part under the barrier A.O. film 146 and the part outside the barrier A.O. film. Under the barrier A.O. film 146, the thickness $t_{11}$ of the $TaO_x$ film 145 is gradually increased from the interface between the first wiring layer 147 and the $TaO_x$ film 145 toward the outside.

Since the $TaO_x$ film 145 and the barrier A.O. film 146 are formed by the same anodic oxidation process, it is considered that the interface between the $TaO_x$ film 145 and the barrier A.O. film 146 and the vicinity thereof become an oxide of an alloy comprising Ta and Al. The $TaO_x$ film 145 is formed to push up the barrier A.O. film 146, and since the edge of the interface between the barrier A.O. film 146 and the Ta film 147 is sealed with the $TaO_x$ film 145, it is considered that the barrier A.O. film is pushed on the Ta film 147. Therefore, the effect of preventing the diffusion of Al from the second wiring layer 143 is highly exhibited.

Since the interface between the barrier A.O. film 146 and the second wiring layer is inside the interface between the first wiring layer 147 and the $TaO_x$ film 145, the effect of preventing the diffusion of Al from the wiring is high. This can be understood by considering the case in that the interface between the barrier A.O. film 146 and the second wiring layer is outside or agree with the interface between the first wiring layer 147 and the $TaO_x$ film 145. In such a case, there is a possibility in that under the second wiring layer, aluminum is diffused from the interface between the first wiring layer 147 and the $TaO_x$ film 145.

In the constitution of this embodiment, since the lower part of the second wiring layer 143 is in contact with only the first wiring layer, the effect of preventing the diffusion of Al becomes high.

The part extending outside the side surface of the barrier A.O. film 146 is a part that has been present under the porous A.O. film 144. As described with reference to FIGS. 35A to 35C and 36A to 36C, in the part under the porous A.O. film 144, the $TaO_x$ film 145 has the part 62 exhibiting the maximum film thickness $t_2$ and the region 63 exhibiting the constant thickness $t_3$ outside the part 62. Therefore, in this embodiment, the $TaO_x$ film 145 in the part extending outside the side surface of the barrier A.O. has the part 162 exhibiting the maximum thickness $t_{12}$ and the region 163 exhibiting the constant thickness $t_{13}$ outside the part 162. Since when Ta is oxidized, the thickness thereof is increased by 2 times to 4 times, the film thickness $t_{12}$ and $t_{13}$ are from 2 times to 4 times the thickness of the Ta film 147 (first wiring layer 147).

The part of the TaO$_x$ film 145 extending outside the side surface of the barrier A.O. film 146 is formed by conducting anodic oxidation under the conditions in that the porous A.O. film 144 remains. Therefore, it is considered that the surface layer of the TaO$_x$ film 145 at this part becomes an oxide compound of an alloy of Ta and Al due to the reaction with the porous A.O. film 144.

By using the porous A.O. film 144 as an etching mask, patterning of the TaO$_x$ film 145 and the insulating film 148 is conducted in a self alignment manner, and thus the side surface of the TaO$_x$ film 145 and that of the insulating film 148 agree to each other to form a single plane.

In this embodiment, it is not necessary to separate the wiring after the anodic oxidation process, and since the side surface of the wiring layers 143 and 146 is not exposed, the heat resistance of the wiring is not deteriorated.

Examples of the invention will be described in detail with reference to FIGS. 5 to 35C.

EXAMPLE 1

Figure 5:
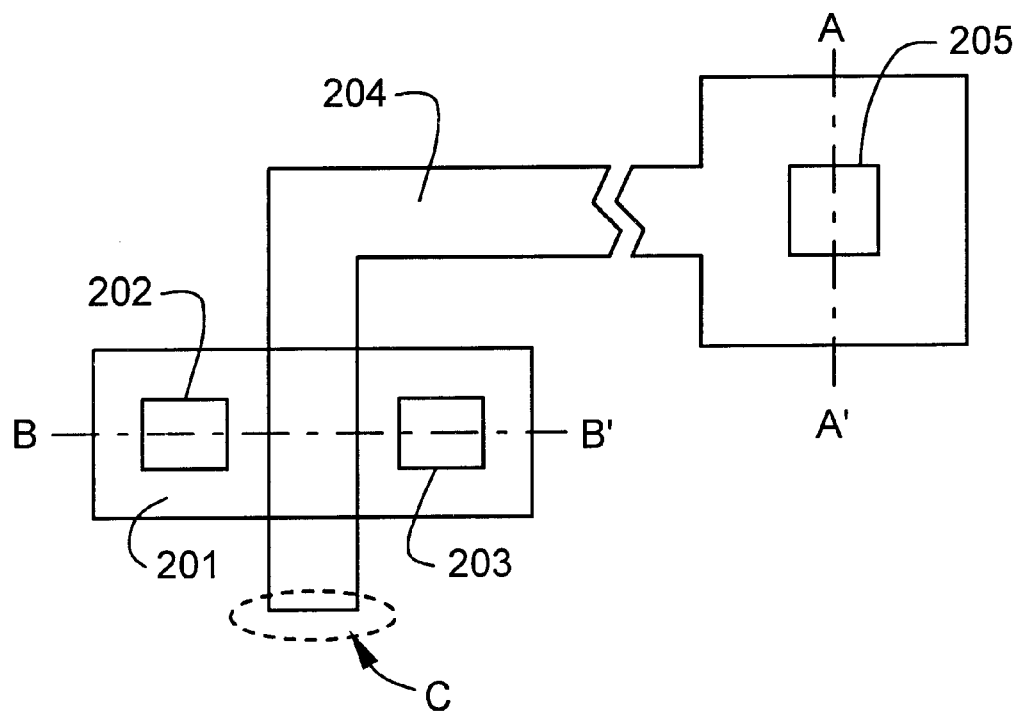
FIG. 5 is a schematic plan view of the TFT in Example 1.

This example is an embodiment in which the invention is applied to a TFT. This example will be described with reference to FIGS. 5 to 14. FIG. 5 is a schematic plan view of a TFT.

In FIG. 5, numeral 201 denotes an active layer of the TFT, 202 and 203 denote contact parts of the active layer 201 and a source electrode or a drain electrode (source/drain contact part), and 204 denotes gate wiring. A part at which the gate wiring 204 and the active layer 201 overlap each other is particularly called as a gate electrode. Numeral 205 denotes a contact part (gate contact part) of the gate wiring 204 and leading wiring (not shown in the figure).

Figure 6A:
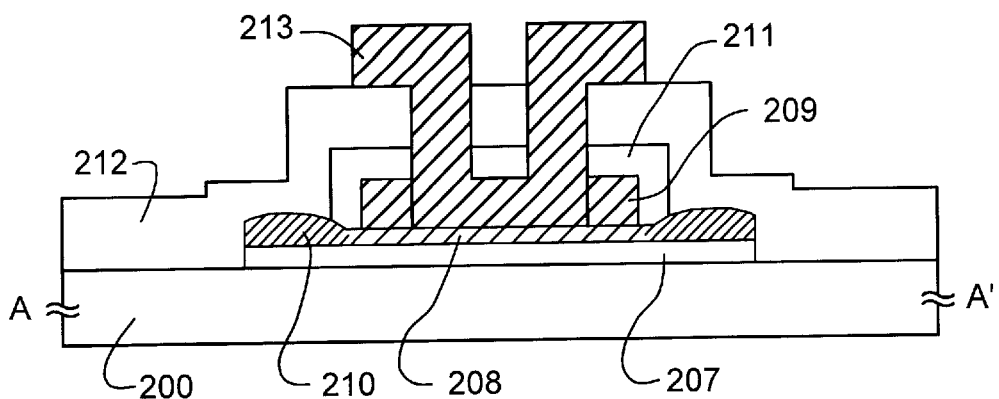
FIGS. 6A and 6B are cross sectional views of the gate contact part and the TFT in Example 1.

Important parts of FIGS. 6A, 6B and 7 will be described. FIG. 6A is a cross sectional view taken on line A–A' in FIG. 5. In FIG. 6A, numeral 200 denotes a substrate having an insulating surface, 207 denotes an insulating film comprising silicon oxide, having provided thereon gate wiring 204 comprising a laminated structure comprising a tantalum layer (Ta layer) 208 as a first wiring layer and an aluminum layer (Al layer) 209 as a second wiring layer.

Figure 6B:
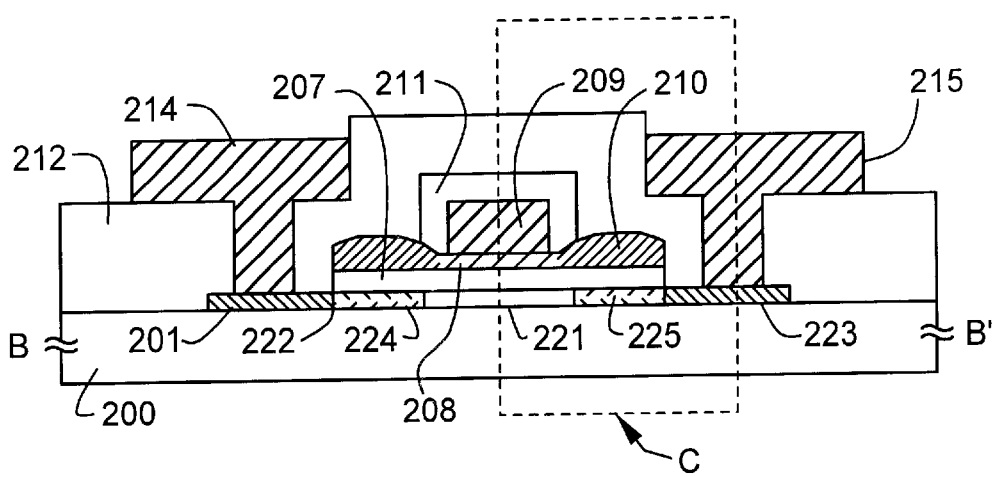

FIG. 6B is a cross sectional view taken on line B–B' in FIG. 5. FIG. 7 is a partial enlarged view of a region C in FIG. 6B. In FIG. 6B, numerals 214 and 215 denote source wiring and drain wiring, respectively, each comprising a conductive film, which are formed with the same material in the same layer as leading wiring 213 shown in FIG. 6A.

The tantalum layer 208 also functions as a blocking layer for preventing an outflow (diffusion) of a component substance of the aluminum layer 209 to the active layer 201 through the gate insulating film 207. It is considered that such diffusion of aluminum is caused by heating due to a heat treatment or static charge owing to mobility of an aluminum alloy, and such diffusion can be prevented by providing a valve metal layer under the aluminum film.

The production process of the TFT of this example will be described with reference to FIGS. 5A to 8F and 9A to 9D. In FIGS. 8A to 8F and 9A to 9D, and FIGS. 6A and 6B, the same symbols are attached to the same elements. A glass substrate having provided thereon an insulating film is prepared as a substrate 200 having an insulating surface. In addition to this substrate, a silicon substrate having formed thereon a heat oxidation film, a quartz substrate and a ceramic substrate having formed thereon a silicon oxide film can be used.

A semiconductor layer in an island form to be an active layer 201 is formed for each TFTs on the substrate 200. In FIGS. 8A to 8F, only one piece of the active layer 201 is shown. The active layer 201 is covered with an insulating film 207 comprising silicon oxide. (FIG. 8A)

In this example, the active layer 201 is formed with a polysilicon film formed by the technique described in JP-A-7-130652. The JP-A-7-130652 corresponds to a U.S. Pat. No. 5,643,826. An entire disclosure of the JP-A-7-130652 and the U.S. Pat. No. 5,643,826 is incorporated herein by reference. Any known method, such as a method using laser annealing, may be used as the formation method of the polysilicon film. A silicon germanium film represented by $Si_xGe_{1-x}$ ($0<x<1$) may also be used.

A tantalum film (Ta film) 231 having a thickness of 20 nm and an aluminum film (Al film) 232 containing 2% by weight of scandium having a thickness of 40 nm are formed by laminating on the substrate 200 in a sputtering apparatus. A probe of an anodic oxidation apparatus is in contact with the Al film 232, and a thin barrier type alumina film (not shown in the figure) is formed on the surface of the Al film 232. This anodic oxidation process is conducted for improving adhesion of a resist mask 233. The anodic oxidation is conducted by using an ethylene glycol solution containing 3% of tartaric acid as an electrolytic solution under the conditions of a solution temperature of 30° C., an ultimate voltage of 10 V, a voltage application time of 15 minutes and a supplied electric current of 10 mA per one substrate. A resist mask 233 is then formed. (FIG. 8B)

Figure 14:
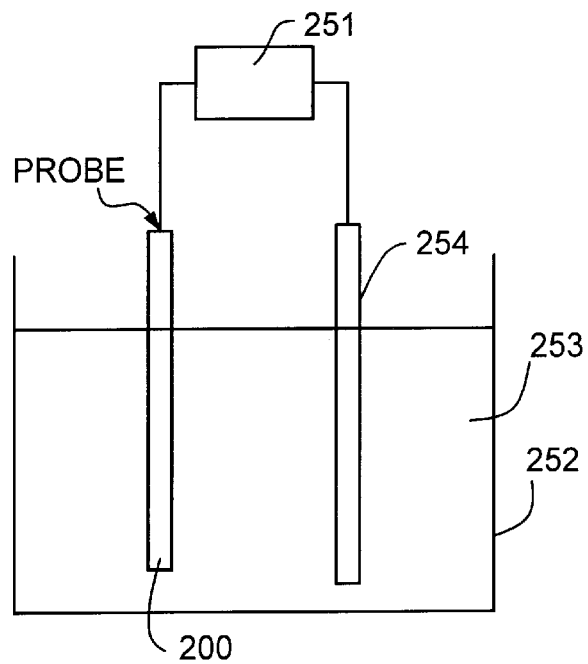
FIG. 14 is a schematic view of an anodic oxidation apparatus.

FIG. 14 is a schematic diagram of the anodic oxidation apparatus. The anodic oxidation apparatus comprises a power source 251, and an electrolytic solution bath 252 for retaining an electrolytic solution 253, and a cathode (platinum) 254 and the substrate 200 as an anode are connected to the power source 251. Both the substrate 200 and the cathode 254 are immersed in the electrolytic solution 253. On the substrate 200, the probe of the apparatus is in contact with the Al film 232.

The alumina film not shown in the figure is etched by using a chromic mixed acid, and then the aluminum film is etched by using an aluminum mixed acid, to form an aluminum layer (Al layer) 209 as a second wiring layer. The Al layer 209 constitutes an upper layer of the gate wiring 204. In FIGS. 8C to 8F, while the Al layer 209 is shown as divided into two pieces, the Al layer on the left-hand side 209 and the Al layer on the right-hand side 209, they are actually united as shown in FIG. 5. The Al layer on the left-hand side 209 finally functions as a gate electrode of the TFT with overlapping the active layer 201. The Al layer on the right-hand side 209 will be a contact part for contacting an outer terminal.

Figure 10A:
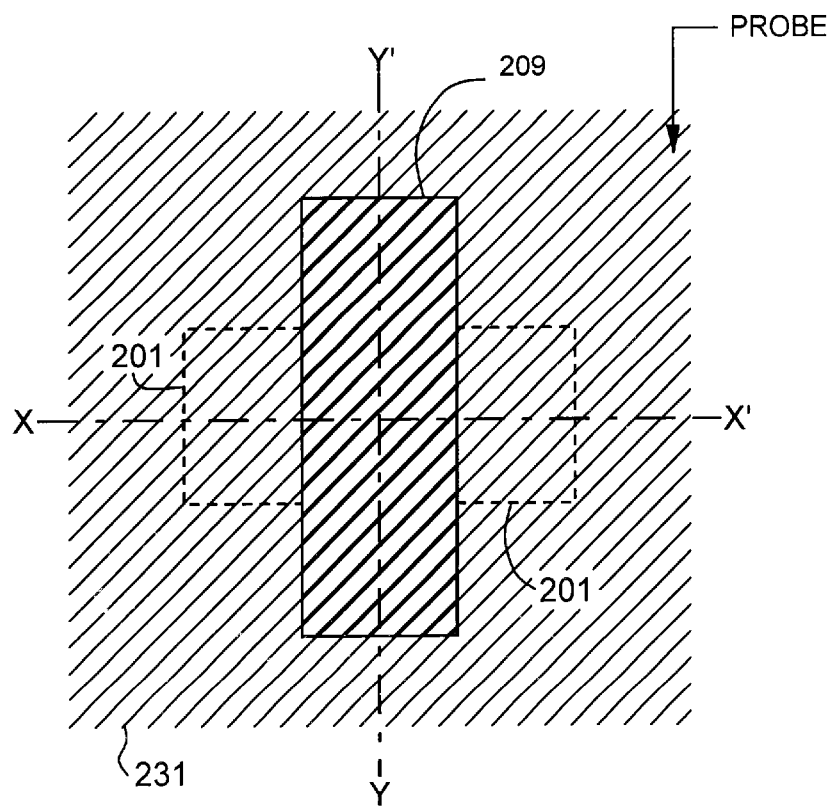
FIGS. 10A to 10C are a plan view and cross sectional views during the production process of the TFT in Example 1.
Figure 10B:
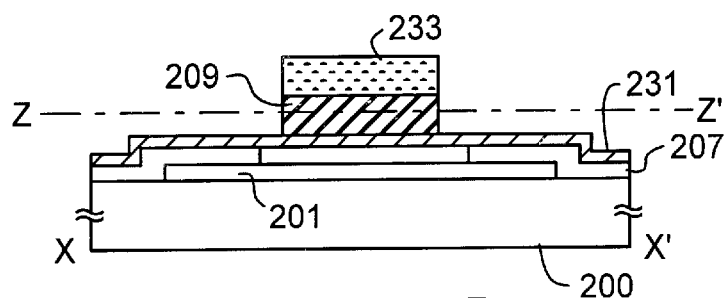
Figure 10C:
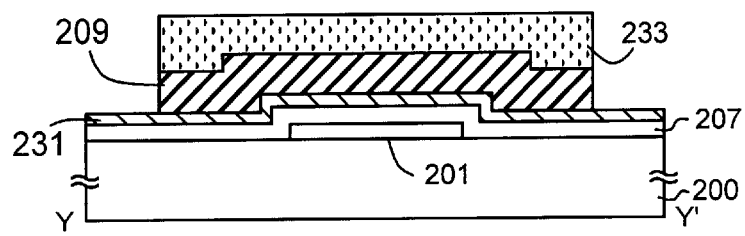

FIGS. 10A to 10C are cross sectional views and a plan view of the TFT in the stage of FIG. 8C. FIG. 10A is a plan view. FIG. 10B is a cross sectional view along the longitudinal direction of the channel of the TFT taken on line X–X' in FIG. 10A. FIG. 10C is a cross sectional view taken on line Y–Y' in FIG. 10A, which corresponds to a cross sectional view along the transverse direction of the channel. FIG. 10 A is a plan view taken on line Y–Y' in FIG. 10B. While the plan shape of the Al layer 209 is actually the similar to the gate wiring 204 in FIG. 5, it is simplified to a rectangle. The same simplification of the Al layer 209 is applied to FIGS. 10A to 10C and 11A to 11C.

Anodic oxidation is conducted by contacting the probe to the tantalum film 231 in the anodic oxidation apparatus with the resist mask 233 remaining. The anodic oxidation is conducted by using a 3% oxalic acid aqueous solution as an electrolytic solution under the conditions of an ultimate voltage of 8 V, a voltage application time of 40 minutes and a supplied electric current of 20 mA per one substrate. Under the anodic oxidation conditions, a porous anodic oxide film 234 (hereinafter referred to as a porous A.O. film 234) is formed on the side surface of the Al layer 209. The A.O. film 234 is a porous alumina film. (FIG. 8D)

After removing the resist mask 233, a voltage is again applied to the Ta film 231 in the anodic oxidation apparatus shown in FIG. 14 to conduct anodic oxidation. The anodic oxidation is conducted by using an ethylene glycol solution containing 3% of tartaric acid under the conditions of an electrolytic solution temperature of 10° C., an ultimate voltage of 80 V, a voltage application time of 30 minutes and a supplied electric current of 30 mA per one substrate.

Tartaric acid penetrates into the porous A.O. film 234, and the surface of the Al layer 209 is subjected to anodic oxidation, to form a barrier type anodic oxide film (referred to as a barrier A.O. film) 211. The barrier A.O. film 211 is a non-porous alumina film. With respect to the Ta film 231, an exposed part and a part on which the porous A.O. film 234 is present are subjected to anodic oxidation, and are modified to a tantalum oxide film (hereinafter referred to as $TaO_x$ film) 210. The remaining tantalum layer (Ta layer) 208 is fixed as a first wiring layer. While the $TaO_x$ film 210 becomes thicker than the Ta film 231, they are expressed by the same thickness in FIGS. 8E and 8F for simplification. (FIG. 8E)

Figure 11A:
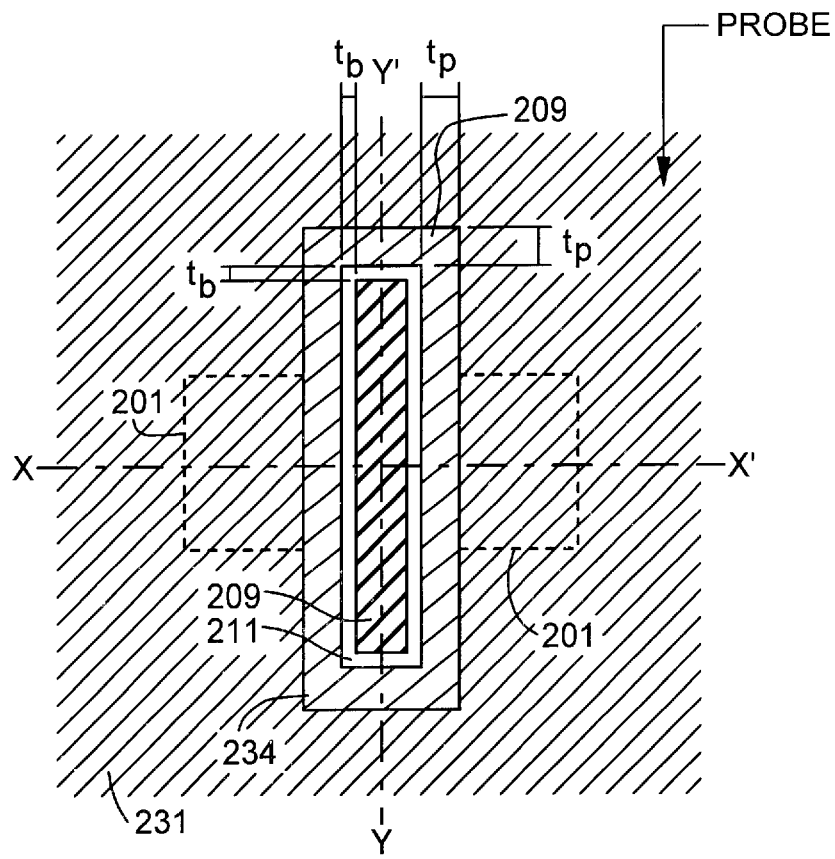
FIGS. 11A to 11C are a plan view and cross sectional views during the production process of the TFT in Example 1.
Figure 11B:
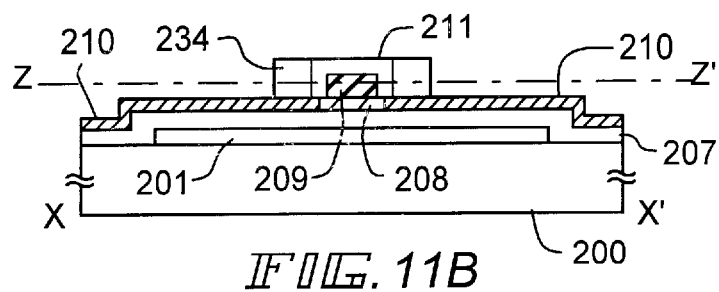
Figure 11C:
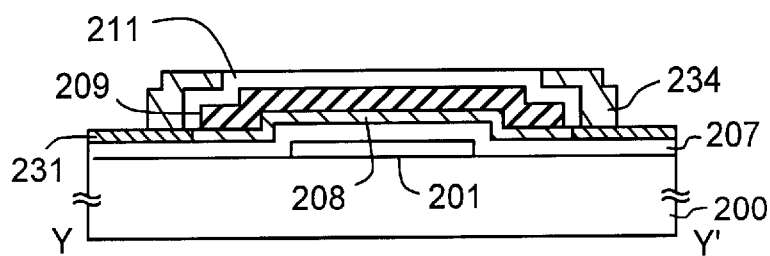

FIGS. 11A to 11C are cross sectional views and a plan view of the TFT in the stage of FIG. 8E. FIG. 11B is a cross sectional view along the longitudinal direction of the channel of the TFT taken on line X–X' in FIG. 11A. FIG. 11C is a cross sectional view taken on line Y–Y in FIG. 11A, which corresponds to a cross sectional view along the transverse direction of the channel of the TFT. FIG. 11A is a plan view taken on line Y–Y' in FIG. 11B. As shown in FIGS. 11A to 11C, the film thickness $T_p$ of the porous A.O. film 234 extending from the side surface of the barrier A.O. film 211 and the film thickness $t_b$ of the barrier A.O. film 211 become uniform in the circumference of the Al layer 209.

The $TaO_x$ film 210 and the insulating film 207 are etched by using the A.O. films 211 and 234 as a mask. The etching is conducted by a dry etching method using a $CHF_3$ gas. (FIG. 8F)

The porous A.O. film 234 is removed by etching using an aluminum mixed acid. The gate wiring 204 comprising the Ta layer 208 and Al layer 209 laminated to each other is completed by this step. (FIG. 9A)

The side surface of the gate wiring 204 has a structure of covered with the $TaO_x$ film 210 and the barrier A.O. film 211. The $TaO_x$ film 210 extends outside the side surface of the barrier A.O. film 211.

Figure 9A:
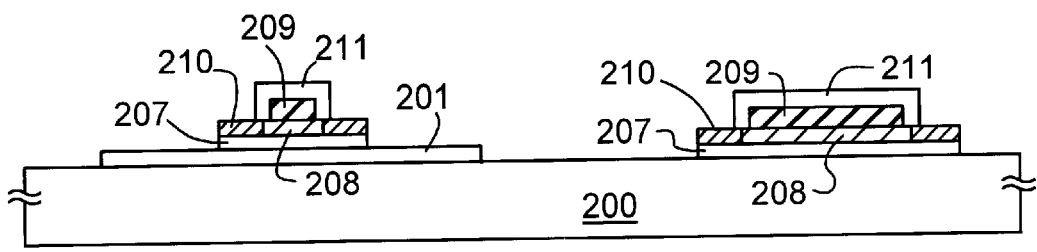
FIGS. 9A to 9D are cross sectional views showing the production process of the TFT in Example 1.
Figure 12A:
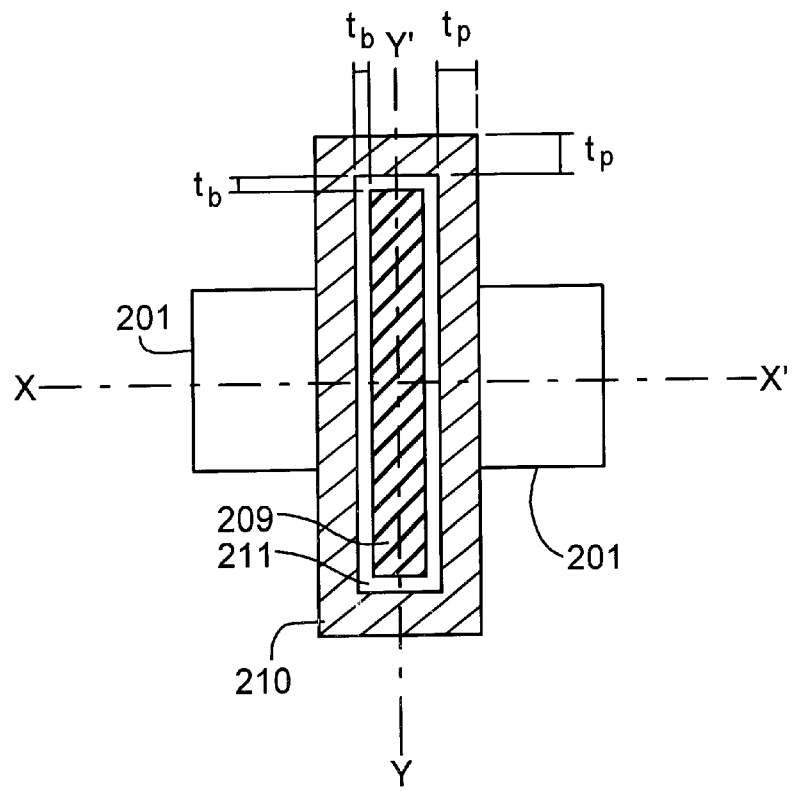
FIGS. 12A to 12C are a plan view and cross sectional views during the production process of the TFT in Example 1.
Figure 12B:
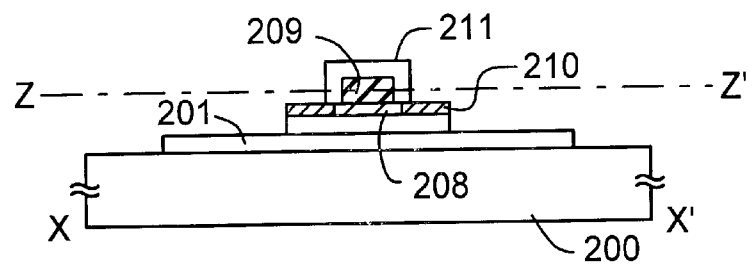
Figure 12C:
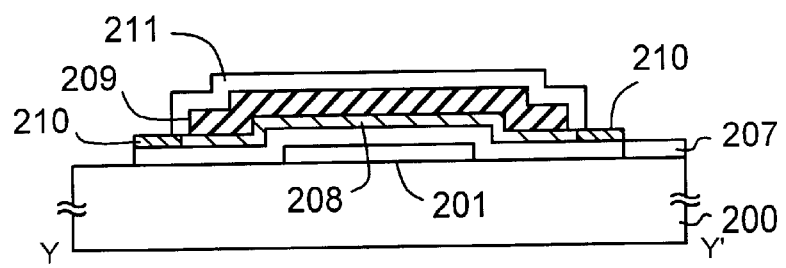

FIGS. 12A to 12C are cross sectional views and a plan view of the TFT in the stage of FIG. 9A. FIG. 12A is a plan view. FIG. 12B is a cross sectional view along the longitudinal direction of the channel of the TFT taken on line X–X' in FIG. 12A. FIG. 12C is a cross sectional view taken on line Y–Y' in FIG. 12A, which corresponds to a cross sectional view along the transverse direction of the channel. FIG. 12A is a plan view taken on line Z–Z' in FIG. 12B. AS shown in FIGS. 12A to 12C, the length of the $TaO_x$ film 210 extending from the side surface of the barrier A.O. film 211 corresponds to the film thickness $t_p$, all of which become uniform in the circumference of the Al layer 209.

Figure 7:
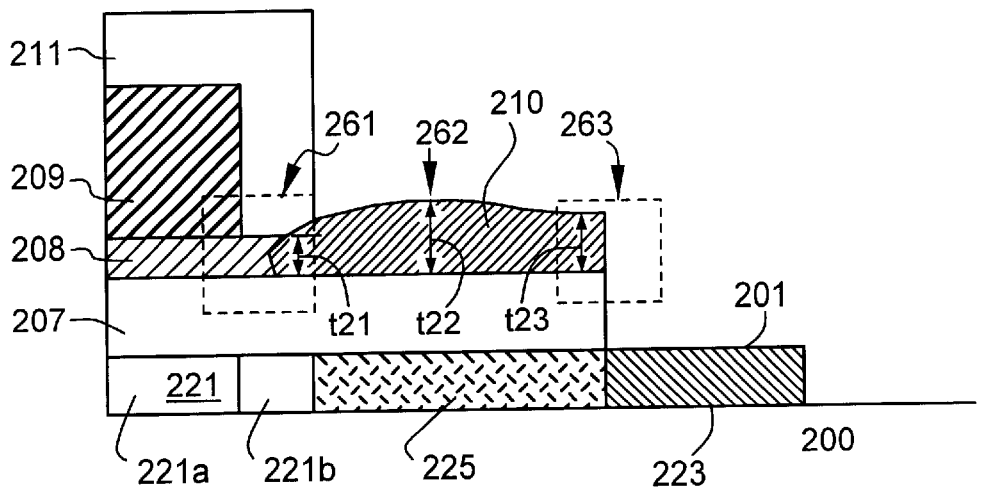
FIG. 7 is an enlarged view of FIG. 6B.

As described in the foregoing with reference to FIG. 7, at least on the active layer 201 or the gate insulating film in an island form, the film thickness $t_{21}$ of the $TaO_x$ film 210 is decreased toward the Ta film 208 in a region 261 under the A.O. film 210. The part of the $TaO_x$ film 210 extending outside the A.O. film 211 is a region having been present under the porous A.O. film 234. Therefore, in the outside of the A.O. film 211, the film thickness of the $TaO_x$ film is gradually increased toward the outside, and the film thickness $t_{22}$ becomes maximum at a part 262. The film thickness is gradually decreased from the part 262 toward the outside, and the film thickness $t_{23}$ becomes substantially constant in a region 263.

In this example, the interface between the Ta layer 208 and the $TaO_x$ layer 210 is present outside the interface between the Al layer 209 and the barrier A.O. layer 211, and therefore an effect of preventing the diffusion of Al from the Al layer 209 is extremely high as described above.

Because the $TaO_x$ film 210 and the barrier A.O. film 211 are formed in the same anodic oxidation process, the $TaO_x$ film 210 is formed to push up the barrier A.O. film 211. Therefore, the edge of the interface between the barrier A.O. film 211 and the Ta layer 208 is sealed with the $TaO_x$ film 210, and it is considered that the barrier A.O. film 211 is pushed on the Al layer 209. Therefore, the effect of preventing the diffusion of Al from the Al layer 209 is highly exhibited.

An impurity ion endowing one conductivity is added to the active layer 201. In order to produce an N-channel TFT, phosphorous or arsenic is added, and in order to produce a P-channel TFT, boron or gallium is added. The addition of the impurity ion can be conducted by using one of an ion implantation method, a plasma doping method and a laser doping method. In the case where a CMOS circuit is produced, different impurity ions are implanted to the different parts by using a resist mask.

This step is conducted by dividing into two steps using different acceleration voltages. In the first step, the acceleration voltage is set as high as about 80 kV, and in the second step, the acceleration voltage is set as low as about 30 kV. By using such different acceleration voltages, the impurity ion is added to the layer underlying the $TaO_x$ film 208 and the insulating film 207 in the first step, and in the second step, the $TaO_x$ film 210 and the insulating film 207 function as a mask, so that the impurity ion is not added to the underlying layer.

Figure 9B:
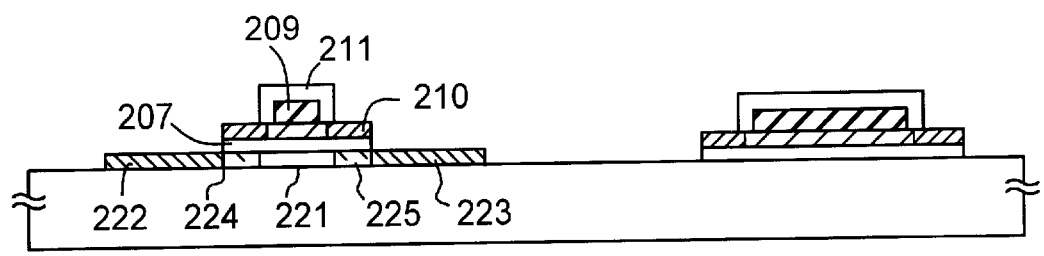

Through the addition step of the impurity ion, a channel forming region, a source region 222, a drain region 223 and a low concentration impurity regions (LDD regions) 224 and 225 of the TFT are formed in a self alignment manner. The region 221 is a region to which the impurity is not added, and is formed as a channel region and an offset region. The concentration of the impurity ion added to the respective impurity regions may be appropriately determined by a practician. (FIG. 7 and FIG. 9B)

With reference to FIG. 7, in the active layer 201, the drain region 223 (source region 222) is formed in the region, in which both the insulating film 207 and the $TaO_x$ film 210 are not present. The low concentration impurity region 225 (224) is present outside the A.O. film 211, and the insulating film 207 and the $TaO_x$ film 210 are formed in the region present in the upper part thereof. The channel forming region 221 is formed in the region, above which the barrier A.O. film 211 is present.

In the channel forming region 221, an effective channel forming region, to which an electric field is directly applied by the gate electrode, is a region 221a corresponding to the Ta layer 208. In a region 221b corresponding to the A.O. film 211 and the TaO$_x$ film 210 via the gate insulating film 207, the electric field applied by the gate electrode is small. Therefore, when the length of the region 221b is wide, it substantially functions as an offset region, and the actual channel forming region is only the region 221a.

Because the length of the region 221b corresponds to the length of the TaO$_x$ film 210 inserted under the A.O. film 211, the length is controlled in the anodic oxidation step shown in FIG. 8E. That is, it is determined by the film thickness of the barrier A.O. film 211.

However, when the length of the region 221b is small, the impurity is penetrated into the region 221b to function as a low concentration impurity region. When the thickness of the barrier A.O. film is about 200 nm or more, it functions as a mask on doping, and the region 221b can function as the offset region.

In the case where the region 221b functions as the offset region, there arises a problem of decreasing an on-current. Therefore, in a TFT having a driving voltage of the gate electrode of about from 10 to 50 V, the region 221b is used as the offset region, and the decrease of the off-current takes priority. On the other hand, when the driving voltage is about from 1.5 to 5 V, the length of the region 221b is made small to use the region as the low concentration impurity region or the lightly doped drain region (LDD region), and the increase of the on-current takes priority.

Because the low concentration impurity regions (LDD regions) 224 and 225 are formed by adding the impurity through the insulating film 207 and the TaO$_x$ film 210, the throughput is decreased when the TaO$_x$ film 210 is too thick. Furthermore, there may be the case where the impurity concentration of the low concentration impurity regions (LDD regions) 224 and 225 becomes too small, and the desired resistance value cannot be obtained.

Because the insulating film 207 has a thickness of about from 50 to 100 nm, the thickness of the TaO$_x$ film 210 is 100 nm at the thickest. Because the thickness of the Ta film 231 is increased by about 2 times to 4 times on oxidation, it is preferred that the thickness of the initial Ta film 231 is 50 nm or less.

After completion of the addition step of the impurity ion, a heat treatment is conducted by using furnace annealing, lamp annealing, laser annealing or a combination thereof, to conduct activation of the impurity ion added. In the case where a tantalum layer remains in the tantalum oxide layer 210 extending from the side surface of the alumina film 211, it is disadvantageous as a voltage is applied to the low concentration impurity regions 224 and 225 by the gate wiring. Therefore, after completing the addition step, it is preferred that heat oxidation is conducted at a temperature of about from 400 to 600° C. to oxidize the remaining tantalum layer.

An interlayer insulating film 212 having a thickness of 1 μm comprising a silicon oxide is then formed. Contact holes are formed by patterning the interlayer insulating film 212. The formation of the contact holes 236, 237 and 238 is conducted by the following manner.

The interlayer insulating film 212 is etched by using an etchant (LAL500 produced by Hashimoto Kasei, Co., Ltd.). The etchant LAL500 is formed by adding several percent of a surface active agent to a buffered hydrofluoric acid formed by mixing ammonium fluoride, hydrofluoric acid and water. Other species of buffered hydrofluoric acid may be used.

The buffered hydrofluoric acid used herein is preferably one that can etch a silicon oxide film at a relatively high rate. Since the interlayer insulating film 212 is as thick as 1 μm, the higher etching rate brings about increase in throughput.

After the etching of the interlayer insulating film 212, the source region and the drain region 222, 223 are exposed in the TFT part, and the contact holes 236 and 237 are completed. In the gate contact part, the barrier A.O. film 211 is exposed. Etching is then continued by using a diluted buffered hydrofluoric acid formed by mixing ammonium fluoride, hydrofluoric acid and water at a ratio of 2/3/150 (volume ratio).

A silicon film, i.e., the source region and the drain region 222, 223, is substantially not etched by the diluted buffered hydrofluoric acid. However, the barrier A.O. film 211 in the gate contact part is etched, and the underlying Al layer 209 is also etched. Finally, the etching is terminated at the time at which the etching reaches the Ta layer 208, and the contact hole 238 is formed. (FIG. 9C)

Figure 9C:
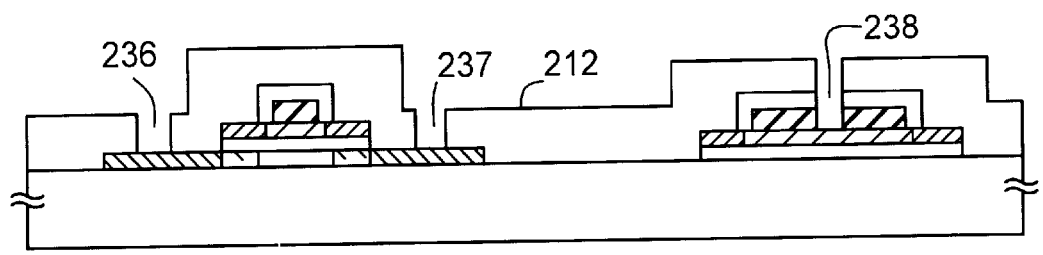
Figure 9D:
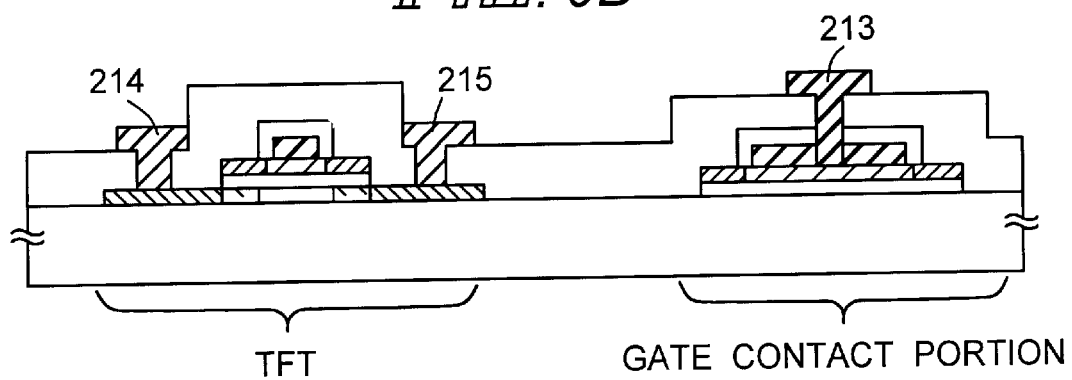

After obtaining the state of FIG. 9C, the source wiring 214 and the drain wiring 215 comprising a conductive film are formed, and the leading wiring 213 electrically connected to the gate wiring 204 is formed with the same material. (FIG. 9D)

In this example, as the conductive film constituting the source wiring 214, the drain wiring 215 and the leading wiring 213, wiring having a three-layer structure comprising titanium, aluminum alloy and titanium is employed. By using such wiring, wiring having low resistance can be realized with protecting the aluminum film having high reactivity with titanium. The conductive film that can be applied to this example is not limited thereto.

In the constitution of this example, because the Ta layer 208 functions as an etching stopper on forming the contact hole 238, the controllability and margin of the process is greatly improved.

That is, the contact failure, such as over-etching, which has been a problem in the conventional technique, can be prevented. Furthermore, a buffered hydrofluoric acid can be used instead of an etchant that is difficult to be industrially handled, such as the chromic mixed acid, which results in an economic advantage.

Figure 13:
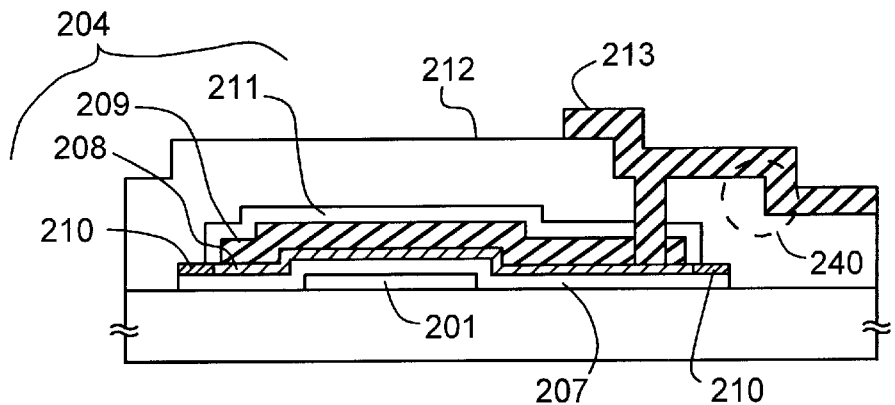
FIG. 13 is a cross sectional view during the production process of the TFT in Example 1.

FIG. 13 is a cross sectional view obtained by cutting the active layer in FIG. 9D in the transverse direction of the channel (in the direction perpendicular to the channel length). In FIG. 13, the cross section of the gate contact part is simultaneously indicated.

In the conventional multi-layer wiring, a step is formed on the surface of the interlayer insulating film 212 corresponding to the underlying structure. The wiring 213 is formed on such a part having a step, and separation of the wiring at the stop part has been a problem. In particular, separation of the wiring frequently has occurred at the step between the gate wiring and the gate insulating film.

In this example, because the TaO$_x$ film 210 is formed in the circumference of the surface of the gate insulating film 207, the difference in height between the gate wiring 204 and the gate insulating film 207 is relaxed, and the wiring 213 is difficult to be separated particularly by a step 240 between the gate wiring and the gate insulating film.

EXAMPLE 2

In Example 1, the embodiment has been described, in which the tantalum layer (Ta layer) 208 is used as an etching stopper on forming the contact hole 238 as shown in FIG. 9C. In this example, an embodiment, in which a tantalum nitride layer (hereinafter expressed as a Ta$_y$N layer) is used as an etching stopper, will be described. The term Ta$_y$N used herein means tantalum containing nitrogen, the composition of which is Ta$_y$N (y>1).

The Ta layer in Example 1 has not only the function of an etching stopper as shown in FIG. 9C, but also the function of preventing contact failure between the gate wiring and the leading wiring as shown in FIG. 9D. This is because a good ohmic contact can be obtained between the leading wiring 213 and the Ta layer 208, which is a part of the gate wiring. It has been confirmed that by changing the Ta layer to a Ta$_y$N layer, a better ohmic contact can be obtained.

It is considered that the reason why the Ta$_y$N layer can provide the better ohmic contact is that because the Ta$_y$N layer having y of less than 1 has a sufficient resistance to obtain a contact, and the Ta$_y$N layer is difficult to suffer spontaneous oxidation in comparison to the Ta layer, a spontaneous oxide layer is not formed on the surface of the Ta$_y$N layer on forming the contact hole.

It is also considered that the reason why the Ta$_y$N layer can provide the better ohmic contact is that Ta$_y$N can have a stable crystalline structure of low resistance in comparison to Ta. As the crystalline structure of Ta, a cubic system (alpha-Ta) which is stable and has low resistance, and a tetragonal system (beta-Ta) which is metastable and has high resistance are known. In general, when the temperature is room temperature and the film thickness is 1 µm or less, beta-Ta is predominantly grown, and the stable alpha-Ta having low resistance is not grown. Various investigations have been made to grow alpha-Ta, one of which is addition of nitrogen on the film formation of a Ta film. The thus resulting Ta$_y$N is stable as being a cubic system, and thus it is known that the crystalline structure thereof is highly similar to alpha-Ta.

The production process of the TFT of this example is the same as the production process in Example 1 shown in FIGS. 8A to 8F and 9A to 9D, except that the Ta film 231 in FIG. 8B is changed to a Ta$_y$N film. An example of the film formation condition of the Ta$_y$N film will be described below, but the invention is not limited to the film formation condition. The formation of the Ta$_y$N film is conducted by using Ta as a target under the conditions in that the back pressure is 4.0×10$^{-4}$ Pa, the sputtering pressure is 4.0×10$^{-1}$ Pa, the sputtering electric current is 4 A, the pre-sputtering time is 5 minutes, the argon gas flow rate is 50 sccm, and the nitrogen gas flow rate is 2 sccm, to form a Ta$_y$N film having a film thickness of 20 nm. The resistivity of the Ta$_y$N film having a film thickness of 200 nm formed under the same conditions as in this example is from 30 to 50 µΩcm, the sheet resistance calculated from the resistivity is from 15 to 25 Ω per square when the thickness thereof is 20 nm. The value of the resistivity can be controlled by changing the flow rate of the nitrogen gas, and can be appropriately set by a practician. It is preferred that the film thickness of the Ta N film is selected from the range of from 1 to 50 nm (preferably from 5 to 30 nm, and more preferably from 5 to 20 nm), but the invention is not limited thereto.

Because an oxide film of the Ta$_y$N is formed in the similar process as the oxide film of Ta, the TFT of this example has an oxide film of Ta$_y$N having the similar characteristics as the oxide film of Ta in Example 1. Therefore, by using the Ta$_y$N film, a TFT having the same characteristics as the case using the Ta film as in Example 1 can be obtained, for example, one having an extremely high effect of preventing the diffusion of Al, and requiring no voltage supplying line for anodic oxidation.

The semiconductor device of this example will be described with reference to FIG. 7, but the invention is not limited to FIG. 7.

The semiconductor device of this example is, as shown in FIG. 7, a semiconductor device comprising wiring having a laminated structure comprising a Ta$_y$N layer 208 having laminated thereon an Al layer 209, in which the wiring comprises an oxide film 210 of the Ta$_y$N film formed in contact with a side surface of the Ta$_y$N layer 208, and an oxide film 211 of the Al layer formed in contact with a side surface of the Al layer 209.

In this example, the side surface of the Ta$_y$N layer is an interface between the Ta$_y$N layer 208 and the oxide film 210 of Ta$_y$N in a region 261, and the side surface of the Al layer is an interface between the Al layer 209 and the oxide film 211 of Al in the region 261.

The semiconductor device of this example is, as shown in FIG. 7, a semiconductor device comprising wiring having a laminated structure comprising a Ta$_y$N layer 208 having laminated thereon an Al layer 209, in which the wiring comprises an oxide film 210 of Ta$_y$N formed by oxidizing the Ta$_y$N layer, and an oxide film 211 of Al formed by oxidizing the Al layer; a lower part of the Al layer 209 is in contact with only the Ta$_y$N layer 208; and a lower part of the oxide film 211 of Al is in contact with the Ta$_y$N layer 208 and the oxide film 210 of Ta$_y$N.

In this example, the lower part of the oxide film of Al means a part, at which the oxide film 211 of Al is in contact with the Ta$_y$N layer 208 and the oxide film 210 of Ta$_y$N in the region 261.

The semiconductor device of this example is, as shown in FIG. 7, a semiconductor device comprising wiring having a laminated structure comprising a Ta$_y$N layer 208 having laminated thereon an Al layer 209, in which the wiring comprises an oxide film 210 of Ta$_y$N formed by oxidizing the Ta$_y$N layer, and an oxide film 211 of Al formed by oxidizing the Al layer; and an interface between the Al layer 209 and the oxide film 211 of Al is present inside an interface between the Ta$_y$N layer 208 and the oxide film 210 of Ta$_y$N.

In this example, the interface between the Al layer and the oxide film of Al means the interface between the Al layer 209 and the oxide film 210 of Al in the region 261, and the interface between Ta$_y$N layer and the oxide film of Ta$_y$N means the interface between the Ta$_y$N layer 208 and the oxide film 210 of Ta$_y$N in the region 261.

In the semiconductor device of this example, as shown in FIG. 7, the film thickness of the oxide film 210 of Ta$_y$N present under the oxide film 211 of Al is gradually increased toward the outside.

In this example, the outside is determined by the direction from the Ta$_y$N layer 208 toward the oxide film 210 of Ta$_y$N.

In the semiconductor device of this example, as shown in FIG. 7, the oxide film 210 of Ta$_y$N extends outside the side surface of the oxide film 211 of Al.

In the semiconductor device of this example, as shown in FIG. 7, the oxide film 210 of Ta$_y$N extends outside the side surface of the oxide film 211 of Al, and the thickness of the oxide film 210 of Ta$_y$N under the oxide film 211 of Al (for example, t$_{21}$) is different from that outside the side surface of the oxide film 211 of Al (for example, t$_{22}$).

In the semiconductor device of this example, as shown in FIG. 7, the oxide film 210 of Ta$_y$N extends outside the side surface of the oxide film 211 of Al, and the oxide film 210 of $Ta_yN$ has a part 262, at which the thickness thereof becomes maximum, outside the side surface of the oxide film 211 of Al.

In the semiconductor device of this example, as shown in FIG. 7, the oxide film 210 of $Ta_yN$ has a region 263, in which the thickness thereof becomes substantially constant, outside the part 262, at which the thickness thereof becomes maximum.

In the semiconductor device of this example, as shown in FIG. 7, the oxide film 210 of $Ta_yN$ extends outside the side surface of the oxide film 211 of Al; the wiring having a laminated structure comprising the $Ta_yN$ layer 208 having laminated thereon the Al layer 209 overlaps an active layer of at least one of an insulating gate type transistor; and on one of the active layer, the oxide film 210 of $Ta_yN$ has a part 262, at which the thickness thereof becomes maximum, outside the side surface of the oxide film 211 of Al.

In the semiconductor device of this example, as shown in FIG. 7, the oxide film 210 of $Ta_yN$ extends outside the side surface of the oxide film 211 of Al; the wiring having a laminated structure comprising the $Ta_yN$ layer 208 having laminated thereon the Al layer 209 overlaps an active layer of at least one of an insulating gate type transistor; and on one of the active layer, the oxide film 210 of $Ta_yN$ has a part 262, at which the thickness thereof becomes maximum, outside the side surface of the oxide film 211 of Al, and a region 263, in which the thickness thereof becomes substantially constant, outside the part, at which the thickness thereof becomes maximum.

In the semiconductor device of this example, as shown in FIG. 7, the thickness of the oxide film of $Ta_yN$ at the part 262, at which the thickness becomes maximum, is 2 times to 4 times the thickness of the $Ta_yN$ layer 208.

In the semiconductor device of this example, as shown in FIG. 7, the thickness of the oxide film of $Ta_yN$ in the region 263, in which the thickness becomes substantially constant, is 2 times to 4 times the thickness of the $Ta_yN$ layer 208.

In the semiconductor device of this example, as shown in FIG. 7, the wiring having a laminated structure comprising a $Ta_yN$ layer 208 having laminated thereon an Al layer 209 is formed on the insulating film 207 in the form of an island form, and the side surface of the oxide film 210 of $Ta_yN$ substantially agrees with the side surface of the insulating film 207 in the form of an island form.

The semiconductor device of this example is, as shown in FIG. 7, a semiconductor device comprising plural insulating gate type transistors each having a laminated structure comprising a $Ta_yN$ layer 208 having laminated thereon an Al layer 209, in which the gate wiring comprises an oxide film 210 of $Ta_yN$ formed by oxidizing the $Ta_yN$ layer, and an oxide film 211 of Al formed by oxidizing the Al layer; the oxide film 210 of $Ta_yN$ extends outside the side surface of the oxide film 211 of Al; and the interface between the Al layer 209 and the oxide film 211 of Al is present inside the interface between the $Ta_yN$ layer 209 and the oxide film 210 of $Ta_yN$.

In the semiconductor device of this example, as shown in FIG. 7, in one active layer of a transistor, a low concentration impurity region 225 is formed in a region, in which only the oxide film 210 of $Ta_yN$ is present above the active layer via the gate insulating film 207.

In the semiconductor device of this example, as shown in FIG. 12C, the gate wiring overlaps at least one active layer of a transistor, and the oxide film 210 of $Ta_yN$ extends outside the oxide film 211 of Al in the transverse direction of the channel with respect to the active layer.

The semiconductor device of this example is, as shown in FIG. 6A, a semiconductor device containing a contact structure comprising gate wiring having a laminated structure comprising a $Ta_yN$ layer 208 having laminated thereon an Al layer 209, leading wiring 213 formed as an upper layer above the gate wiring via an insulating film, and a contact hole for contacting the gate wiring and the leading wiring 213, in which the gate wiring comprises an oxide film 210 of $Ta_yN$ formed by oxidizing the $Ta_yN$ layer, and an oxide film 211 of Al formed by oxidizing the Al layer; the contact hole is formed through the Al layer 209; and the leading wiring 213 is in contact with the $Ta_yN$ layer 208 in the contact hole.

In the semiconductor device of this example, the oxide film of $Ta_yN$ is formed by subjecting the $Ta_yN$ layer to anodic oxidation, and the oxide film of Al is formed by subjecting the Al layer to anodic oxidation.

In the semiconductor device of this example, the anodic oxidation rate of the $Ta_yN$ layer and that of the Al layer are different from each other.

In the semiconductor device of this example, the oxide film 210 of $Ta_yN$ and the oxide film 211 of Al are formed by the same anodic oxidation process.

In the semiconductor device of this example, the $Ta_yN$ layer has a film thickness of from 1 to 50 nm.

In the semiconductor device of this example, the Al layer comprises aluminum or a material mainly comprising aluminum.

In the semiconductor device of this example, the tantalum nitride layer is a tantalum layer containing nitrogen.

In the semiconductor device of this example, the tantalum nitride layer has a composition of $Ta_yN$ (y>1).

The semiconductor device of this example is one of a display device, an image sensor, an operation integrated circuit and a high frequency module.

The semiconductor device of this example is one of a video camera, a still camera, a projection display, a projection television set, a head-mounted display, a car navigation system, a personal computer and a portable information terminal, which have the display device.

While the single layer of the $Ta_yN$ layer is used as an etching stopper in this example, the same effect can be obtained by using a laminated layer of a $Ta_yN$ layer and Ta layer. Accordingly, laminated structures of $Ta_yN$ and Ta layers, Ta and $Ta_yN$ layers and Ta, $Ta_yN$ and Ta layers may be used.

According to the constitution of this example, the diffusion of the material constituting the gate electrode and the gate wiring can be prevented. Because the wiring can be subjected to anodic oxidation without forming the voltage supplying wiring for anodic oxidation, the circuit design can be conducted without considering the space for providing the voltage supplying wiring and the etching margin for separating the voltage supplying wiring. Therefore, high integration of the circuit and miniaturization of the area of the substrate are accelerated.

Furthermore, a good ohmic contact can be obtained between the gate wiring and the leading wiring. A contact failure such as over-etching can be prevented. An etchant that is difficult to be industrially handled, such as the chromic mixed acid, is not necessary, but a buffered hydrofluoric acid, which is easily managed, can be used, and therefore it is economically advantageous.

EXAMPLE 3

The constitution of the invention can be applied not only to a TFT but also to a MOSFET formed by using a silicon substrate. An embodiment, in which the invention is applied to a MOSFET, is shown in FIG. 15.

Figure 15:
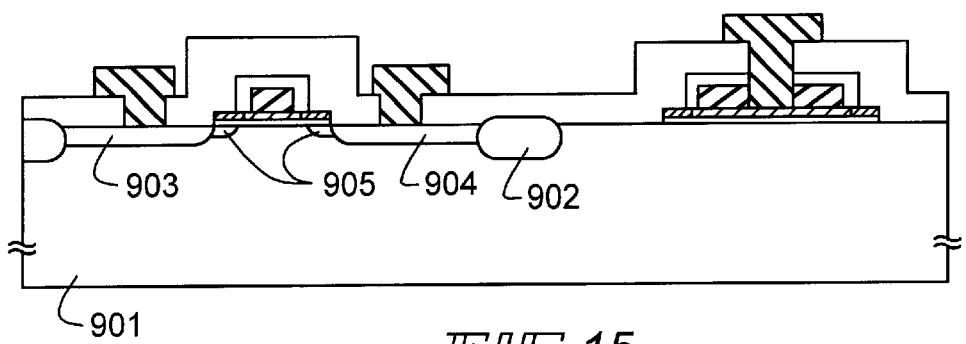
FIG. 15 is a cross sectional view of the MOS type transistor in Example 3.

In FIG. 15, numeral 901 denotes a silicon substrate, 902 denotes a field oxide film, 903 denotes a source region, 904 denotes a drain region, and 905 denotes a pair of LDD regions. The structure other than the above is the same as in Example 1, and descriptions thereof are omitted. A structure, in which the MOSFET is manufactured inside a well structure, may be employed.

The invention can be applied to both a TFT and a MOSFET as described above. Furthermore, it is effective to apply the invention not only to a semiconductor device, such as a TFT and a MOSFET, but also to the case in which an electric contact is needed between aluminum wiring protected with an anodic oxide film and a conductive film formed on a different layer from the aluminum wiring.

EXAMPLE 4

A production process of a TFT utilizing the invention will be described with reference to FIGS. 16A to 16F. In this example, an embodiment is exemplified, in which an N-channel TFT 1450 and a P-channel TFT 1550 are formed on one substrate to produce a CMOS circuit. The steps from the formation of a gate electrode to the formation of a source region and a drain region are substantially the same as in Example 1.

A glass substrate (Corning 1737, strain point: 667 C) is prepared as a substrate 1400, and a silicon oxide film having a thickness of 200 nm is formed on the surface thereof as an underlayer not shown in the figure. A polycrystalline silicon film (polysilicon film) is formed by using the crystallization technique described in the JP-A-6-232059. An amorphous silicon film 1401 having a thickness of 45 nm is formed by a reduced pressure CVD method. The thickness of the amorphous silicon film is from 10 to 100 nm (preferably from 15 to 75 nm, and more preferably from 20 to 45 nm). A nickel acetate solution 1402 is then coated on the surface of the amorphous silicon film 1401.

Figure 16A:
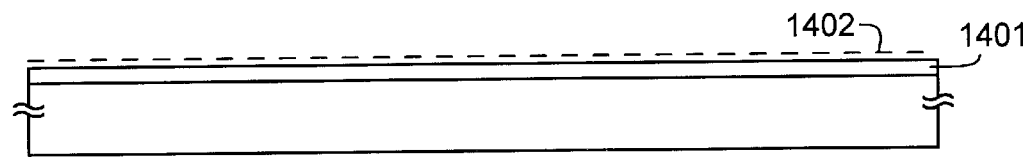
FIGS. 16A to 16F are cross sectional views of the active matrix substrate in Example 4.

By heating the substrate in this stage at 550° C. for 6 hours, the amorphous silicon film 1401 is crystallized with Ni as nuclei, to be modified to a polycrystalline silicon film. The polycrystalline silicon film is patterned to form an active layer 1403 of an N-channel TFT and an active layer 1503 of a P-channel TFT. Thereafter, the structure shown in FIG. 16A is obtained according to the process described in Example 1.

Figure 16B:
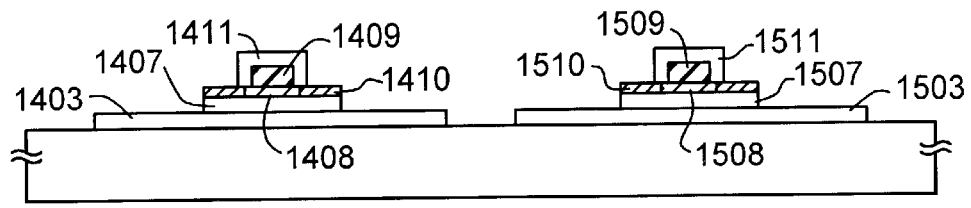

The structure shown in FIG. 16B corresponds to the structure shown in FIG. 9A. Numerals 1407 and 1507 denote gate insulating films, 1408 and 1508 denote tantalum layers, 1409 and 1509 denote aluminum layers, 1410 and 1510 denote tantalum oxide layers, and 1411 and 1511 denote alumina layers. (FIG. 16B)

After obtaining the state of FIG. 16B, a phosphorous ion is added to the active layers 1403 and 1503 by a plasma doping method. Phosphine diluted to 5% with hydrogen is used as a doping gas. The acceleration voltage is as high as from 60 to 90 kV. The dose amount is from $1\times10^{13}$ to $8\times10^{15}$ atoms/cm$^3$. Because the acceleration voltage in this step is high, the impurity ion is implanted through the tantalum oxide layers 1410 and 1510 and the gate insulating films 1407 and 1507. The second phosphorous ion implantation step is then conducted with a low acceleration voltage of from 5 to 10 kV. Because the acceleration voltage in this step is low, the gate insulating films 1407 and 1507 completely function as a mask. The masking effect is larger than the technique described in JP-A-7-135318 since the tantalum oxide films are present. The JP-A-7-135318 corresponds to a U.S. Pat. No. 5,648,277. An entire disclosure of the JP-A-7-135318 and the U.S. Pat. No. 5,648,277 is incorporated herein by reference.

Figure 16C:
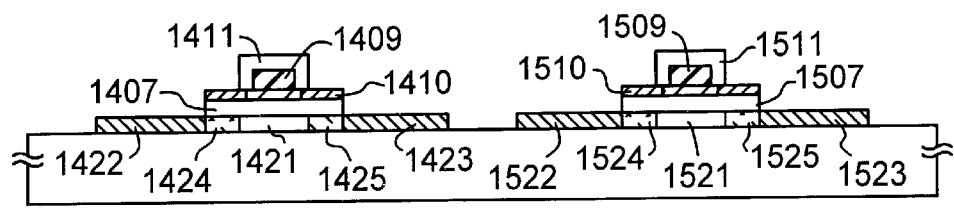

In this example, the conditions are adjusted to add phosphorous to N+ type regions 1422, 1423, 1522 and 1523 in a concentration of from $1\times10^{20}$ to $8\times10^{21}$ atoms/cm$^3$. The conditions are adjusted to add phosphorous to N- type regions 1424, 1425, 1524 and 1525 in a concentration of from $1\times10^{16}$ to $1\times10^{17}$ atoms/cm$^3$. In the N-channel TFT 1450, the N+ type regions 1422 and 1423 are a source region and a drain region, and N- type regions 1424 and 1425 are low concentration impurity regions. (FIG. 16C)

The N-channel TFT 1450 is covered with a resist mask 1430, and boron is added to the active layer 1503 to form a P+ type regions 1533 and 1532 and a P-type regions 1534 and 1535. Diborane diluted to 5% with hydrogen is used as a doping gas. The dose amount is adjusted in such a manner that when a difference of the maximum value of the boron ion concentration in these regions from the maximum value of the phosphorous ion concentration in these regions is calculated, the concentration of a boron ion is from $3\times10^{19}$ to $3\times10^{21}$ atoms/cm$^3$. (FIG. 16D) The P+ type regions 1533 and 1532 are a source region and a drain region, and P- regions 1534 and 1535 are low concentration impurity regions. The regions 1421 and 1531, to which a phosphorous ion and a boron ion are not implanted, are intrinsic or substantially intrinsic channel forming regions, which will be a migration path of a carrier in a later stage.

The term intrinsic used herein means a completely neutral region in which an electron and a hole are completely balanced, and the substantially intrinsic region means a region containing an impurity endowing an N-type or an P-type in such a concentration in that threshold control can be conducted ($1\times10^{15}$ to $1\times10^{17}$ atoms/cm$^3$), or a region in which the conductivity is offset by intentionally adding an impurity endowing the reverse conductivity.

After forming the source and drain regions as described above, a heat treatment is conducted in an inert gas atmosphere. In the conventional embodiment (single layer of an aluminum material), only a heat treatment of a short period of time at about 450° C. can be conducted due to the low heat resistance of an aluminum material. Furthermore, in the conventional embodiment, even though the heat treatment at about 450° C. is conducted, there is a large possibility that an aluminum atom is diffused into the gate insulating film and the active layer, to bring about deterioration and fluctuation of the TFT characteristics.

Figure 16D:
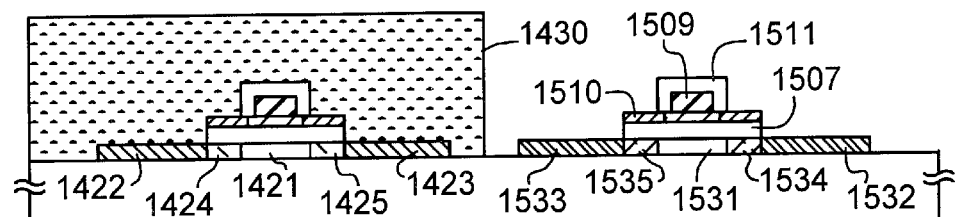

In this example on the other hand, because the tantalum layers 1408 and 1508 provided under the aluminum layers 1409 and 1509 are used as a blocking layer for an aluminum atom, a heat treatment for a long period of time at a temperature of 450 ° or more, preferably from 500 to 650° C., can be conducted. In this example, a heat treatment in a nitrogen atmosphere at 550° C. for 2 hours is conducted. (FIG. 16D)

Figure 16E:
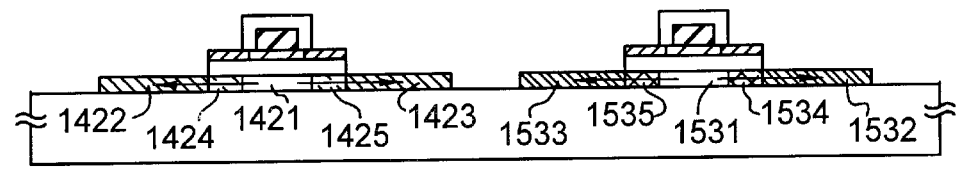

Through the heat treatment step, Ni present in the channel forming regions 1431 and 1521 is diffused to the source/drain regions 1422, 1423, 1532 and 1533 as schematically indicated by the arrows shown in FIG. 16E. This is because the regions contain a phosphorous element in a high concentration, and Ni reaching the source and drain regions is trapped therein. As a result, the Ni concentrations of the channel forming regions 1522 and 1532 and the low concentration impurity regions 1424, 1425, 1534 and 1535 can be decreased.

In particular, the region, to which both phosphorous and boron are added, and the boron concentration is 1.3 to 2 times the phosphorous concentration, such as the source and drain regions 1532 and 1533 of the P-channel TFT 1550, is high in gettering performance in comparison to the source and drain regions 1422 and 1423 of the N-channel TFT 1450, to which only phosphorous is added.

Furthermore, in the heat treatment step, recovery of the crystallinity of the regions 1422, 1423, 1522 and 1523 proceeds, the crystallinity of which is damaged by the accelerated implantation of the impurity ion. This is closely related to the fact that a nickel element is concentrated to the regions 1422, 1423, 1522 and 1523. That is, in the regions 1522 and 1523, in which an nickel element is concentrated, crystallization due to the function of the nickel element is strongly accelerated, and damages formed on doping of a phosphorous element are recovered.

Additionally, activation of the impurities contained in the source/drain regions 1422, 1423, 1532 and 1533 and the low concentration impurity regions 1424, 1425, 1534 and 1535 is conducted by the heat treatment simultaneously with gettering. Conventionally, because only a heat treatment at about 450° C. can be conducted due to the low heat resistance of an aluminum material, the activation ratio of the dopant (phosphorous) is low.

In the conventional embodiment, a step of recovering the damages of the crystalline structure formed on ion implantation and an activation step of an impurity are conducted by adding another step (such as laser annealing and high-intensity light annealing). In this example, laser annealing or high-intensity light annealing irradiated from the front surface or the back surface may be conducted simultaneously with the heat treatment. Furthermore, laser annealing or high-intensity light annealing irradiated from the front surface or the back surface may be added as another step to obtain an active layer of further high quality.

Figure 16F:
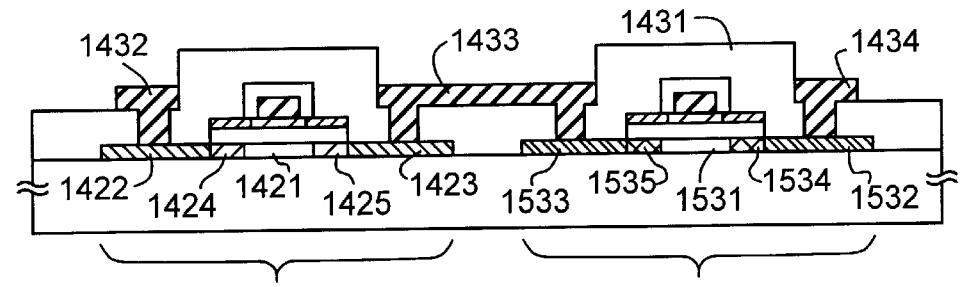

In the heating step after doping in this example (see FIG. 16E), the following treatments are simultaneously conducted.
(1) Gettering treatment for decreasing the metallic element concentration in the channel forming region
(2) Activation treatment of the impurity in the source and drain regions
(3) Annealing treatment for recovering the damages of the crystalline structure formed on implantation of the ion An interlayer insulating film 1431 comprising a silicon oxide film is then formed. After forming a contact hole in the interlayer insulating film 1431, a laminated film comprising titanium, aluminum and titanium as an electrode material is formed and patterned to form wirings 1432, 1433 and 1434. In this embodiment, the N-channel TFT 1450 and the P-channel TFT 1550 are connected by the wiring 1433 to form a CMOS circuit. (FIG. 16F)

A hydrogenation treatment is finally conducted in a hydrogen atmosphere at 350° C. for about 2 hours to conduct a hydrogen termination treatment of the whole TFT. Because the TFT thus produced has the tantalum layer between the aluminum layer and the gate insulating film, the diffusion of an aluminum atom in the heat treatment during the production process can be prevented.

Accordingly, a TFT can be produced with an extremely high yield, and in the case of an AMLCD production process in which one million or more pieces of TFT is produced form one substrate, a high non-defective ratio can be ensured. Thus, the production cost of a liquid crystal module and a product (electronic apparatus) equipped with the same can be decreased.

EXAMPLE 5

While the case where an NTFT is produced is described in Example 1, the invention can be applied to a PTFT. One embodiment of production process and conditions of a P-channel TFT (PTFT) will be briefly described below.

An impurity ion (boron) endowing P-type conductivity is added to the source and drain regions to which a phosphorous ion is added. Diborane diluted to 5% with hydrogen is used as a doping gas. The acceleration voltage is from 60 to 90 kV, and the dose amount is from $1 \times 10^{13}$ to $8 \times 10^{15}$ atoms /cm$^3$. It is important that the dose amount is adjusted in such a manner that the concentration obtained by subtracting the maximum concentration of a phosphorous ion implanted to the source and drain regions from the maximum concentration of a boron ion implanted to the source and drain regions is from $3 \times 10^{19}$ to $3 \times 10^{21}$ atoms/cm$^3$. As a result, the conductivity type of the source and drain regions is reversed to form P-type impurity regions. The conductivity type of the LDD region may also be reversed.

By using the conventional CMOS technique, a CMOS circuit comprising an N-channel TFT and a P-channel TFT combined complementary can be easily produced.

Figure 17:
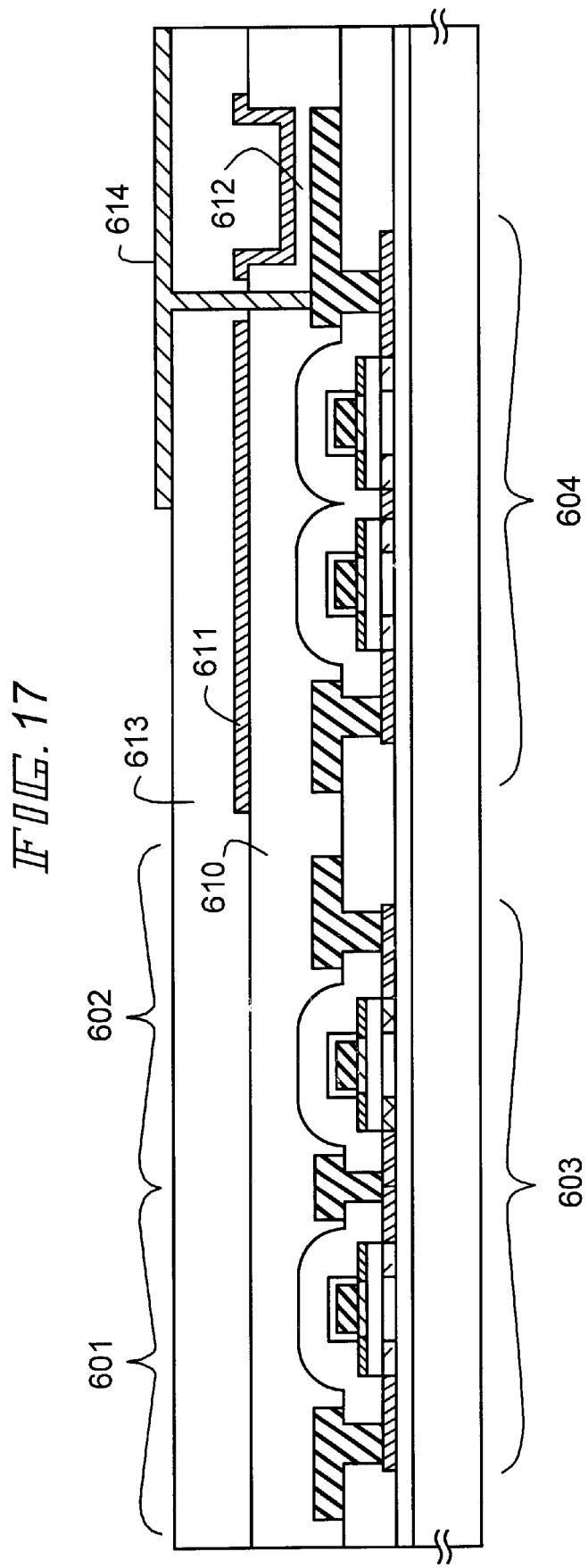
FIG. 17 is a cross sectional view of the active matrix substrate in Example 5.

In this example, an embodiment is described in FIG. 17, in which an active matrix substrate comprising a driving circuit constituted by a CMOS circuit and a pixel matrix area constituted by an N-channel TFT formed on one substrate is produced. In FIG. 17, a CMOS circuit 603 is constituted by an N-channel TFT 601 and a P-channel TFT 602. This embodiment can be easily realized by using the conventional CMOS technique by the substantially same process as in Example 1.

A pixel TFT constituting a pixel matrix circuit (an NTFT in this example) 604 can be produced by the production process described in Example 1 or 2 and some additional steps.

The N-channel TFT 601, the P-channel TFT 602 and the pixel TFT 604 are completed according to the process of Example 1 or 2. A first flattening film 610 as shown in FIG. 17 is then formed. In this example, a laminated structure comprising silicon nitride (50 nm), silicon oxide (25 nm) and acryl (1 μm) is used as the first flattening film 610.

Since an organic resin film such as acryl and polyimide is a solution coating type insulating film formed by a spin coating method, a thick film can be easily formed, and an extremely flat surface can be obtained. Therefore, a film thickness of about 1 μm can be formed with high throughput, and a good flat surface can be obtained.

A black mask 611 comprising a light-shielding conductive film is formed on the first flattening film 610. Before forming the black mask 611, the first flattening film 610 is etched to form a concave part in which only the silicon nitride film as the lowermost remains.

By using such a constitution, the drain electrode and the black mask approach each other only via the silicon nitride film, at which an auxiliary capacitance 612 is formed. Since the silicon nitride film has a high dielectric constant and a small thickness, a large capacitance can be ensured.

After forming the auxiliary capacitance 612 simultaneously with the formation of the black mask 611, a second flattening film 613 is formed with acryl having a thickness of 1.5 μm. While a large step is formed at the part in which the auxiliary capacitance 612 is formed, such a step can be sufficiently flattened.

Finally, contact holes are formed in the first flattening film 610 and the second flattening film 613, and a pixel electrode 614 comprising a transparent conductive film (representative example thereof is ITO) is formed. The active matrix substrate shown in FIG. 17 is thus completed.

An active matrix substrate for a reflective type AMLCD can be produced by using a conductive film having a high reflectivity, such as aluminum and a material mainly comprising aluminum, as the pixel electrode 614.

While the gate electrode of the pixel TFT 604 has a double gate structure in FIG. 17, a single gate structure and a multi-gate structure, such as a triple gate structure, may be employed.

The structure of the active matrix substrate of FIG. 17 is not limited to the structure of this example. The characteristic feature of the invention resides in the constitution of the gate wiring, and other constitutions may be appropriately determined by a practician. For example, a person having an ordinary skill in the art can easily use a bottom gate type TFT as the TFTs 601, 603 and 604.

EXAMPLE 6

In this example, an embodiment, in which an AMLCD is produced by using the TFT according to the invention, will be described. An outer appearance of an AMLCD of this example is shown in FIGS. 18A and 18B.

Figure 18A:
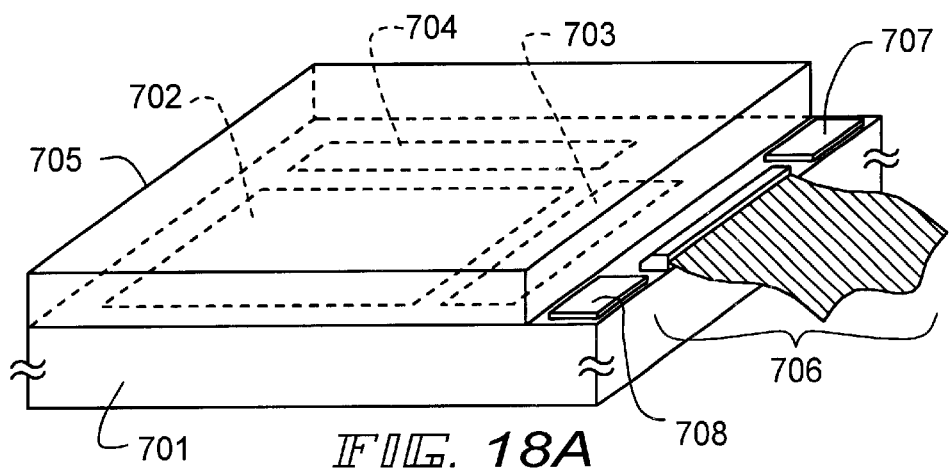
FIGS. 18A and 18B are perspective views of the AMLCD substrate in Example 6.
Figure 18B:
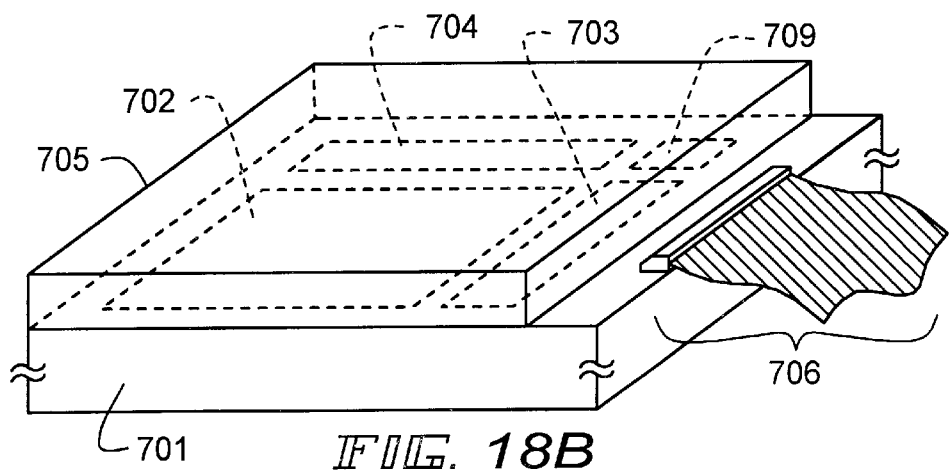

In FIG. 18A, numeral 701 denotes an active matrix substrate, on which a pixel matrix area 702, a source driving circuit 703 and a gate driving circuit 704 are formed. The driving circuits are preferably constituted by a CMOS circuit comprising an N-type TFT and a P-type TFT combined complementary. Numeral 705 denotes a counter substrate.

The AMLCD shown in FIG. 18A is formed by adhering the active matrix substrate 701 and the counter substrate 705, the edges of which agree with each other. However, the counter substrate 705 is removed in only a part, in which an FPC (flexible printed circuit) 706 is connected to the exposed active matrix substrate. An outer signal is transferred to the interior circuits by the FPC 706.

IC chips 707 and 708 are attached by using the surface, to which the FPC 706 is attached. The IC chips comprise a silicon substrate, on which various circuits are fabricated, such as a circuit for processing a video signal, a timing pulse generation circuit, a gamma compensation circuit, a memory circuit and an operation circuit. While two chips are attached in FIG. 18A, the number of chips may be one or three or more.

The constitution shown in FIG. 18B can also be exemplified. In FIG. 18B, the same symbols are attached to the same parts in FIG. 18A. In this embodiment, the signal processing that is conducted by the IC chip in FIG. 18A is conducted by a logic circuit 709 formed with a TFT on the same substrate. In this case, the logic circuit 709 is basically formed with a CMOS circuit as similar to the driving circuits 703 and 704.

While the AMLCD of this example employs a constitution in that the black matrix is provided on the active matrix substrate (BN on TFT), another black mask may be provided in the counter side in addition thereto.

Color display may be conducted using a color filter or using no color filter by driving the liquid crystal in an ECB (electric field controlled birefringence) mode or a GH (guest-host) mode.

An embodiment using a micro-lens array described in JP-A-8-15686 may be employed. An entire disclosure of the JP-A-8-15686 is incorporated herein by reference.

EXAMPLE 7

An embodiment, in which the semiconductor device according to the invention is applied to an active matrix type liquid crystal display device (hereinafter referred to as AMLCD), will be described in this example. An outer appearance of the AMLCD of this example is shown in FIG. 19.

Figure 19:
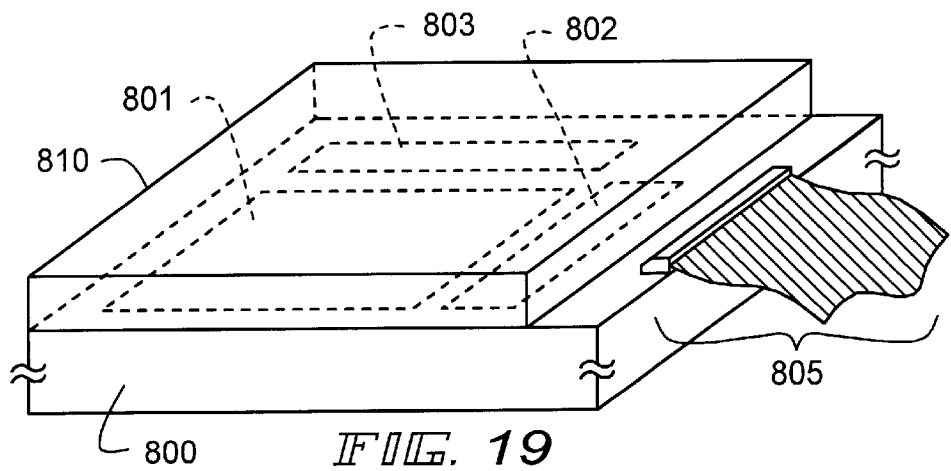
FIG. 19 is a perspective view of the AMLCD substrate in Example 7.

In FIG. 19, numeral 800 denotes an active matrix substrate. The active matrix substrate 800 comprises a glass substrate having thereon a pixel matrix area 801, a source driving circuit 802 and a gate driving circuit 803. The driving circuits 802 and 803 are preferably constituted by a CMOS circuit comprising an N-channel TFT and a P-channel TFT combined complementary. Numeral 810 denotes a counter substrate. Numerals 801, 802 and 803 of the active matrix substrate 800 are constituted by a bottom gate type TFT.

The AMLCD is formed by adhering the active matrix substrate 800 and the counter substrate 810 with a sealing material not shown in the figure, the edges of which agree with each other. A liquid crystal is sealed in a gap between the substrates 800 and 810.

One edge of the active matrix substrate 800 extends from the counter substrate 810, and an FPC (flexible printed circuit) 805 is connected to the exposed surface of the active matrix substrate 800. An outer signal is transferred to the circuit on the active matrix substrate 800 by the FPC 805.

Figure 20:
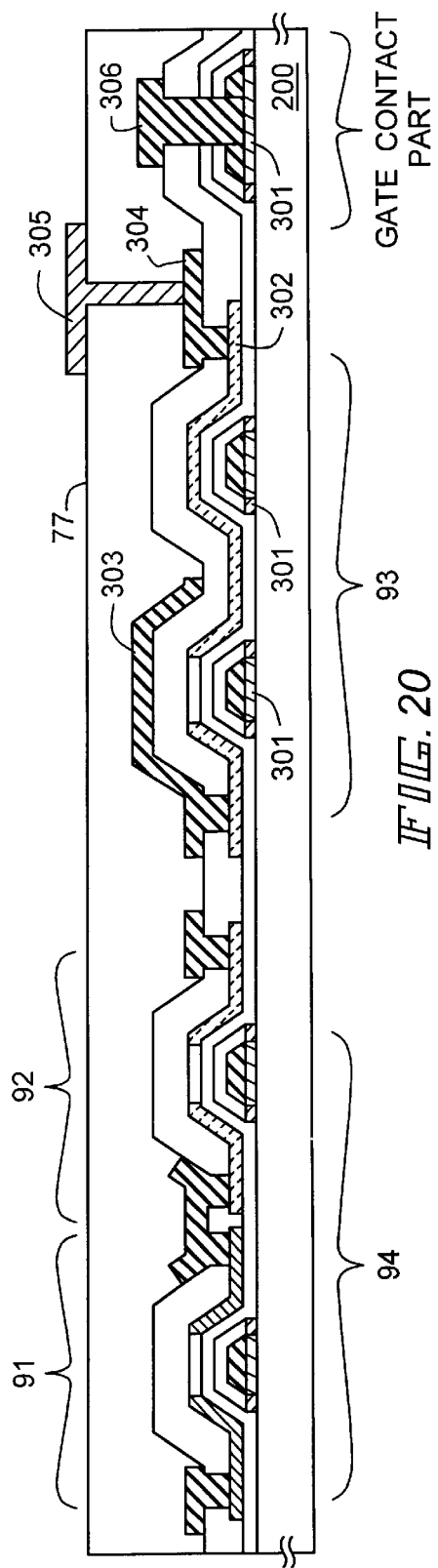
FIG. 20 is a cross sectional view of the active matrix substrate in Example 7.

FIG. 20 is a schematic cross sectional view of the active matrix substrate 800, which includes cross sectional views of a pixel TFT 93 constituting a pixel matrix area 801 and a CMOS circuit 94 constituting the driving circuits 802 and 803. The CMOS circuit 94 is constituted by an N-type TFT 91 and a P-type TFT 92.

Figure 21:
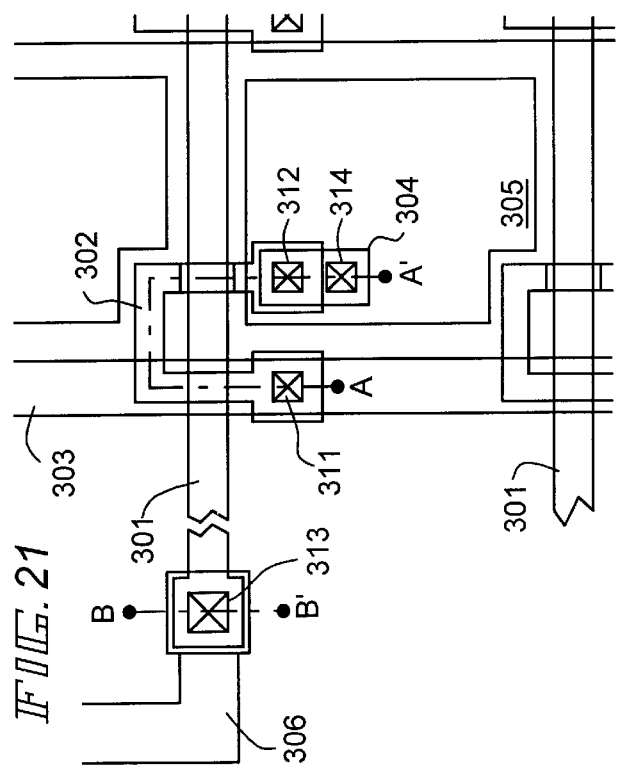
FIG. 21 is a plan view of the pixel matrix area in Example 7.

FIG. 21 is a schematic plan view of the pixel matrix area 801 indicating the structure of the unit pixel. In FIG. 21, gate wiring 301 is formed for respective lines, and source wiring 303 is formed perpendicular to the gate wiring 301 above the gate wiring via an insulating layer.

The gate wiring 301 crosses an active layer 302 of the pixel TFT 93 via a gate insulating film. Each of the gate wiring 301 crosses the same number of the active layers 302 as the number of the pixels along the transverse direction. Each of the source wiring 303 crosses the same number of the active layers 302 as the number of the pixels along the longitudinal direction, and the active layer 302 and the source wiring 303 are electrically connected to each other by a contact 311.

Furthermore, for each of the pixels, a drain electrode is connected to the active layer 302 by a contact 312, and a pixel electrode 305 is connected to the drain electrode 304 by a contact 313. The gate wiring 301 is connected at the edge thereof to leading wiring 306 by the contact 313. The source wiring 303, the drain wiring 304 and the leading wiring 306 are formed in the same layer.

A multi-gate structure is exemplified in this example, in which the active layer 302 curve in the form of a horseshoe, and one active layer 302 crosses two gate electrodes. The part, at which the gate wiring 301 crosses the active layer 302, is called as a gate electrode.

In FIG. 21, a part cut along the broken line A–A' corresponds to the cross sectional structure of the pixel TFT 93 in FIG. 20, and a part cut along the broken line B–B' corresponds to the cross sectional structure of the gate contact part in FIG. 20.

The production process of the active matrix substrate 800 of this example will be described with reference to FIGS. 22A to 22D and 23A to 23D.

A glass substrate having an insulating film on the surface thereof is prepared as a substrate 200 having an insulating surface. Alternatively, a silicon substrate having a heat oxide film formed thereon, a quartz substrate and a silicon substrate having a silicon oxide film thereon may be used.

Figure 22A:
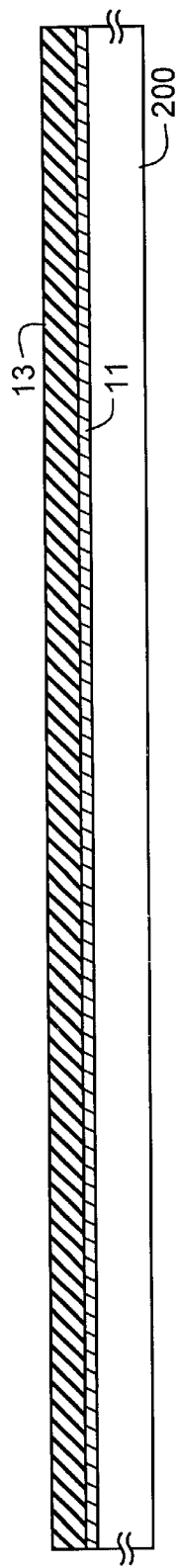
FIGS. 22A to 22D are cross sectional views showing the production process of the TFT in Example 7.

Gate wiring for TFTs 91 to 93 are the formed. A tantalum film (Ta film) 11 having a thickness of 20 nm and an aluminum film (Al film) 13 having a thickness of 40 nm and containing 2% by weight of scandium are formed as laminated on the substrate 200 by a sputtering apparatus. (FIG. 22A)

A thin barrier type alumina film (not shown in the figure) is formed on the surface of the Al film 13 by contacting a probe of an anodic oxidation apparatus to the Al film 13. The anodic oxidation step is conducted for improving adhesion of a resist mask for patterning the Al film 13. The anodic oxidation was conducted by using an ethylene glycol solution containing 3% of tartaric acid as an electrolytic solution under the conditions of a solution temperature of 30° C., an ultimate voltage of 10 V, a voltage application time of 15 minutes and a supplied electric current of 10 mA per one substrate.

FIG. 14 is a schematic diagram of the anodic oxidation apparatus. The anodic oxidation apparatus comprises a power source 251, and an electrolytic solution bath 252 for retaining an electrolytic solution 253, and a cathode (platinum) 254 and the substrate 200 as an anode are connected to the power source 251. Both the substrate 200 and the cathode 254 are immersed in the electrolytic solution 253. On the substrate 200, the probe of the apparatus is in contact with the Al film 13.

Figure 22B:
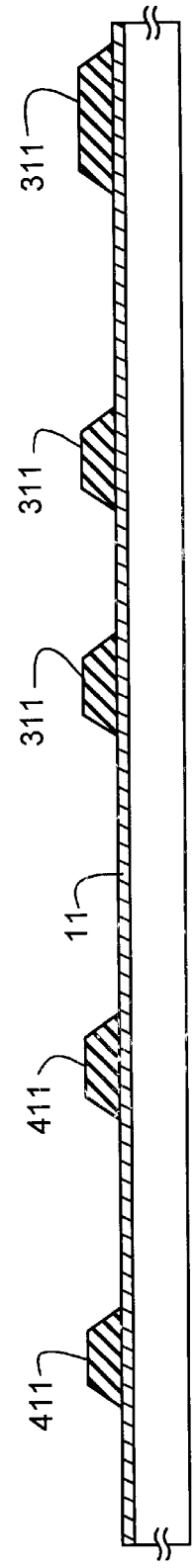

After forming a resist mask, the Al film 13 is patterned to form a second wiring layer. The alumina film not shown in the figure is etched with the chromic mixed acid, and the aluminum film is etched with the aluminum mixed acid to form aluminum layers (Al layers) 311 and 411 as a second wiring layer. The Al layer 311 constitutes an upper layer of gate wiring 301 of a pixel TFT 93. The Al layer 411 constitutes the second wiring layer of gate wiring 401. In the state of FIG. 22B, all the Al layers 311 and 411 form a short circuit by the Ta film 11.

Figure 22C:
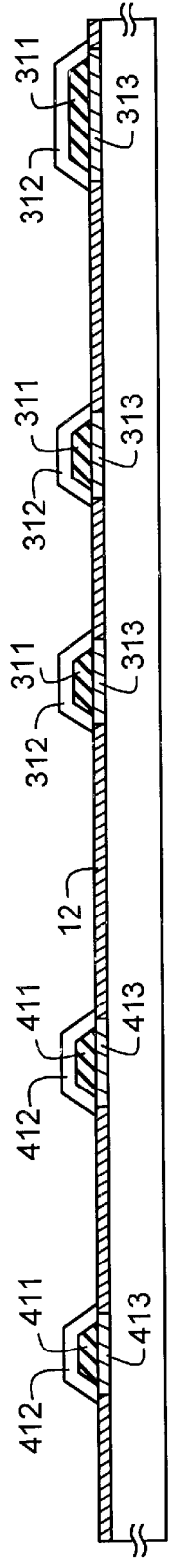
Figure 22D:
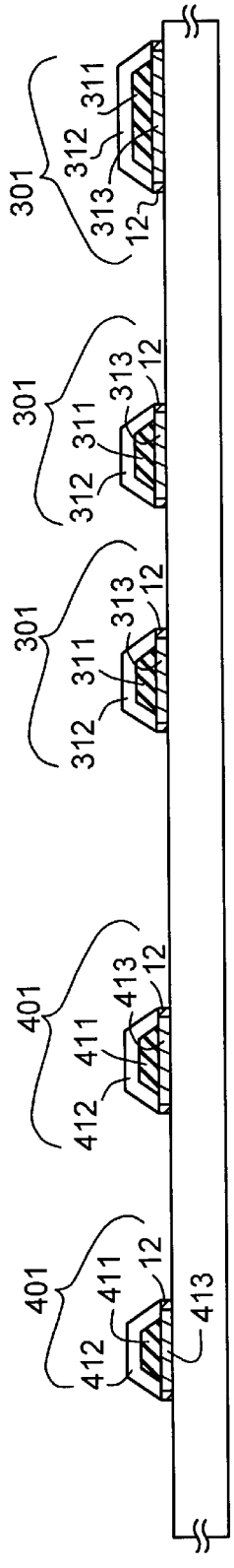

In FIGS. 22B to 22D, while an Al layer 311 for the pixel TFT on the left-hand side and the Al layer 311 on the right-hand side are shown as being divided, they are actually united as shown in FIG. 21. The Al layer 311 on the left-hand side finally functions as a gate electrode of the TFT by overlapping the active layer 302, and the Al layer 311 on amorphous silicon is crystallized by an excimer laser to form a polycrystal (polysilicon).

The conditions of the laser are as follows. As a laser source, an excimer laser of ArF, ArCl, KrF, KrCl, XeF or XeCl is used. The irradiation energy at an outlet of the laser is from 400 to 1,000 mJ, which is optically modified to from 150 to 500 mJ/cm$^2$ on the surface of the substrate 300. The energy is a value per one time irradiation of the laser. The substrate is heated to a substrate temperature of from room temperature to 300° C. The repetition frequency of the irradiation is about from 20 to 100 Hz, and the moving speed of the laser beam on the substrate 200 is from 1 to 5 mm/sec by such a manner that the laser is moved to scan the substrate, or the substrate 200 is placed on a movable stage and the stage is moved.

In this example, a KrF excimer laser is used, which has an output at the outlet of the laser of from 550 to 650 mJ and an output on the substrate of from 180 to 230 mJ/cm$_2$. The repetition frequency of the irradiation is from 35 to 45 Hz, and the stage carrying the substrate is moved at a speed of from 2.0 to 3.0 mm/sec.

Unless hydrogen is removed to a certain extent from the amorphous silicon before conducting crystallization, hydrogen is suddenly evaporated by heating to make a hole in a severe case. Therefore, before conducting crystallization, it is effective to conduct removal of hydrogen in nitrogen at a temperature of from 400 to 500° C. for from 0.5 to 5 hours. In this example, the substrate is treated in nitrogen at 400 ° C. for 1 hour.

Thereafter, a mask is formed by patterning a resist by a know photolithography method, and the polysilicon is etched to an island form by dry etching using a mixed gas of CF$_4$ and O$_2$ to form the active layers 302, 402 and 403. The resist is then removed by an alkaline remover. (FIG. 23A)

FIG. 24 is a partial enlarge cross sectional view of the gate wiring in the state of FIG. 23A. The gate wiring has the laminated structure of the Ta layer 313 and the Al layer 311, and the interface between the Al layer 311 and the barrier A.O. film 312 is present inside the interface between the Ta layer 313 and the Ta)$_x$ film 12. The thickness of the TaO$_x$ film 12 is gradually increased from the interface to the Ta layer 313 toward the outside. The gate wiring 401 has the similar constitution.

As the formation method of the polysilicon film, any known method can be employed such as a method using laser annealing. As the active layer, a silicon germanium film represented by Si$_x$Ge$_{1-x}$ (0<x<1) can be used as well as silicon.

Source and drain regions are then formed in the active layer by forming a conductive film or by doping. In this example, a method using laser doping is employed. The substrate 200 is irradiated with an excimer laser from the back surface thereof in an impurity-containing atmosphere. The active layers 302, 402 and 403 are selectively irradiated with laser as the gate wiring 301 and 401 function as a mask, and the impurity is added to the region irradiated with laser to form source and drain regions.

In this example, phosphorous is added to all the active layers 302, 402 and 403 to form N-type regions 315, 316 and 317 and 415, 416, 417 and 418. The active layers 302 and 402 of the N-channel TFT are covered with a resist, and boron is selectively added to the active layer 403 by irradiation of laser from the back surface. The conductivity type of the regions 417 and 418, which has been endowed N-type conductivity, is reversed to P-type by the addition of boron.

In the N-type regions 315, 316, 317, 415 and 416 formed in the active layers 302 and 402 of the N-channel TFT, the addition of phosphorous is adjusted in such a manner that the concentration of phosphorous is from $1 \times 10^{20}$ to $8 \times 10^{21}$ atoms/cm$^3$. The dose amount of boron in the regions 417 and 418 is adjusted in such a manner that when a difference of the maximum value of the boron ion concentration from the maximum value of the phosphorous ion concentration is calculated, the concentration of a boron ion is from $3 \times 10^{19}$ to $3 \times 10^{21}$ atoms/cm$^3$.

Regions 318, 319, 419 and 420 of the active layers 302, 402 and 403, to which boron is not added, become a channel forming region. After completing the addition step of the impurity ion, a heat treatment is conducted by furnace annealing, lamp annealing, laser annealing or a combination thereof, to conduct activation of the impurity ion added. (FIG. 23B)

An interlayer insulating film 76 covering the TFT is then formed. In this example, a silicon nitride oxide film having a thickness of 100 nm is formed by using a SiH$_4$ gas and a N$_2$O gas as raw materials, and then a silicon oxide film having a thickness of 900 nm is formed by using a TEOS gas as a raw material.

Contact holes 21, 22, 23, 24, 25, 26 and 27 are then formed. The interlayer insulating film 76 is etched by using an etchant LAL500 produced by Hashimoto Kasei, Co., Ltd. The etchant LAL500 is formed by adding several percent of a surface active agent to a buffered hydrofluoric acid formed by mixing ammonium fluoride, hydrofluoric acid and water. Other species of buffered hydrofluoric acid may be used.

The buffered hydrofluoric acid used herein is preferably one that can etch a silicon oxide film at a relatively high rate. Since the interlayer insulating film 76 is as thick as 1 μm, the higher etching rate brings about increase in throughput.

After the etching of the interlayer insulating film 76, the N-type region (source region) 315 and the N-type region (drain region) 317 in the pixel TFT 92 are exposed, and the N-type region (source region) 415 and the N-type region (drain region) 416 in the N-channel TFT 93 are exposed, to complete the contact holes 21, 22 and 24, 25, 26 and 27.

In the contact hole 23 of the gate contact part, the barrier A.O. film 312 is exposed. Etching is then continued by using a diluted buffered hydrofluoric acid formed by mixing ammonium fluoride, hydrofluoric acid and water at a ratio of 2/3/150 (volume ratio).

The silicon films, i.e., the active layers 302, 402 and 403, are substantially not etched by the diluted buffered hydrofluoric acid. However, the barrier A.O. film 312 of the gate wiring 301 in the gate contact part is etched, and the underlying Al layer 13 is also etched. Finally, the etching is terminated at the time at which the etching reaches the Ta layer 11, and the contact hole 23 is formed. While not shown in the figure, the contact part for the gate wiring 401 in the CMOS circuit 94 has the similar constitution. (FIG. 23C)

In the constitution of this example, because the Ta layer 313 functions as an etching stopper on forming the contact hole 23, the controllability and margin of the process are greatly improved.

After thus obtaining the state shown in FIG. 23C, a conductive film constituting source wiring, drain wiring and leading wiring is formed. In this example, a laminated film comprising titanium film (100 nm), aluminum film (400 nm) and titanium film (100 nm) is formed. By patterning the laminated film, source wiring 303, drain wiring 304 and leading wiring 306 connected to the gate wiring 301 of the pixel TFT 93; source wiring 403 and 404 and drain wiring 405 of the CMOS circuit 94 are formed. (FIG. 23D)

In this example, wiring having a three-layer structure comprising titanium, aluminum alloy and titanium is used as the conductive film constituting the source wiring, the drain wiring and the leading wiring. By using such a Constitution, wiring of a low resistance can be realized with protecting the highly reactive aluminum film by titanium. The conductive film that can be applied to this example is not limited thereto.

An interlayer insulating film 77 covering the whole of the substrate 200 is then formed as shown in FIG. 20. In this example, a laminated film comprising silicon nitride (50 nm), silicon oxide (25 nm) and acryl (1 μm) is formed. Since an organic resin film such as acryl and polyimide is a solution coating type insulating film formed by a spin coating method, a thick film can be easily formed, and an extremely flat surface can be obtained. Therefore, a film thickness of about 1 μm can be formed with high throughput, and a good flat surface can be obtained.

Finally, a contact hole reaching the drain electrode 304 is formed in the interlayer insulating film 77, to complete the pixel electrode comprising a transparent conductive film (typically ITO). The active matrix substrate 800 is thus completed.

An active matrix substrate of a reflective type can be produced by using a conductive film having a high reflectivity, such as aluminum and a material mainly comprising aluminum, as the pixel electrode 305.

While the pixel TFT 93 in this example has a double gate structure, a single gate structure and a multi-gate structure, such as a striple gate structure, may be employed.

In this example, because the gate wiring can be subjected to anodic oxidation without forming voltage supplying wiring for anodic oxidation, the circuit design can be conducted without considering the space for providing the voltage supplying wiring and the etching margin for separating the voltage supplying wiring.

Furthermore, because the first wiring layer of the gate wiring is formed with a high melting point material, the Ta layer, the diffusion of Al from the Al layer can be prevented even on heating at from 400 to 650° C. Therefore, the restriction on process temperature after the formation of the gate wiring is relaxed, and variation of usable means can be broadened. The reliability is also improved by increasing the heat resistance of the gate wiring.

EXAMPLE 8

FIG. 25 is a cross sectional view of an AMLCD substrate of this example. While the $TaO_x$ film 12 formed in FIG. 22C is separated for each wiring in the step shown in FIG. 22D in Example 7, the $TaO_x$ film 12 is not separated but remains in this example. The other constitution is the same as in Example 7, and some symbols are omitted in FIG. 25.

In this example, because the surface of the glass substrate 200 is covered with the $TaO_x$ film 12, diffusion of a movable ion such as sodium from the glass substrate to the interior of the AMLCD substrate can be prevented. Furthermore, the etching step of the $TaO_x$ film 12 (see FIG. 22D) is omitted to realize simplification of the process. In this example, it is extremely important that the Ta film not subjected to anodic oxidation does not remain in the $TaO_x$ film 12. Therefore, after the anodic oxidation step of FIG. 22C, the exposed $TaO_x$ film 12 is completely oxidized by adding a heat treatment in an oxygen atmosphere at a temperature of about from 400 to 500° C. Even though this heating step is added, the throughput is improved in comparison to the case where the etching step is conducted. Since the $TaO_x$ film 12 is transparent to a visible ray, even when the $TaO_x$ film 12 remains as in this example, the substrate can be used as a transparent type AMLCD substrate.

EXAMPLE 9

An embodiment where the invention is applied to a TFT will be described in this example. In this example, the forming method of the gate wiring in Example 7 is changed. The embodiment of this example will be described with reference to FIGS. 26 to 32. FIG. 26 is a schematic plan view of the TFT.

In FIG. 26, numeral 501 denotes gate wiring, 502 denotes an active layer of the TFT, and 503 and 504 denote contact parts (source and drain contact parts) of the active layer 502 and source wiring and drain wiring. Numeral 505 denotes a contact part (gate contact part) to leading wiring (not shown in the figure).

The production process will be described with reference to FIGS. 27A to 27F and 28A to 28C. In FIGS. 27A to 27F and 28A to 28C, a cross sectional view of a TFT part is shown in the left-hand side, and a cross sectional view of a gate contact part is shown in the right-hand side. The cross section of the TFT corresponds to the cross sectional view taken on line A–A' in FIG. 26, and the cross section of the gate contact part corresponds to the cross sectional view taken on line B–B' in FIG. 26.

A tantalum layer 531 also functions as a blocking layer for preventing flow out (diffusion) of a component substance of an aluminum layer 532. It is considered that such diffusion of aluminum is caused by heating due to a heat treatment or static charge owing to mobility of an aluminum alloy, and such diffusion can be prevented by providing a valve metal layer under the aluminum film.

Figure 27A:
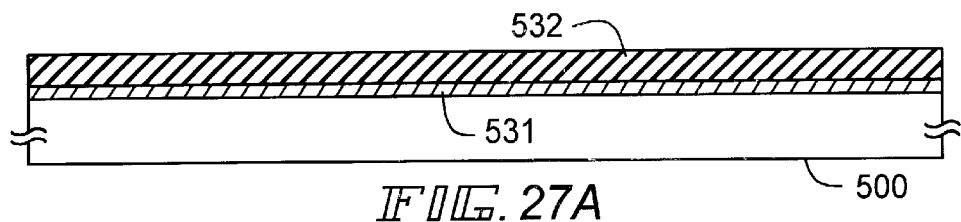
FIGS. 27A to 27F are cross sectional views showing the production process of the TFT in Example 9.

A glass substrate having an insulating film on the surface thereof is prepared as a substrate 500 having an insulating surface. Alternatively, a silicon substrate having a heat oxide film formed thereon, a quartz substrate and a silicon substrate having a silicon oxide film thereon may be used. A tantalum film (Ta film) 531 having a thickness of 20 nm and an aluminum film (Al film) having a thickness of 40 nm and 532 containing 2% by weight of scandium are formed as laminated on the substrate 500 by a sputtering apparatus. A thin alumina film (not shown in the figure) is formed on the surface of the Al film 532 by contacting a probe of the anodic oxidation apparatus to the Al film 532. This anodic oxidation step is conducted for improving the adhesion of a resist mask 533. The anodic oxidation is conducted by using an ethylene glycol solution containing 3% of tartaric acid as an electrolytic solution under the conditions of a solution temperature of 30° C., an ultimate voltage of 10 V, a voltage application time of 15 minutes and a supplied electric current of 10 mA per one substrate. (FIG. 27A)

Figure 27B:
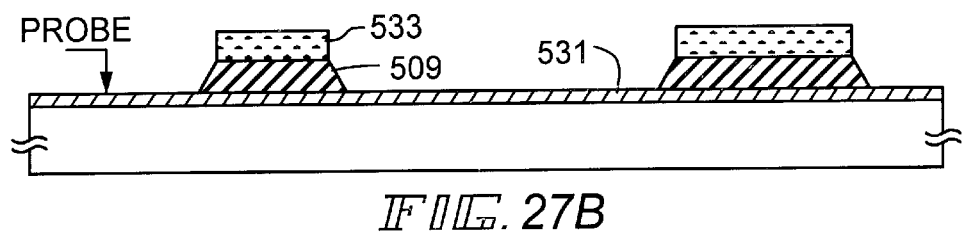

A resist mask 533 is then formed. The alumina film not shown in the figure is etched by the chromic mixed acid, and the aluminum film 532 is etched by the aluminum mixed acid, to form an aluminum layer (Al layer) 509 as a second wiring layer. The Al layer 509 constitutes an upper layer of a gate wiring 501. In FIGS. 27B to 27F, while the Al layer 509 on the left-hand side and the Al layer 509 on the right-hand side are shown as being divided, they are actually united as shown in FIG. 26. The Al layer 509 on the left-hand side finally functions as a gate electrode of the TFT by overlapping the active layer 502, and the Al layer 509 on the right-hand side becomes a contact part for contacting with an outer terminal. (FIG. 27B)

Figure 27C:
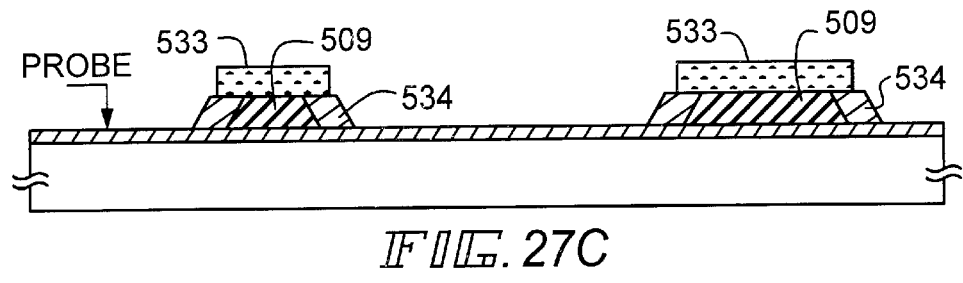

Anodic oxidation is conducted by contacting the probe to the Ta film 531 in the anodic oxidation apparatus with the resist mask 533 remaining. The anodic oxidation is conducted by using a 3% oxalic acid aqueous solution (temperature: 10° C.) as an electrolytic solution under the conditions of an ultimate voltage of 8 V, a voltage application time of 40 minutes and a supplied electric current of 20 mA per one substrate. Under the anodic oxidation conditions, a porous anodic oxide film 534 (hereinafter referred to as a porous A.O. film 534) is formed on the side surface of the Al layer 509. The A.O. film 534 is a porous alumina film. (FIG. 27C)

After removing the resist mask 533, anodic oxidation is again conducted in the anodic oxidation apparatus by contacting the probe to the Ta film 531. The anodic oxidation is conducted by using an ethylene glycol solution containing 3% of tartaric acid as an electrolytic solution under the conditions of a solution temperature of 10° C., an ultimate voltage of 80 V, a voltage application time of 30 minutes and a supplied electric current of 30 mA per one substrate.

The surface of the Al layer 509 is subjected to anodic oxidation by tartaric acid penetrating in the porous A.O. film 534, to form a barrier type anodic oxide film (referred to as a barrier A.O. film) 511. The barrier A.O. film 511 is a non-porous alumina film. In the Ta film 531, an exposed part and a part, on which the porous A.O. film 534 is present, are also subjected to anodic oxidation, to be modified to a tantalum oxide film (hereinafter referred to as a $TaO_x$ film) 510. The remaining tantalum layer (Ta layer) 508 is fixed as a first wiring layer. While the thickness of the $TaO_x$ film 510 is larger than the thickness of the Ta film 531, they are shown by the same thickness in FIGS. 27D to 27F and 28A to 28C for simplification. (FIG. 27D)

Figure 27D:
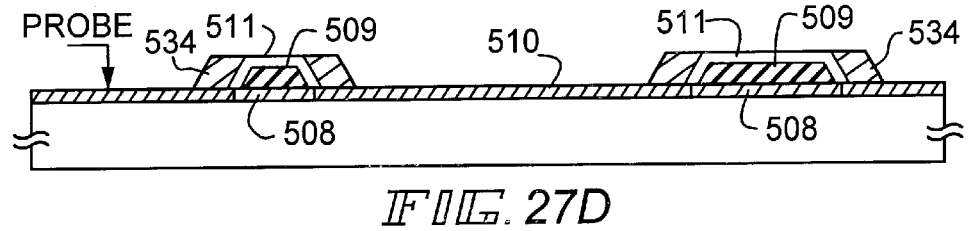
Figure 29A:
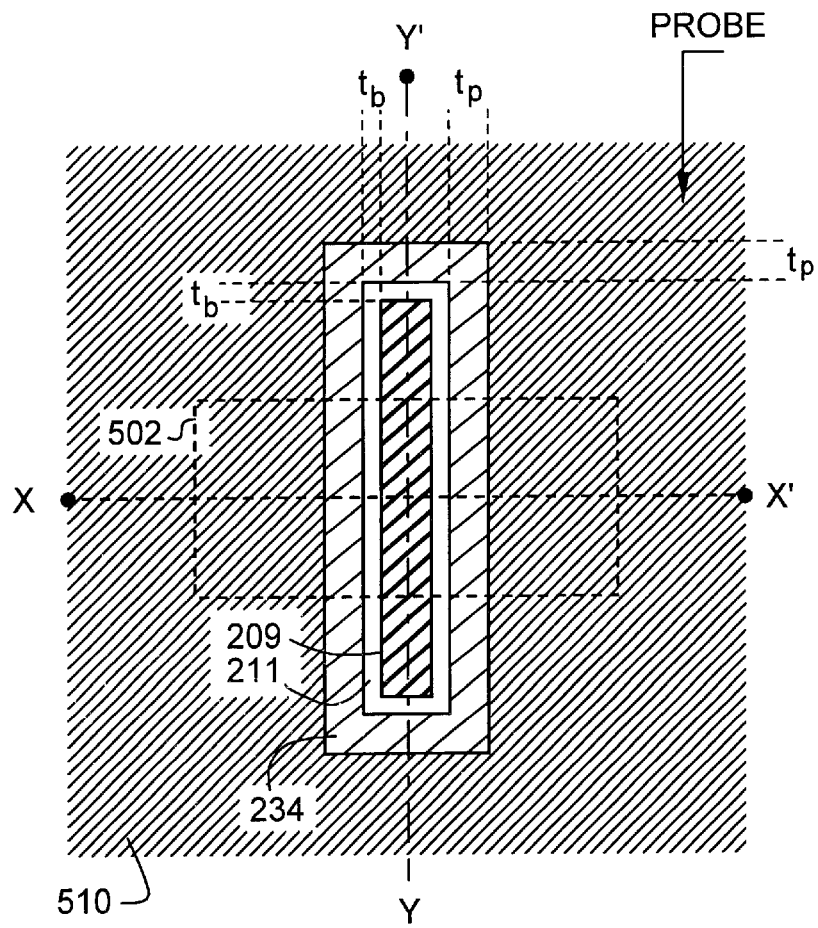
FIGS. 29A to 29C are a plan view and cross sectional views during the production process of the TFT in Example 9.
Figure 29B:
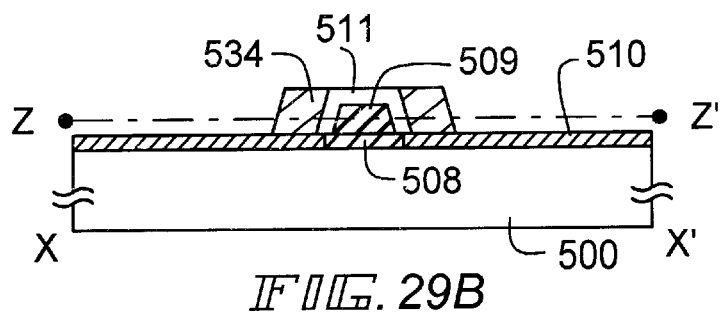
Figure 29C:
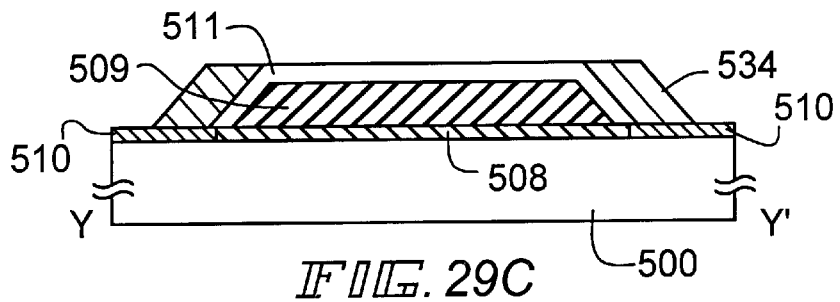

FIGS. 29A to 29C are cross sectional views of the gate wiring in the state of FIG. 27D. FIG. 29B is a cross sectional view of the TFT in the longitudinal direction of the channel taken on line X–X' in FIG. 29A. FIG. 29C is a cross sectional view taken on line Y–Y' in FIG. 29A which corresponds to the cross sectional view of the TFT in the transverse direction of the channel. The FIG. 29A is a cross sectional view taken on line Z–Z' in FIG. 29B. While the plan shape of the Al layer 509 is actually the similar to the shape of the gate wiring 501 as in FIG. 32, it is simplified to a rectangle. The same can be applied to the Al layer 509 with respect to FIGS. 29A, 29B and 29C and 24.

As shown in FIGS. 29A, 29B and 29C, the film thickness $t_b$ of the barrier A.O. film 511 and the film thickness $t_p$ of the porous A.O. film 534 extending from the side surface of the barrier A.O. film 511 toward the outside are uniform in the circumference of the Al layer 509.

Figure 27E:
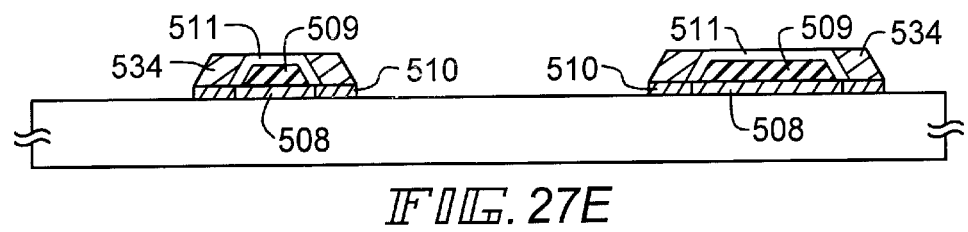

The $TaO_x$ film 510 is etched by using the A.O. films 511 and 534 as a mask. The etching is conducted by a dry etching method using a $CHF_3$ gas. (FIG. 27E)

The porous A.O. film 534 is removed by the aluminum mixed acid. Through this step, the gate wiring 501 comprising the Ta layer 508 and the Al layer 509 laminated to each other is completed. The whole side surface of the gate wiring 501 is covered by the $TaO_x$ film 510 and the barrier A.O. film 511. The $TaO_x$ film 510 extends from the side surface of the barrier A.O. film 511 toward the outside. (FIG. 27F)

Figure 27F:
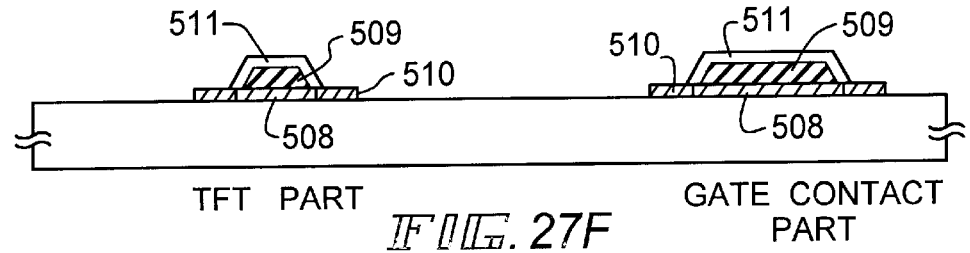
Figure 30A:
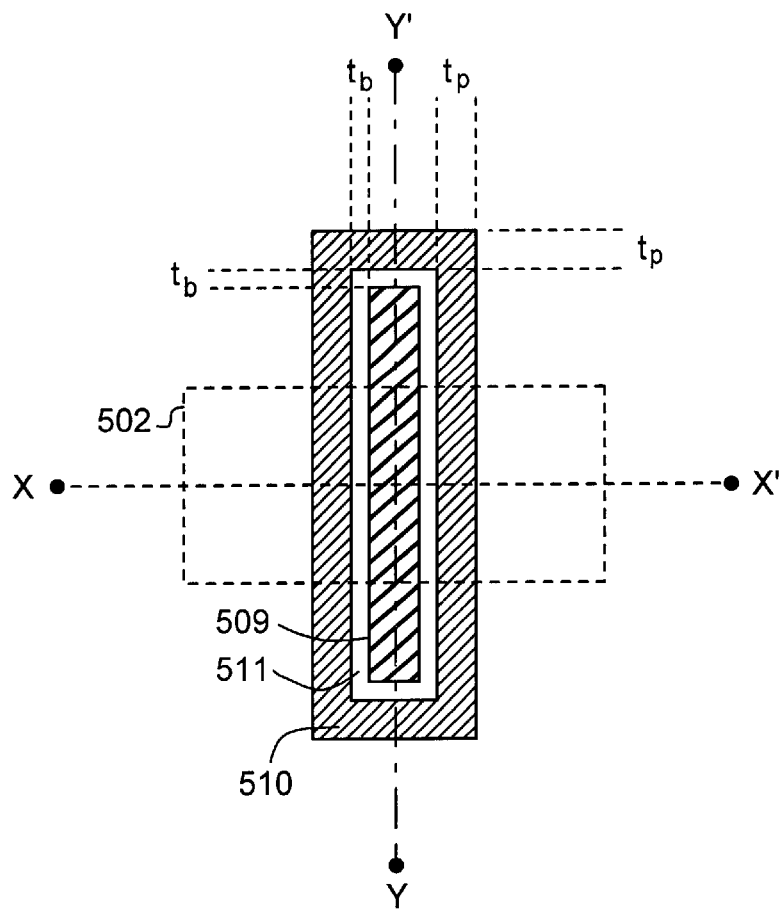
FIGS. 30A to 30C are a plan view and cross sectional views during the production process of the TFT in Example 9.
Figure 30B:
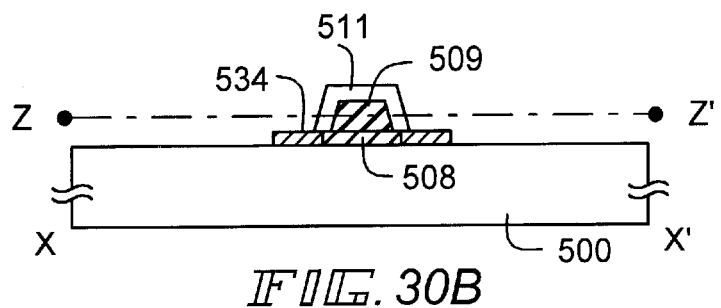
Figure 30C:
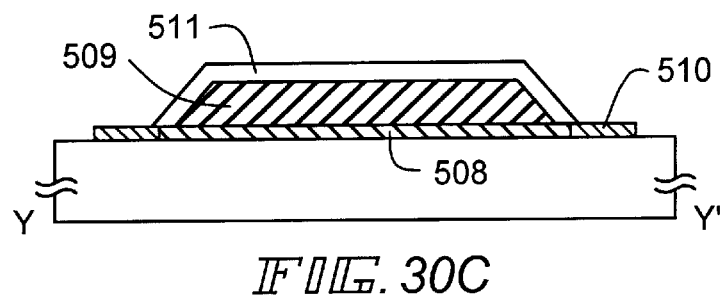

FIGS. 30A to 30C are cross sectional views of the gate wiring 501 in the state of FIG. 27F. FIG. 30B is a cross sectional view of the TFT in the longitudinal direction of the channel taken on line X–X' in FIG. 30A. FIG. 30C is a cross sectional view taken on line Y–Y', in FIG. 30A which corresponds to the cross sectional view of the TFT in the transverse direction of the channel. As shown in FIGS. 30A to 30C, the length of the $TaO_x$ film 510 extending from the side surface of the barrier A.O. film 511 corresponds to the film thickness $t_p$, which is uniform in the circumference of the Al layer 509.

Figure 31:
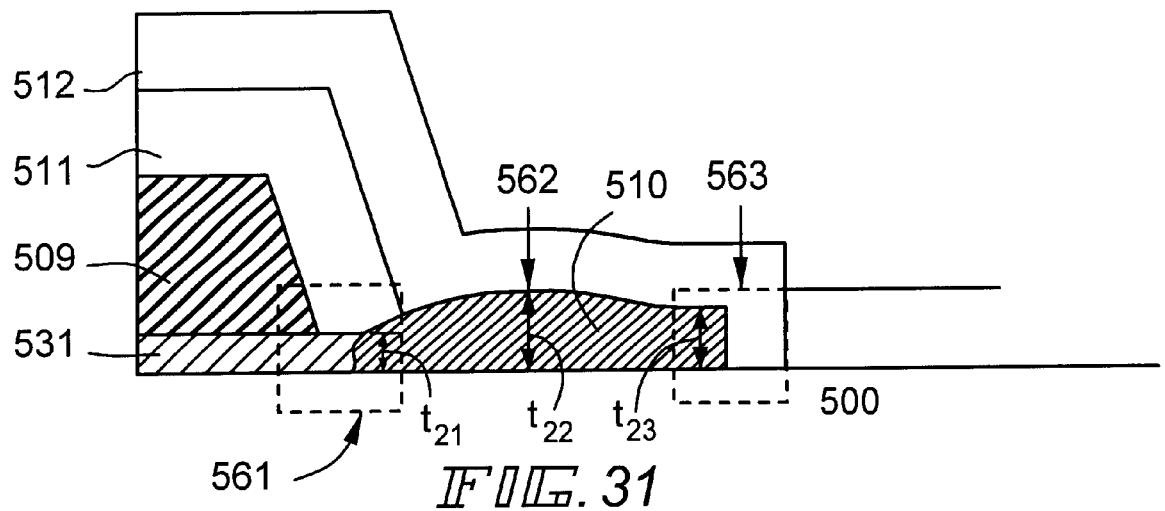
FIG. 31 is a cross sectional view of the gate wiring in Example 9.

As described above, the thickness $t_{21}$ of the $TaO_x$ film 510 at least on the gate insulating film of an island form in the region 561 under the A.O. film 511 is decreased toward the Ta film 531 as shown in FIG. 31.

The part of the $TaO_x$ film 510 extending outside the A.O. film 511 is a region that has been present under the porous A.O. film 534. Therefore, outside the A.O. film 511, the thickness of the $TaO_x$ film is gradually increased toward the outside, and the thickness thereof becomes maximum $t_{22}$ at a part 562. Furthermore, the thickness is gradually decreased from the part 562 toward the outside, and becomes substantially constant $t_{23}$ in a region 563.

In this example, the interface between the Ta layer 531 and the $TaO_x$ layer 510 is present outside the interface between the Al layer 509 and the barrier A.O. film 511. As described in the foregoing, an effect of preventing the diffusion of Al from the Al layer 509 is highly exhibited.

Because the $TaO_x$ film 510 and the barrier A.O. film 511 are formed by the same anodic oxidation step, the $TaO_x$ film 510 is formed to push up the barrier A.O. film 511. Therefore, the edge of the interface between the barrier A.O. film 511 and the Al film 509 is sealed with the $TaO_x$ film 510, and it is considered that the barrier A.O. film 511 is pushed on the Al layer 509. Therefore, the effect of preventing the diffusion of Al from the Al layer 509 is highly exhibited.

A silicon oxide nitride film having a thickness of 125 nm is formed on the whole surface of the substrate as a gate insulating film 512 by using a plasma CVD method using a mixed gas of TEOS and oxygen as a raw material gas.

An active layer of the TFT is formed on the gate insulating film 512 is the formed. In this example, a crystallized amorphous silicon film is used as the active layer. An amorphous silicon film having a thickness of 500 nm is formed by using silane as a raw material gas by a plasma CVD method. It is then subjected to solid-state growth by a heat treatment at from 550 to 650° C. for from 12 to 20 hours, to make a polycrystal (polysilicon). The crystallization by the heat treatment has an advantage in that unevenness of crystallization within the film is smaller than the crystallization by irradiation with laser as described in Example 7. This is because the unevenness of the irradiation energy of the excimer laser apparatus is difficult to be avoided due to the constitution of the apparatus.

In this example, the Al layer 509 is formed in the gate wiring 501 to realize low resistance, and simultaneously since the Al layer 509 is covered with the A.O. film 511, the Ta layer 531 and the $TaO_x$ film 510, the heat resistance thereof is improved. Therefore, amorphous silicon can be crystallized by heating. That is, according to this example, a bottom gate type TFT having gate wiring comprising an aluminum material and an active layer comprising a polycrystalline silicon film formed by solid-state growth (crystallization by heat treatment) can be obtained.

Thereafter, a resist is patterned by a known lithography method to form a mask, the polysilicon is etched by dry etching using a mixed gas of $CF_4$ and $O_2$ into an island form, to form the active layer 502. The resist is then removed by an alkaline remover.

Figure 28A:
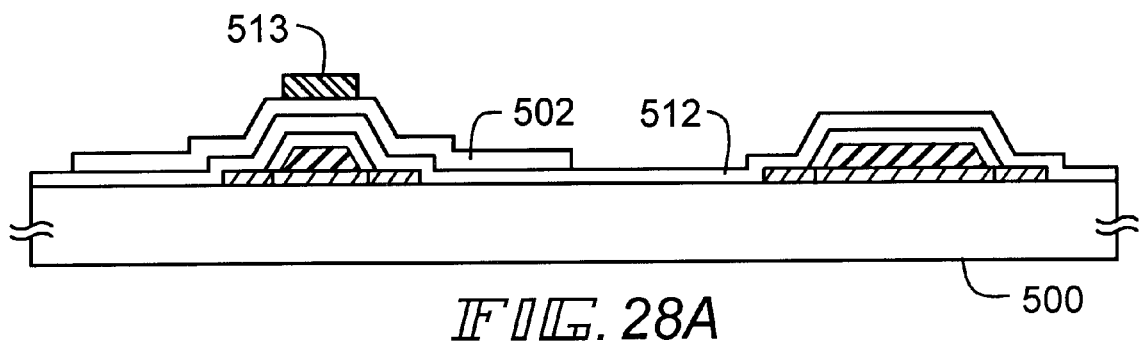
FIGS. 28A to 28C are cross sectional views showing the production process of the TFT in Example 9.

After forming a silicon oxide film (preferably having a thickness of from 100 to 300 nm, the thickness of which in this example is 150 nm), patterning thereof is conducted to form a channel stopper 513 for protecting the channel forming region. (FIG. 28A)

Figure 28B:
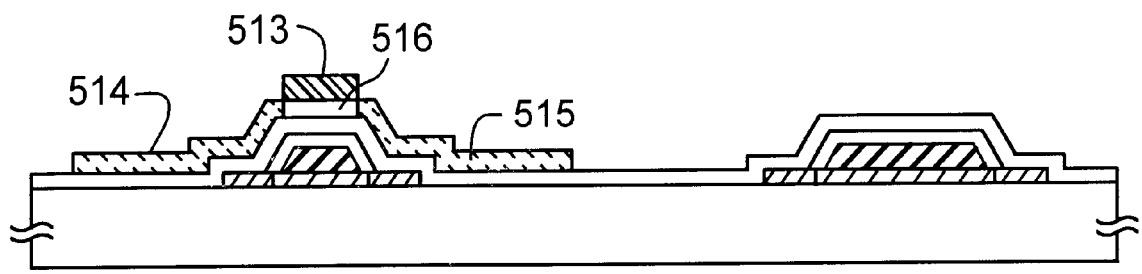

An impurity ion endowing one conductivity is added to the active layer 502 by a plasma doping method using the channel stopper 513 as a doping mask, to form a source region 514 and a drain region 515. A region 516 of the active layer 502 under the channel stopper 513 becomes a channel forming region. In order to produce an N-channel TFT, phosphorous or arsenic is added, and in order to produce a P-channel TFT, boron or gallium is added. The addition of the impurity ion can be conducted by any of an ion implantation method, a plasma doping method and a laser doping method. In the case where a CMOS circuit is produced, the impurity ion to be added is selected by using a resist mask. (FIG. 28B)

After the addition of the impurity, the impurity added is activated. Even in the case where a heat treatment at about 450° C. is conducted in this step, the Al layer of the gate wiring 501 in this example can be prevented from formation of hillock to cause blister and diffusion of Al. An interlayer insulating film 520 is then formed on the whole surface of the substrate. In this example, a silicon oxide film having a thickness of 1 μm is formed by a plasma CVD method. A mixed gas of a TEOS gas and an $O_2$ gas is used as a raw material. Contact holes are then formed in the source region 514, the drain region 515 and the gate contact part. The formation of the contact holes are conducted by etching the interlayer insulating film 520, the barrier A.O. film 511 and the Al layer 509 as similar to Example 7.

A three-layer film comprising titanium, aluminum alloy and titanium is formed by a sputtering method as a conductive film constituting source wiring 517, drain wiring 518 and leading wiring 519. The three-layer conductive film is patterned to form the source wiring 517, the drain wiring 518 and the leading wiring 519. (FIG. 28C)

Figure 28C:
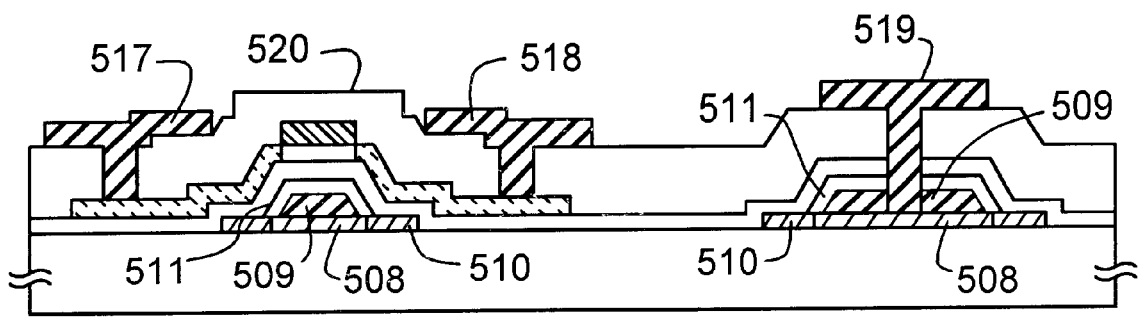
Figure 32:
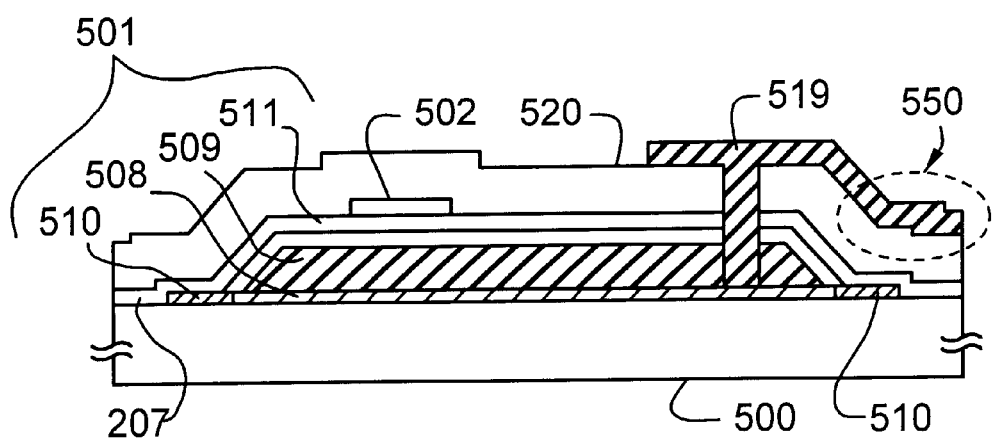
FIG. 32 is a cross sectional view of the gate wiring in Example 9.

FIG. 32 is a cross sectional view of the active layer in FIG. 28C in the transverse direction of the channel (i.e. the direction crossing at right angle the channel), which corresponds to FIG. 26 cross sectional view of the gate wiring taken on the line C–C'.

Conventionally, in multi-layer wiring, a step reflecting the lower part structure is formed on the surface of the interlayer insulating film 520. The leading wiring 519 is formed over the step part. The separation of wiring at the step part has been a problem, and the separation of wiring due to the step at the edge of the gate wiring frequently occurs.

In this example, because the $TaO_x$ film 510 is formed as extending under the gate wiring 501, the cross sectional angle at the lower part of the gate wiring becomes gentle. Therefore, the step at a part 550 over the edge part of the gate wiring 501 becomes gentle, and the separation of the wiring 519 at the part 550 can be prevented. (FIG. 32) Furthermore, since the cross sectional angle of the lower part of the gate wiring become gentle, the covering property of the gate insulating film 512 is also improved.

The bottom gate type TFT of the invention is not limited to the constitutions in Examples 7 and 8. For example, a channel etch type may be employed, and a silicon film having phosphorous or baron added thereto may be formed for forming the source and drain regions.

EXAMPLE 10

While the first layer of the gate wiring is constituted by a Ta film in Examples 7, 8 and 9, a Ta film containing nitrogen (N), i.e., a tantalum nitride (expressed $TaN_y$ herein) film, can be used instead of the Ta film.

While the Ta film is electrically connected to the leading wiring in Examples 7 and 8, the contact can be of low resistance by changing the Ta film to a $TaN_y$ film. It is considered that this is because the $TaN_y$ film is difficult to be oxidized in comparison to the Ta film, and on opening a contact hole for the leading wiring, a spontaneous oxide film is substantially not formed on the $TaN_y$ film.

It is also considered that this is because $TaN_y$ can have a stable crystalline structure of low resistance in comparison to Ta. As the crystalline structure of Ta, a cubic system (alpha-Ta) which is stable and has low resistance, and a tetragonal system (beta-Ta) which is metastable and has high resistance are known. In general, when the temperature are room temperature and the film thickness is 1 μm or less, beta-Ta is predominantly grown, and the stable alpha-Ta having low resistance is substantially not grown. One of the means for predominantly growing alpha-Ta is addition of nitrogen on the film formation. $TaN_y$ added with nitrogen is stable as being a cubic system, and thus it is known that the crystalline structure thereof is highly similar to alpha-Ta.

A sputtering method is used for forming a film of TaN$_y$. The sputtering is conducted by using Ta as a target under the conditions in that the backing pressure is $4.0\times10^{-4}$ Pa, the sputtering pressure is $4.0\times10^{-1}$ Pa, the sputtering electric current is 4 A, the argon gas flow rate is 50 sccm, and the nitrogen gas flow rate is 2 sccm. The film thickness is 20 nm. The resistivity of the TaN$_y$ film is from 30 to 50 mΩcm, the sheet resistance calculated from the resistivity is from 15 to 25 Ω per square when the thickness thereof is 20 nm. The value of the resistivity of TaN$_y$ can be controlled by changing the flow rate of the nitrogen gas on film formation.

In this example, the Ta film in Examples 7 and 8 is substituted by the TaN$_y$ film, and the other constitutions are the same. The anodic oxidation of the TaN$_y$ film can be conducted by the same conditions as the Ta film, and the anodic oxide thus formed is a tantalum oxide film containing nitrogen. Furthermore, not only changing the Ta film to a single layer of the TaN$_y$ film but also the use of, for example, a film obtained by laminating Ta film and TaN$_y$ film or TaN$_y$ film and Ta film in this order from the lower layer, and a three-layer film of TaN$_y$ film, Ta film and TaN$_y$ film can be employed. By forming a Ta film after forming a TaN$_y$ film as an underlayer, alpha-Ta having a low resistance can be easily grown.

EXAMPLE 11

CMOS circuits and pixel active matrix circuits produced by the embodiments of the present invention can be applied to a plurality of electro-optical devices (e.g. an active matrix type liquid crystal display, an active matrix type EL display, and an active matrix type EC display). That is, the present invention can be carried out for all the electric apparatus including such the electro-optical devices as display media.

As such electronic apparatus, a video camera, a digital camera, a projector (rear type or front type), a head mount display (a goggle type display), a car navigation system, a personal computer, a portable information terminal (mobile computer, portable telephone, electric book, etc.) and the like are enumerated. Examples of those are shown in FIGS. 33A to 33F, and 34A to 34D.

Figure 33A:
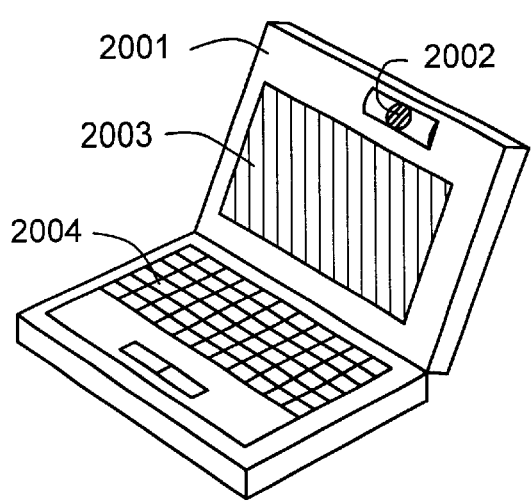
FIGS. 33A to 33F are schematic perspective views of the electronic apparatus comprising the semiconductor device in Example 11.

FIG. 33A shows a personal computer which is constituted by a main body 2001, an image input portion 2002, a display device 2003, and a keyboard 2004. The present invention can be applied to the image input portion 2002, the display device 2003, and other signal control circuits.

Figure 33B:
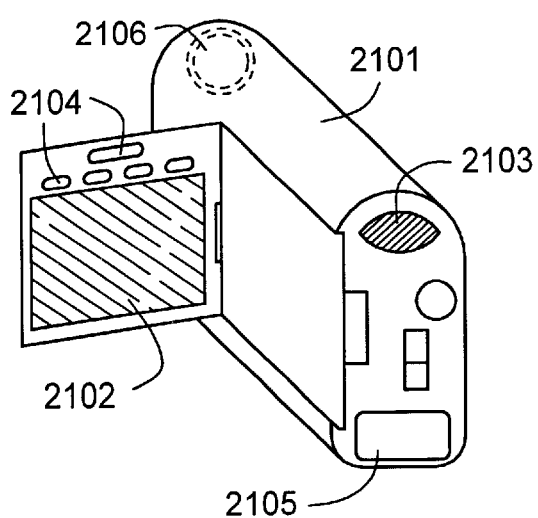

FIG. 33B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, and other signal control circuits.

Figure 33C:
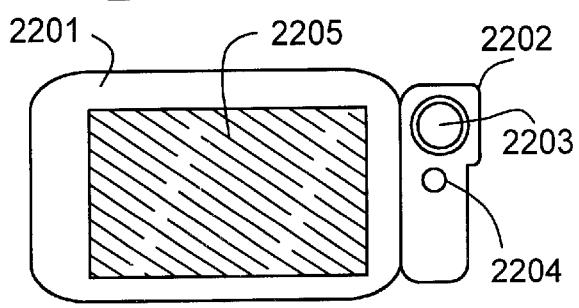

FIG. 33C shows a mobile computer which is constituted by a main body 2201, a camera portion 2202, an image receiving portion 2203, an operation switch 2204, and a display device 2205. The present invention can be applied to the display device 2205 and other signal control circuits.

Figure 33D:
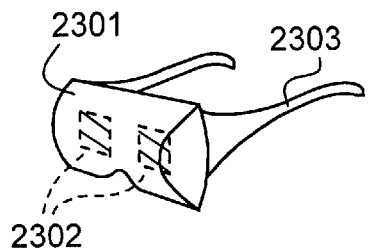

FIG. 33D shows a goggle type display which is constituted by a main body 2301, a display device 2302, and an arm portion 2303. The present invention can be applied to the display device 2302 and other signal control circuits.

Figure 33E:
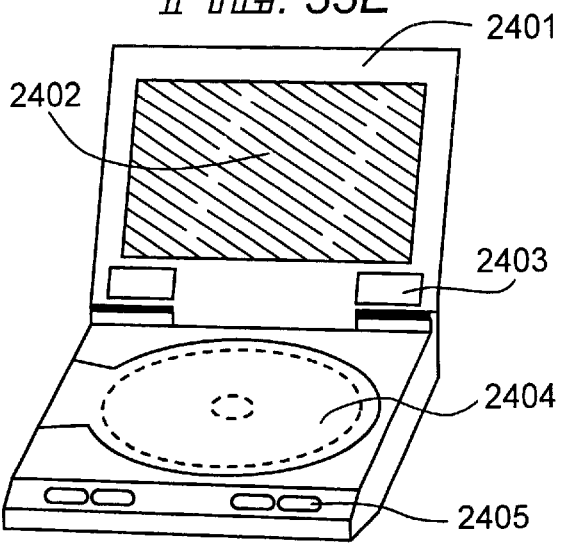

FIG. 33E shows a player apparatus which is equipped with a recording medium for recording a program (hereinafter, called "a recording medium"). The player apparatus is constituted by a main body 2401, a display device 2402, a speaker portion 2403, a recording medium 2404, an operation switch 2405 and an eternal input portion 2406. This apparatus includes a DVD (digital Versatile Disc), a CD and the like as the recording medium for appreciating music and movie, playing a game, and Internet. The present invention can be applied to the display device 2402 and other signal control circuits.

Figure 33F:
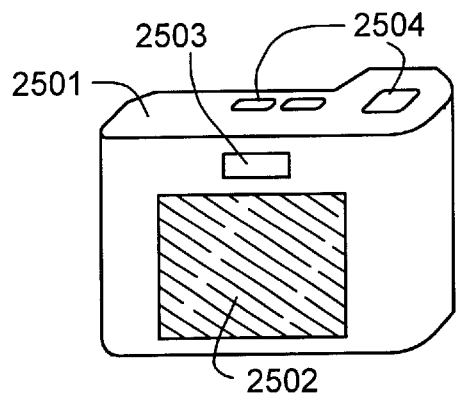

FIG. 33F shows a digital camera which is constituted by a main boy 2501, a display device 2502, an eyepiece portion 2503, an operation switch 2504 and an image receiving portion (not shown). The present invention can be applied to the display device 2502 and other signal control circuits.

Figure 34A:
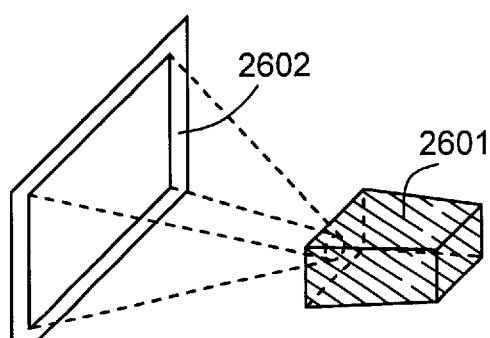
FIGS. 34A to 34D are schematic perspective views of the projector in Example 11.

FIG. 34A shows a front type projector which is constituted by a light source optical system and a display device 2601, and a screen 2602. The present invention can be applied to the display device and other signal control circuits.

Figure 34B:
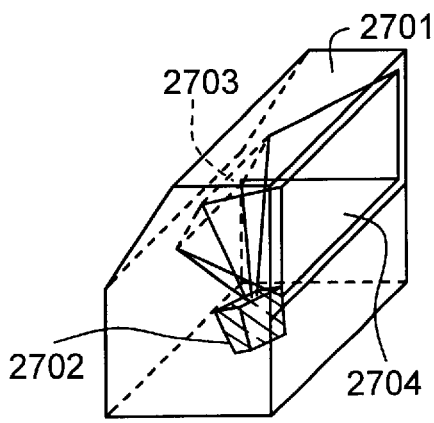

FIG. 34B shows a rear type projector which is constituted by a main body 2701, a light source optical system and a display device 2702, a mirror 2703 and a screen 2704. The present invention can be applied to the display device and other signal control circuits.

Figure 34C:
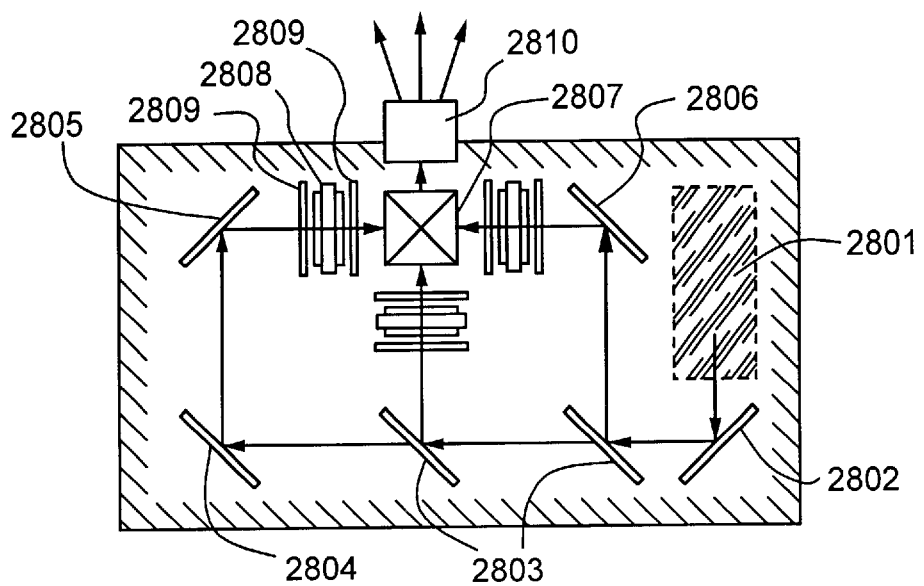

FIG. 34C shows an example structure of a light source optical system and a display device 2601 in FIG. 34A, or 2702 in FIG. 34B. Each of numerals 2601 and 2702 includes a light source optical system 2801, mirrors 2802, 2804, 2805, 2806, a dichroic mirror 2803, another optical system 2807, a display device 2808, a phase difference plate 2809, and a projection optical system 2810. The projection optical system 2810 is constituted by a plurality of optical lenses equipped with a projection lens. Such a projection system as shown in FIG. 34C is called a three-plate type since this structure includes three plates of display devices. Further, it is proper for a researcher to form, in an optical path indicated by an arrow in FIG. 34C, an optical lens, a film with a polarizing characteristics, a film to control a phase difference, an IR film, etc.

Figure 34D:
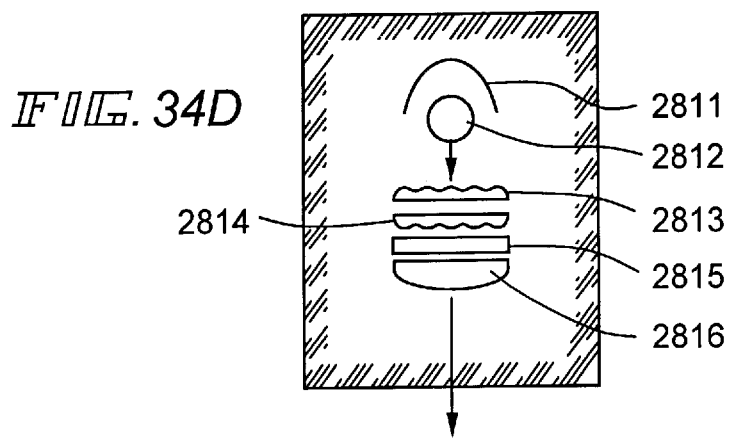
Figure 35A:
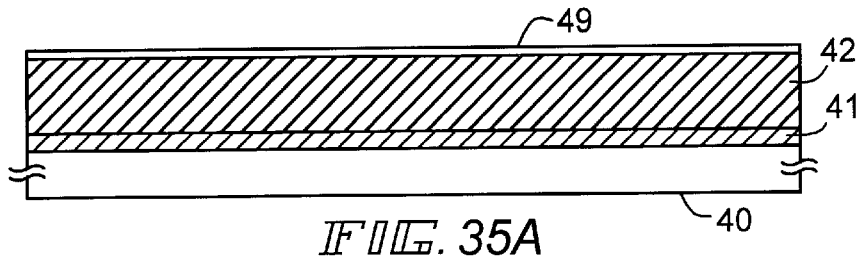
FIGS. 35A to 35E are cross sectional view of the aluminum pattern showing the experimental procedures of the anodic oxidation process.
Figure 35B:
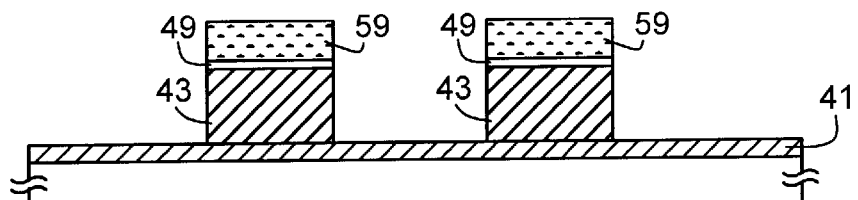
Figure 35C:
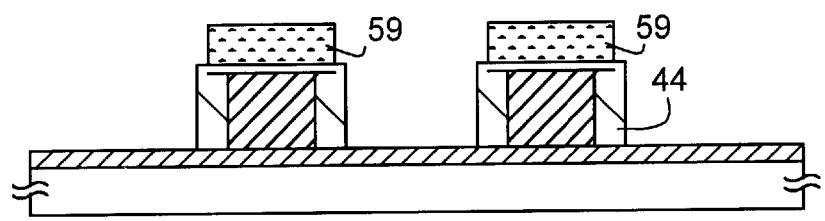
Figure 35D:
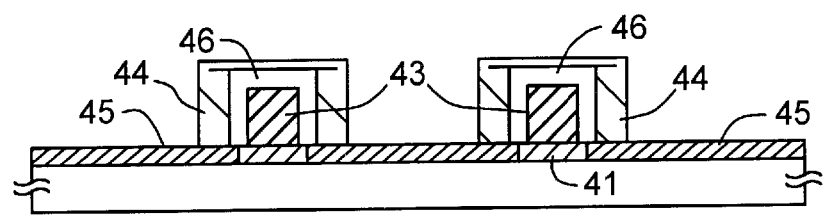
Figure 35E:
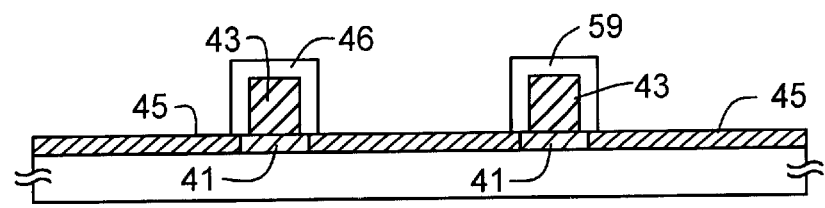
Figure 36A:
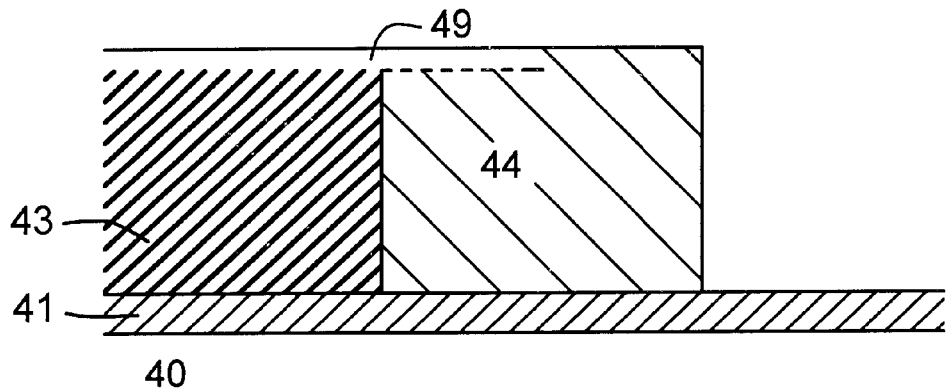
FIGS. 36A to 36C are partial enlarged view of the cross sectional structures in FIGS. 35C to 35E.
Figure 36B:
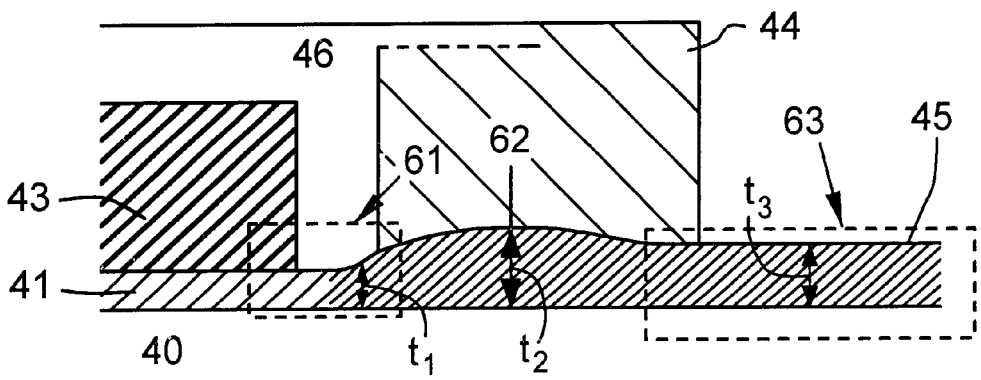
Figure 36C:
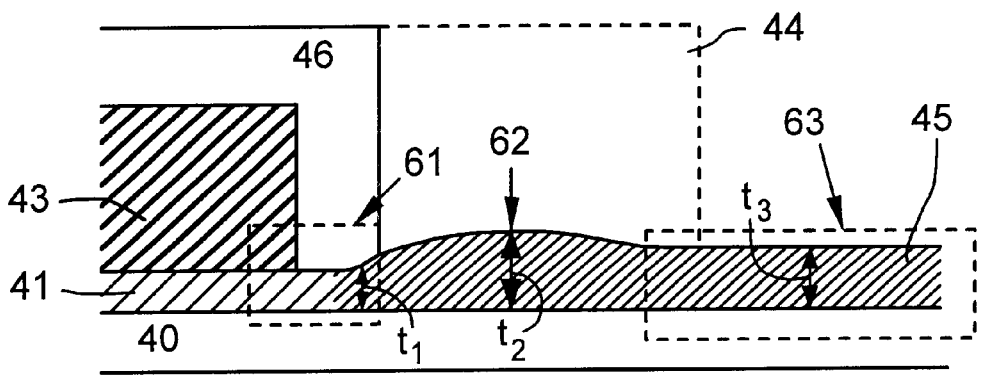

FIG. 34D shown an example structure of a light source optical system 2801 in FIG. 34C. In this embodiment, the light source optical system 2801 includes a reflector 2811, a light source 2812, lens arrays 2813 and 2814, a polarizing conversion element 2815 and a condenser lens 2816. However, the present invention is not specifically limited by this embodiment because it is just an example. For example, in an optical path, an optical lens, a film with a polarizing characteristics, a film to control a phase difference, an IR film, etc. can be properly formed.

As described in the foregoing, the application field of the invention is extremely wide, and the invention can be applied any electronic apparatus of any field. Furthermore, the invention can be also applied to an electronic display board and an advertisement display.

In the invention, by using the laminated structure of the wiring layer comprising wiring mainly comprising aluminum and another wiring layer comprising the material having a higher melting point than aluminum, the wiring can be connected to another wiring in the upper layer with good ohmic contact. Furthermore, by using the wiring of the invention as gate wiring of the top gate type transistor, a short circuit between the gate electrode and the channel can be prevented, and the reliability of the transistor can be improved.

In the invention, because anodic oxidation of the wiring can be conducted without forming voltage supplying wiring for anodic oxidation, the circuit design can be conducted without considering the space for providing the voltage supplying wiring and the etching margin for separating the voltage supplying wiring. Therefore, high integration of the circuit and miniaturization of the area of the substrate are accelerated.

What is claimed is:

1. A semiconductor device comprising:
    a wiring having a laminated structure comprising a first wiring layer comprising a first metal film and a second wiring layer comprising a second metal film formed on said first wiring layer,
    wherein said wiring comprises a first oxide film of said first metal film formed in contact with a side surface of said first wiring layer, and a second oxide film of said second metal film formed in contact with a side surface of said second wiring layer.

2. A semiconductor device comprising:
    a wiring having a laminated structure comprising a first wiring layer comprising a first metal film and a second wiring layer comprising a second metal film formed on said first wiring layer,
    wherein said wiring comprises a first oxide film formed by oxidizing said first wiring layer and a second oxide film formed by oxidizing said second wiring layer, and
    wherein a lower part of said second wiring layer is in contact with only said first wiring layer and a lower part of said second oxide film is in contact with said first wiring layer and said first oxide film.

3. A semiconductor device comprising:
    a wiring having a laminated structure comprising a first wiring layer comprising a first metal film and a second wiring layer comprising a second metal film formed on said first wiring layer,
    wherein said wiring comprises a first oxide film formed by oxidizing said first wiring layer and a second oxide film formed by oxidizing said second wiring layer, and
    wherein an interface between said second wiring layer and said second oxide film is present inside an interface between said first wiring layer and said first oxide film.

4. A semiconductor device as claimed in claim 2 or 3, wherein a film thickness of said first oxide film present under said second oxide film gradually increases toward the outside.

5. A semiconductor device as claimed in claims 2 or 3, wherein said first oxide film extends outside a side surface of said second oxide film.

6. A semiconductor device as claimed in claims 2 or 3, wherein
    said first oxide film extends outside a side surface of said second oxide film; and
    a thickness of said first oxide film under said second oxide film is different from that outside a side surface of said second oxide film.

7. A semiconductor device as claimed in claims 2 or 3, wherein
    said first oxide film extends outside a side surface of said second oxide film; and
    said first oxide film has a part, at which a film thickness thereof becomes maximum, outside a side surface of said second oxide film.

8. A semiconductor device as claimed in claim 2 or 3, wherein
    said first oxide film extends outside a side surface of said second oxide film;
    said first oxide film has a part, at which a film thickness thereof becomes maximum, outside a side surface of said second oxide film; and
    said first oxide film has a region, in which a film thickness thereof is substantially constant, outside said part, at which said film thickness becomes maximum.

9. A semiconductor device as claimed in claim 2 or 3, wherein
    said first oxide film extends outside a side surface of said second oxide film;
    said wiring overlaps a semiconductor layer comprising silicon of at least one of an insulated gate type transistor; and
    on one of said semiconductor layer, said first oxide film has a part, at which a film thickness thereof becomes maximum, outside a side surface of said second oxide film.

10. A semiconductor device as claimed in claim 2 or 3, wherein
    said first oxide film extends outside a side surface of said second oxide film;
    said wiring overlaps a semiconductor layer comprising silicon of at least one of an insulated gate type transistor; and
    on at least one of said semiconductor layer, said first oxide film has a part, at which a film thickness thereof becomes maximum, outside a side surface of said second oxide film, and has a region, in which said film thickness becomes substantially constant, outside said part, at which said film thickness becomes maximum.

11. A semiconductor device as claimed in claim 2 or 3, wherein
    said first oxide film extends outside a side surface of said second oxide film;
    said first oxide film has a part, at which a film thickness thereof becomes maximum, outside a side surface of said second oxide film, and
    said film thickness at said part, at which said film thickness becomes maximum, is 2 times to 4 times a thickness of said first wiring layer.

12. A semiconductor device as claimed in one of claim 2 or 3, wherein
    said first oxide film extends outside a side surface of said second oxide film;
    said first oxide film has a part, at which a film thickness thereof becomes maximum, outside a side surface of said second oxide film;
    said first oxide film has a region, in which a film thickness thereof is substantially constant, outside said part, at which said film thickness becomes maximum; and
    said film thickness in said region, in which said film thickness becomes substantially constant, is 2 times to 4 times a thickness of said first wiring layer.

13. A semiconductor device as claimed in claim 2 or 3, wherein
    said wiring is formed on an insulating film in an island form; and
    said side surface of said first oxide film substantially agree with a side surface of said insulating film in an island form.

14. A semiconductor device comprising:
    a plurality of insulating gate transistors, each having a gate wiring having a laminated structure comprising a first wiring layer comprising a first metal film and a second wiring layer comprising a second metal film formed on said first wiring layer,
    wherein said gate wiring comprises a first oxide film formed by oxidizing said first wiring layer and a second oxide film formed by oxidizing said second wiring layer, wherein said first oxide film extends outside said second oxide film, and wherein an interface between said second wiring layer and said second oxide film is present inside an interface between said first wiring layer and said second oxide film.

15. A semiconductor device as claimed in claim 14, wherein each of said insulating gate transistors has a semiconductor layer comprising silicon, said semiconductor layer comprising a low concentration impurity region formed in a region, on which only said first oxide film is present via a gate insulating film.

16. A semiconductor device as claimed in claim 14, wherein each of said insulating gate transistors has a semiconductor layer comprising silicon, and wherein said first oxide film extends outside said second oxide film in a transverse direction of a channel with respect to said semiconductor layer.

17. A semiconductor device as claimed in claim 2, 3 or 14, wherein said first oxide film is provided by subjecting said first metal film to anodic oxidation, and said second oxide film is provided by subjecting said second metal film to anodic oxidation.

18. A semiconductor device as claimed in claim 2, 3 or 14, wherein said first metal film and said second metal film are different in anodic oxidation rate from each other.

19. A semiconductor device as claimed in claim 2, 3 or 14, wherein said first metal film and said second metal film are different in anodic oxidation rate from each other, and wherein said first oxide film and said second oxide film are provided by the same anodic oxidation step.

20. A semiconductor device as claimed in one of claim 2, 3 or 14, wherein said first metal film has a film thickness of from 1 to 50 nm.

21. A semiconductor device as claimed in claim 2, 3 or 14, wherein said second metal film comprises aluminum or a material mainly comprising aluminum.

22. A semiconductor device as claimed in claim 2, 3 or 14, wherein said first metal film comprises a valve metal.

23. A semiconductor device as claimed in claim 2, 3 or 14, wherein said first metal film comprises a material mainly comprising one selected from Ta, Nb, Hf, Ti and Cr, or an alloy containing these elements.

24. A semiconductor device as claimed in claim 2, 3 or 14, wherein said first metal film comprises tantalum or a material mainly comprising tantalum.

25. A semiconductor device as claimed in claim 1, 2, 3 or 14, wherein said semiconductor device is one of an active matrix type liquid crystal display and an active matrix type EL display.

26. A semiconductor device as claimed in claim 1, 2, 3 or 14, wherein said semiconductor device is one selected from the group consisting of a personal computer, a video camera, a goggle type display, a player apparatus, a digital camera, a front type projector and a rear type projector.

27. A semiconductor device comprising a bottom gate type thin film transistor, comprising:

a gate wiring having a laminated structure comprising a first wiring layer comprising a first conductive film and a second wiring layer comprising a second conductive film formed on said first wiring layer;

a first oxide film provided by oxidizing said first wiring layer; and a second oxide film provided by oxidizing said second wiring layer, wherein a lower part of said second wiring layer is in contact with only said first wiring layer, and wherein a lower part of said second oxide film is in contact with said first wiring layer and said first oxide film.

28. A semiconductor device comprising a bottom gate type thin film transistor, comprising:

a gate wiring having a laminated structure comprising a first wiring layer comprising a first conductive film and a second wiring layer comprising a second conductive film formed on said first wiring layer;

a first oxide film provided by oxidizing said first wiring layer; and a second oxide film provided by oxidizing said second wiring layer, wherein an interface between said second wiring layer and said second oxide film is present inside an interface between said first wiring layer and said first oxide film.

29. A semiconductor device as claimed in claim 27 or 28, wherein said first oxide film extends outside a side surface of said second oxide film.

30. A semiconductor device as claimed in claim 27 or 28, wherein said first oxide film has a film thickness 2 times to 4 times a thickness of said first wiring layer.

31. A semiconductor device as claimed in claim 27 or 28, wherein said first conductive film and said second conductive film are different in anodic oxidation rate from each other.

32. A semiconductor device as claimed in claim 27 or 28, wherein said first conductive film and said second conductive film are different in anodic oxidation rate from each other, and wherein said first conductive film and said second conductive film are provided by the same anodic oxidation step.

33. A semiconductor device as claimed in claim 27 or 28, wherein said first conductive film has a film thickness of from 1 to 50 nm.

34. A semiconductor device as claimed in claim 27 or 28, wherein said second conductive film comprises aluminum or a material mainly comprising aluminum.

35. A semiconductor device as claimed in claim 27 or 28, wherein said first conductive film comprises a valve metal.

36. A semiconductor device as claimed in claim 27 or 28, wherein said first conductive film comprises a material mainly comprising one selected from Ta, Nb, Hf, Ti and Cr, or an alloy containing these elements.

37. A semiconductor device as claimed in claim 27 or 28, wherein said first conductive film comprises tantalum or a material mainly comprising tantalum.

38. A semiconductor device as claimed in claim 27 or 28, wherein said first conductive film comprises tantalum or a material mainly comprising tantalum, and wherein said first conductive film comprises at least one layer comprising tantalum containing nitrogen.

39. A semiconductor device as claimed in claim 27 or 28, wherein said semiconductor device is one of an active matrix type liquid crystal display and an active matrix type EL display.

40. A semiconductor device as claimed in claim 27 or 28, wherein said semiconductor device is one selected from the group consisting of a personal computer, a video camera, a goggle type display, a player apparatus, a digital camera, a front type projector and a rear type projector.

* * * * *

UNITED STATES PATENT AND TRADEMARK OFFICE
CERTIFICATE OF CORRECTION

Figure 37A:
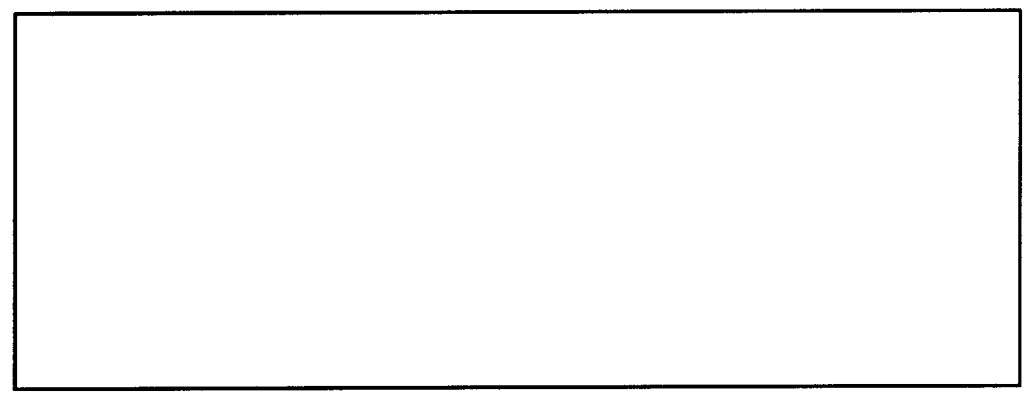
FIGS. 37A to 37C are the SEM photographs obtained by observing the cross sectional structure of FIGS. 36A to 36C.
Figure 37B:
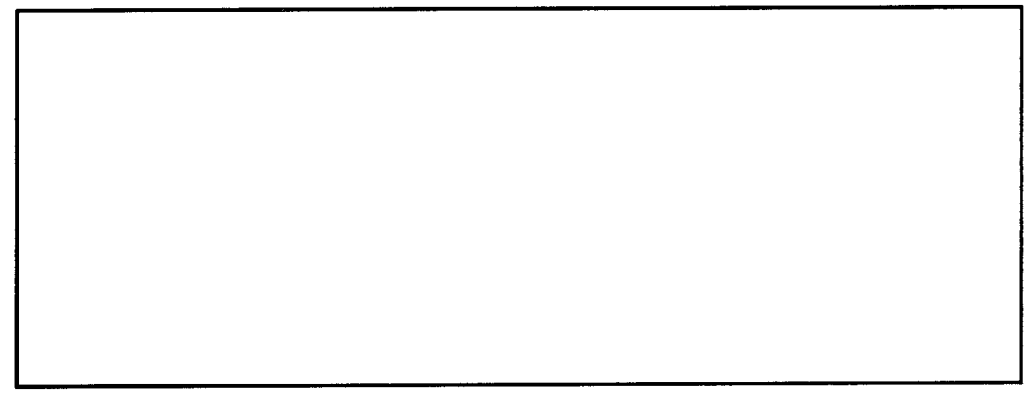
Figure 37C:
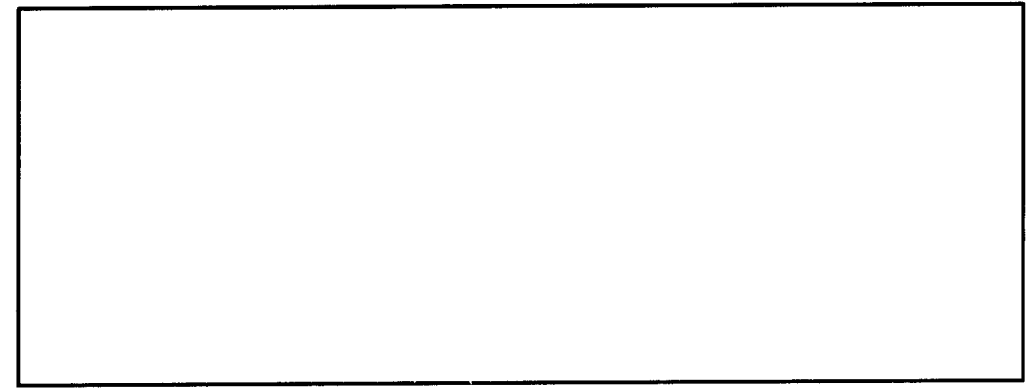
Figure 38A:
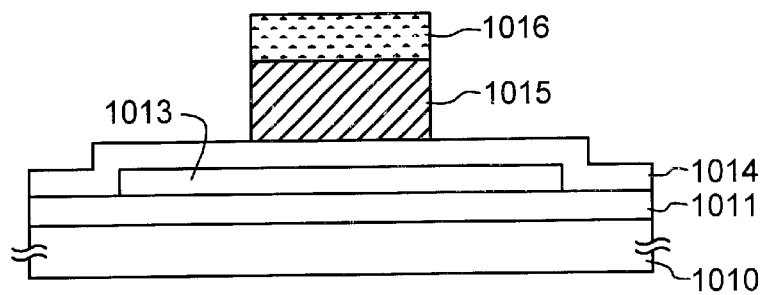
FIGS. 38A to 38E are cross sectional view showing the production process of a TFT using the anodic oxidation process of the conventional embodiment.
Figure 38B:
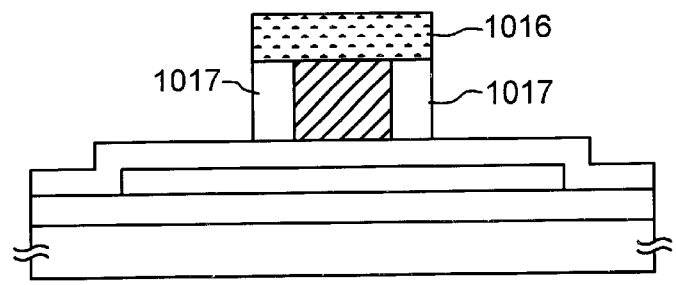
Figure 38C:
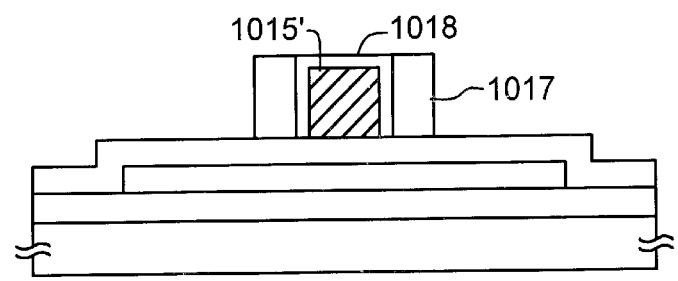
Figure 38D:
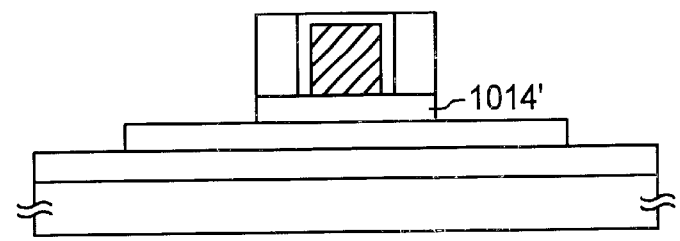
Figure 38E:
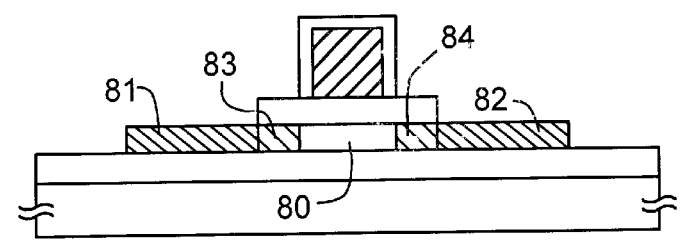
Figure 39:
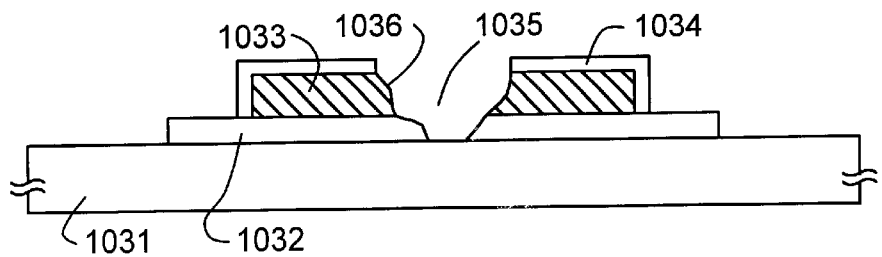
FIG. 39 is a cross sectional view of a contact hole of gate wiring covered with an alumina layer of the conventional embodiment.

PATENT NO. : 6,396,147 B1
DATED : May 28, 2002
INVENTOR(S) : Hiroki Adachi and Shunpei Yamazaki It is certified that error appears in the above-identified patent and that said Letters Patent is hereby corrected as shown below:

Drawings,
Substitute blank sheet 28 and replace with photographs of -- FIG 37A, FIG 37B and FIG 37C --.

Signed and Sealed this

Third Day of December, 2002

JAMES E. ROGAN
*Director of the United States Patent and Trademark Office*